(12) United States Patent
Watabe et al.

(10) Patent No.: US 11,903,232 B2
(45) Date of Patent: Feb. 13, 2024

(54) LIGHT-EMITTING DEVICE COMPRISING CHARGE-GENERATION LAYER BETWEEN LIGHT-EMITTING UNITS

(71) Applicant: Semiconductor Energy Laboratory Co., Ltd., Kanagawa-ken (JP)

(72) Inventors: Takeyoshi Watabe, Kanagawa (JP); Airi Ueda, Kanagawa (JP); Nobuharu Ohsawa, Kanagawa (JP); Satoshi Seo, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 157 days.

(21) Appl. No.: 17/435,452

(22) PCT Filed: Feb. 24, 2020

(86) PCT No.: PCT/IB2020/051515
§ 371 (c)(1),
(2) Date: Sep. 1, 2021

(87) PCT Pub. No.: WO2020/178660
PCT Pub. Date: Sep. 10, 2020

(65) Prior Publication Data
US 2022/0069258 A1 Mar. 3, 2022

(30) Foreign Application Priority Data
Mar. 7, 2019 (JP) .................. 2019-0414455

(51) Int. Cl.
*H10K 50/19* (2023.01)
*H10K 50/852* (2023.01)
(Continued)

(52) U.S. Cl.
CPC ........... *H10K 50/19* (2023.02); *H10K 50/852* (2023.02); *H10K 85/342* (2023.02);
(Continued)

(58) Field of Classification Search
None
See application file for complete search history.

(56) References Cited

U.S. PATENT DOCUMENTS

| 5,554,911 A | 9/1996 | Nakayama et al. |
| 6,133,692 A | 10/2000 | Xu et al. |

(Continued)

FOREIGN PATENT DOCUMENTS

| CN | 001848447 A | 10/2006 |
| JP | 2006-302506 A | 11/2006 |

(Continued)

OTHER PUBLICATIONS

International Search Report (Application No. PCT/IB2020/051515) dated Jun. 2, 2020.

(Continued)

*Primary Examiner* — Daniel Whalen
(74) *Attorney, Agent, or Firm* — Husch Blackwell LLP

(57) ABSTRACT

A light-emitting device is provided. The light-emitting device includes an intermediate layer, a first light-emitting unit, and a second light-emitting unit. The intermediate layer includes a region interposed between the first light-emitting unit and the second light-emitting unit. The intermediate layer has a function of supplying an electron to one of the first light-emitting unit and the second light-emitting unit and supplying a hole to the other. The first light-emitting unit includes a first light-emitting layer, the first light-emitting layer includes a first light-emitting material, the second light-emitting unit includes a second light-emitting layer, the second light-emitting layer includes a second light-emitting material, the second light-emitting layer has a first distance from the first light-emitting layer, and the first distance is longer than or equal to 5 nm and shorter than or equal to 65 nm.

14 Claims, 24 Drawing Sheets

(51) Int. Cl.
| | |
|---|---|
| *H10K 85/30* | (2023.01) |
| *G06V 40/13* | (2022.01) |
| *H10K 50/818* | (2023.01) |
| *H10K 50/828* | (2023.01) |
| *H10K 71/00* | (2023.01) |
| *H10K 102/00* | (2023.01) |

(52) U.S. Cl.
CPC ........ *G06V 40/1318* (2022.01); *H10K 50/818* (2023.02); *H10K 50/828* (2023.02); *H10K 71/00* (2023.02); *H10K 2102/351* (2023.02)

(56) References Cited

U.S. PATENT DOCUMENTS

| | | |
|---|---|---|
| 6,639,250 B1 | 10/2003 | Shimoda et al. |
| 6,762,553 B1 | 7/2004 | Yokogawa et al. |
| 6,831,408 B2 | 12/2004 | Hirano et al. |
| 6,847,163 B1 | 1/2005 | Tsutsui et al. |
| 7,030,553 B2 | 4/2006 | Winters et al. |
| 7,128,632 B2 | 10/2006 | Nakamura |
| 7,271,537 B2 | 9/2007 | Matsuda et al. |
| 7,462,883 B2 | 12/2008 | Kumaki et al. |
| 7,548,019 B2 | 6/2009 | Omura et al. |
| 7,737,626 B2 | 6/2010 | Kumaki et al. |
| 7,935,962 B2 | 5/2011 | Matsunami et al. |
| 7,948,172 B2 | 5/2011 | Cok et al. |
| 8,405,098 B2 | 3/2013 | Matsunami et al. |
| 8,698,395 B2 | 4/2014 | Im et al. |
| 8,766,291 B2 | 7/2014 | Forrest et al. |
| 9,905,617 B2 | 2/2018 | Seo et al. |
| 9,911,937 B2 | 3/2018 | Seo et al. |
| 10,164,203 B2 | 12/2018 | Seo et al. |
| 10,199,436 B2 | 2/2019 | Seo et al. |
| 10,573,693 B2 | 2/2020 | Seo et al. |
| 11,387,280 B2 | 7/2022 | Seo et al. |
| 2003/0003614 A1 | 1/2003 | Andriessen |
| 2003/0189401 A1 | 10/2003 | Kido et al. |
| 2005/0084712 A1 | 4/2005 | Kido et al. |
| 2005/0098207 A1 | 5/2005 | Matsumoto et al. |
| 2005/0162075 A1 | 7/2005 | Madathil et al. |
| 2005/0218799 A1 | 10/2005 | Hamada |
| 2005/0225232 A1 | 10/2005 | Boroson et al. |
| 2005/0236981 A1 | 10/2005 | Cok et al. |
| 2005/0248267 A1 | 11/2005 | Gyoutoku et al. |
| 2006/0066231 A1 | 3/2006 | Nishikawa et al. |
| 2006/0163597 A1 | 7/2006 | Noda et al. |
| 2006/0232202 A1 | 10/2006 | Matsuda et al. |
| 2007/0024168 A1 | 2/2007 | Nishimura et al. |
| 2007/0029539 A1 | 2/2007 | Yashima et al. |
| 2007/0035243 A1 | 2/2007 | Lee |
| 2007/0102737 A1 | 5/2007 | Kashiwabara et al. |
| 2007/0126012 A1 | 6/2007 | Omura et al. |
| 2007/0145350 A1 | 6/2007 | Kobori |
| 2007/0176161 A1 | 8/2007 | Seo et al. |
| 2008/0038584 A1 | 2/2008 | Akai et al. |
| 2008/0241586 A1 | 10/2008 | Kumaki et al. |
| 2009/0015141 A1 | 1/2009 | Wang et al. |
| 2009/0103161 A1 | 4/2009 | Kothari et al. |
| 2009/0167156 A1 | 7/2009 | Kawamura et al. |
| 2009/0275161 A1 | 11/2009 | Kumaki et al. |
| 2009/0294763 A1 | 12/2009 | Matsunami et al. |
| 2010/0013740 A1 | 1/2010 | Tanaka et al. |
| 2010/0066242 A1 | 3/2010 | Lee et al. |
| 2010/0096627 A1 | 4/2010 | Ikeda et al. |
| 2010/0187518 A1 | 7/2010 | Yamauchi et al. |
| 2010/0200883 A1 | 8/2010 | Sato |
| 2010/0244062 A1 | 9/2010 | Ueno |
| 2010/0314648 A1 | 12/2010 | Fehrer et al. |
| 2011/0062427 A1 | 3/2011 | Jeong et al. |
| 2011/0062475 A1 | 3/2011 | Cho |
| 2011/0073885 A1 | 3/2011 | Kim et al. |
| 2011/0074272 A1 | 3/2011 | Sakamoto et al. |
| 2011/0114981 A1 | 5/2011 | Higaki et al. |
| 2011/0187259 A1 | 8/2011 | Fukuda et al. |
| 2011/0187260 A1 | 8/2011 | Fukuda et al. |
| 2011/0187261 A1 | 8/2011 | Fukuda et al. |
| 2011/0317429 A1 | 12/2011 | Aiba et al. |
| 2012/0080667 A1 | 4/2012 | Nowatari et al. |
| 2012/0126272 A1 | 5/2012 | Kurata et al. |
| 2012/0181921 A1 | 7/2012 | Ono |
| 2012/0205676 A1 | 8/2012 | Seo et al. |
| 2012/0205685 A1 | 8/2012 | Seo et al. |
| 2012/0205686 A1 | 8/2012 | Seo et al. |
| 2012/0206675 A1 | 8/2012 | Seo et al. |
| 2012/0235197 A1 | 9/2012 | Okuyama |
| 2012/0248474 A1 | 10/2012 | Ebihara |
| 2012/0273822 A1 | 11/2012 | Ohsawa et al. |
| 2013/0187131 A1 | 7/2013 | Chung et al. |
| 2014/0225100 A1 | 8/2014 | Yokoyama et al. |
| 2014/0367662 A1 | 12/2014 | Inoue et al. |
| 2015/0008409 A1 | 1/2015 | Ito et al. |
| 2015/0021627 A1 | 1/2015 | Fujita et al. |
| 2015/0194621 A1 | 7/2015 | Nishimura et al. |
| 2015/0243712 A1 | 8/2015 | Wang et al. |
| 2015/0372258 A1 | 12/2015 | Mizuno |
| 2017/0309848 A1 | 10/2017 | Bonrad et al. |
| 2017/0331065 A1* | 11/2017 | Seo ............... H10K 85/346 |
| 2017/0338289 A1 | 11/2017 | Seo et al. |
| 2018/0190727 A1 | 7/2018 | Seo et al. |
| 2018/0248146 A1 | 8/2018 | Seo et al. |
| 2018/0261655 A1 | 9/2018 | Lee et al. |
| 2018/0261773 A1 | 9/2018 | Yamamoto et al. |
| 2019/0002488 A1 | 1/2019 | Humphries et al. |
| 2019/0002629 A1 | 1/2019 | Islam et al. |
| 2019/0062357 A1 | 2/2019 | Yoo et al. |
| 2019/0229158 A1 | 7/2019 | Seo et al. |
| 2019/0348628 A1* | 11/2019 | Hack ............... H10K 50/19 |
| 2019/0372028 A1 | 12/2019 | Qiao et al. |
| 2020/0258948 A1 | 8/2020 | Seo et al. |
| 2020/0295292 A1* | 9/2020 | Kim ............... H10K 50/19 |
| 2021/0320267 A1 | 10/2021 | Seo et al. |
| 2021/0384442 A1 | 12/2021 | Watabe et al. |
| 2022/0029134 A1 | 1/2022 | Watabe et al. |

FOREIGN PATENT DOCUMENTS

| | | |
|---|---|---|
| JP | 2006-324016 A | 11/2006 |
| JP | 2007-137872 A | 6/2007 |
| JP | 2007-242927 A | 9/2007 |
| JP | 2008-270225 A | 11/2008 |
| JP | 2010-003577 A | 1/2010 |
| JP | 2013-051155 A | 3/2013 |
| JP | 2014-032851 A | 2/2014 |
| JP | 2017-208334 A | 11/2017 |
| JP | 2018-092887 A | 6/2018 |
| JP | 2022-050458 A | 3/2022 |
| JP | 2022-069587 A | 5/2022 |
| JP | 2023-116749 A | 8/2023 |
| KR | 2006-0109345 A | 10/2006 |
| KR | 2019-0009797 A | 1/2019 |
| KR | 2022-0054698 A | 5/2022 |
| WO | WO 2017/199142 A1 | 11/2017 |

OTHER PUBLICATIONS

Written Opinion (Application No. PCT/IB2020/051515) dated Jun. 2, 2020.

Kashiwabara, M. et al., "29.5L: Late-News Paper: Advanced AM-OLED Display Based on White Emitter With Microcavity Structure," SID Digest '04: SID International Symposium Digest of Technical Papers, 2004, vol. 35, pp. 1017-1019.

Matsumoto, T. et al., "27.5L: Late-News Paper: Multiphoton Organic EL Device Having Charge Generation Layer," SID Digest '03: SID International Symposium Digest of Technical Papers, 2003, vol. 34, pp. 979-981.

Lee, J. et al., "Synergetic Electrode Architecture for Efficient Graphene-Based Flexible Organic Light-Emitting Diodes," Nature Communications, Jun. 2, 2016, vol. 7, pp. 11791-1-11791-9.

Shin, H. et al., "Sky-Blue Phosphorescent OLEDs with 34.1% External Quantum Efficiency Using a Low Refractive Index Electron Transporting Layer," Advanced Materials, Jun. 22, 2016, vol. 28, No. 24, pp. 4920-4925.

(56) References Cited

OTHER PUBLICATIONS

Fuchs, C. et al., "Enhanced Light Emission from Top-Emitting Organic Light-Emitting Diodes by Optimizing Surface Plasmon Polariton Losses," Physical Review. B, Dec. 11, 2015, vol. 92, pp. 245306-1-245306-10.

Kim, Y. et al., "Structural and Photoluminescent Properties of Near-Infrared Emissive Bis(2,3-Diphenylbenzoquinoxalinato)(2-Pyrazinecarboxylato) ridium(III)," Bulletin of the Korean Chemical Society, Jan. 8, 2018, vol. 39, No. 1, pp. 133-136.

Chen, G. et al., "Cationic IrIII Emitters with Near-Infrared Emission Beyond 800 nm and Their Use in Light-Emitting Electrochemical Cells," Chemistry a European Journal, Feb. 14, 2019, vol. 25, No. 21, pp. 5489-5497.

Guo, J. et al., "Two Efficient Near-Infrared (NIR) Luminescent [Ir(CN)2(NO)]-Characteristic Complexes with 8-hydroxyquinoline (8-Hq) as the Ancillary Ligand," Inorganic Chemistry Communications, Jan. 15, 2019, vol. 101, pp. 69-73, Elsevier.

\* cited by examiner

LIGHT-EMITTING DEVICE COMPRISING CHARGE-GENERATION LAYER BETWEEN LIGHT-EMITTING UNITS

This application is a 371 of international application PCT/IB2020/051515 filed on Feb. 24, 2020 which is incorporated herein by reference.

TECHNICAL FIELD

One embodiment of the present invention relates to a light-emitting device, a light-emitting apparatus, a light-emitting module, an electronic device, or a lighting apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

Research and development has been actively conducted on light-emitting devices using organic electroluminescence (EL) phenomenon (also referred to as organic EL devices or organic EL elements). In a basic structure of an organic EL device, a layer containing a light-emitting organic compound (hereinafter also referred to as a light-emitting layer) is interposed between a pair of electrodes. By application of voltage to the organic EL device, light emitted from the light-emitting organic compound can be obtained.

An example of the light-emitting organic compound is a compound capable of converting a triplet excited state into light (also referred to as a phosphorescent compound or a phosphorescent material). As a phosphorescent material, Patent Document 1 discloses an organometallic complex that contains iridium or the like as a central metal.

Image sensors have been used in a variety of applications such as personal authentication, defect analysis, medical diagnosis, and security. The wavelength of light sources used for image sensors is different depending on applications. Light having a variety of wavelengths, for example, light having a short wavelength, such as visible light and X-rays, and light having a long wavelength, such as near-infrared light, is used for image sensors.

Light-emitting devices have been considered to be applied to light sources of image sensors such as the above in addition to display apparatuses.

REFERENCE

Patent Document

[Patent Document 1] Japanese Published Patent Application No. 2007-137872

SUMMARY OF THE INVENTION

Problems to be Solved by the Invention

An object of one embodiment of the present invention is to provide a novel light-emitting device that is highly convenient or reliable. Another object is to provide a novel light-emitting device or a novel semiconductor device.

Note that the description of these objects does not preclude the existence of other objects. Note that one embodiment of the present invention does not need to achieve all these objects. Other objects are apparent from and can be derived from the description of the specification, the drawings, the claims, and the like.

Means for Solving the Problems (1) One embodiment of the present invention includes an intermediate layer, a first light-emitting unit, and a second light-emitting unit.

The intermediate layer includes a region interposed between the first light-emitting unit and the second light-emitting unit. The intermediate layer has a function of supplying an electron to one of the first light-emitting unit and the second light-emitting unit and supplying a hole to the other.

The first light-emitting unit includes a first light-emitting layer, and the first light-emitting layer includes a first light-emitting material.

The second light-emitting unit includes a second light-emitting layer, and the second light-emitting layer includes a second light-emitting material.

The second light-emitting layer includes a first distance D1 from the first light-emitting layer. The first distance D1 is longer than or equal to 5 nm and shorter than or equal to 65 nm.

Accordingly, a plurality of light-emitting regions (specifically, a plurality of light-emitting layers) can be close to each other. Optical designing is facilitated. The degree of freedom in optical designing is increased. Optical designing for efficient light extraction is facilitated. Light can be extracted efficiently. A driving voltage increase due to using the intermediate layer can be inhibited. As a result, a novel light-emitting device that is highly convenient or reliable can be provided.

(2) Another embodiment of the present invention includes an intermediate layer, a first light-emitting unit, a second light-emitting unit, a first electrode, a second electrode, and a function of emitting light.

The intermediate layer has a function of supplying an electron to one of the first light-emitting unit and the second light-emitting unit and supplying a hole to the other.

The first light-emitting unit includes a region interposed between the first electrode and the intermediate layer, the first light-emitting unit includes a first light-emitting layer, and the first light-emitting layer includes a first light-emitting material The second light-emitting unit includes a region interposed between the intermediate layer and the second electrode, the second light-emitting unit includes a second light-emitting layer, and the second light-emitting layer includes a second light-emitting material The emitted light has a spectrum with a local maximum at a first wavelength EL1.

The first electrode has higher reflectance than the second electrode at the first wavelength EL1.

The second electrode has higher transmittance than the first electrode at the first wavelength EL1, and the second electrode transmits part of the light and reflects another part of the light at the first wavelength EL1. The second electrode has a second distance D2 from the first electrode.

The product of the second distance D2 multiplied by 1.8 is greater than or equal to 0.3 times and less than or equal to 0.6 times the wavelength EL1.

(3) Another embodiment of the present invention includes an intermediate layer, a first light-emitting unit, a second light-emitting unit, a first electrode, a second electrode, a reflective film, and a function of emitting light.

The intermediate layer has a function of supplying an electron to one of the first light-emitting unit and the second light-emitting unit and supplying a hole to the other.

The first light-emitting unit includes a region interposed between the first electrode and the intermediate layer, the first light-emitting unit includes a first light-emitting layer, and the first light-emitting layer includes a first light-emitting material.

The second light-emitting unit includes a region interposed between the intermediate layer and the second electrode, the second light-emitting unit includes a second light-emitting layer, and the second light-emitting layer includes a second light-emitting material.

The emitted light has a spectrum with a local maximum at a first wavelength.

The reflective film has higher reflectance than the second electrode at the first wavelength.

The first electrode includes a region interposed between the first light-emitting unit and the reflective film, and the first electrode has higher transmittance than the second electrode at the first wavelength.

The second electrode transmits part of the light and reflects another part of the light at the first wavelength.

The second electrode has a second distance from the reflective film. The product of the second distance multiplied by 1.8 is greater than or equal to 0.3 times and less than or equal to 0.6 times the first wavelength.

Accordingly, optical designing is facilitated. Optical designing for efficient light extraction is facilitated. Light can be extracted efficiently. The half width of the spectrum of the emitted light can be made narrow. A microcavity structure can be formed. A driving voltage increase due to using the intermediate layer can be inhibited. As a result, a novel light-emitting device that is highly convenient or reliable can be provided.

(4) Another embodiment of the present invention is the above light-emitting device in which the second light-emitting layer includes a first distance D1 from the first light-emitting layer.

The first distance D1 and the first wavelength EL1 have a relationship represented by a Formula (i).

[Formula 1]

$$(6.3 \times 10^{-3}) \times EL1 \leq D1 \leq (81.3 \times 10^{-3}) \times EL1 \quad \text{(i)}$$

Accordingly, a plurality of light-emitting regions can be close to each other. Optical designing is facilitated. The degree of freedom in optical designing is increased. Optical designing for efficient light extraction is facilitated. Light can be extracted efficiently. A driving voltage increase due to using the intermediate layer can be inhibited. As a result, a novel light-emitting device that is highly convenient or reliable can be provided.

(5) Another embodiment of the present invention is the above light-emitting device in which the first light-emitting material in a solution has a first emission spectrum with a local maximum at a second wavelength PL1.

The second light-emitting material in a solution has a second emission spectrum with a local maximum at a third wavelength PL2.

A difference between the first wavelength EL1 and the second wavelength PL1 is less than or equal to 100 nm, and a difference between the first wavelength EL1 and the third wavelength PL2 is less than or equal to 100 nm.

Thus, the emission efficiency of the light-emitting device can be increased. Light can be extracted efficiently. As a result, a novel light-emitting device that is highly convenient or reliable can be provided.

(6) Another embodiment of the present invention is the above light-emitting device in which the second light-emitting layer includes the first light-emitting material.

Thus, the emission efficiency of the light-emitting device can be increased. High luminance can be obtained. As a result, a novel light-emitting device that is highly convenient or reliable can be provided.

(7) Another embodiment of the present invention is the above light-emitting device in which the intermediate layer has a third distance D31 from the first light-emitting layer, and the intermediate layer has a fourth distance D32 from the second light-emitting layer.

Note that the third distance D31 is longer than or equal to 5 nm and the fourth distance D32 is longer than or equal to 5 nm.

Thus, for example, the light-emitting layer can be apart from the intermediate layer. For example, a reduction in emission efficiency due to the approach of the light-emitting layer to the intermediate layer can be inhibited. The emission efficiency of the light-emitting device can be increased. As a result, a novel light-emitting device that is highly convenient or reliable can be provided.

Note that in this specification, an "EL layer" refers to a layer provided between a pair of electrodes in a light-emitting device. Thus, a light-emitting layer containing an organic compound as a light-emitting material which is interposed between the electrodes is one mode of an EL layer.

In this specification, in the case where a substance A is dispersed in a matrix formed with a substance B, the substance B forming the matrix is referred to as a host material, and the substance A dispersed in the matrix is referred to as a guest material. Note that the substance A and the substance B may each be a single substance or a mixture of two or more kinds of substances.

Note that in this specification, the light-emitting apparatus refers to an image display device or a light source (including a lighting apparatus). The light-emitting apparatus includes any of the following modules in its category: a module in which a connector such as an FPC (Flexible Printed Circuit) or a TCP (Tape Carrier Package) is attached to a light-emitting apparatus; a module having a TCP provided with a printed wiring board at the end thereof; and a module having an IC (integrated circuit) directly mounted on a substrate over which a light-emitting device is formed by a COG (Chip On Glass) method.

Effect of the Invention

According to one embodiment of the present invention, a novel light-emitting device that is highly convenient or reliable can be provided. A novel light-emitting device or a novel semiconductor device can be provided.

The description of these effects does not preclude the existence of other effects. One embodiment of the present invention does not have to have all of these effects. Note that

MODE FOR CARRYING OUT THE INVENTION

Figure 1A:
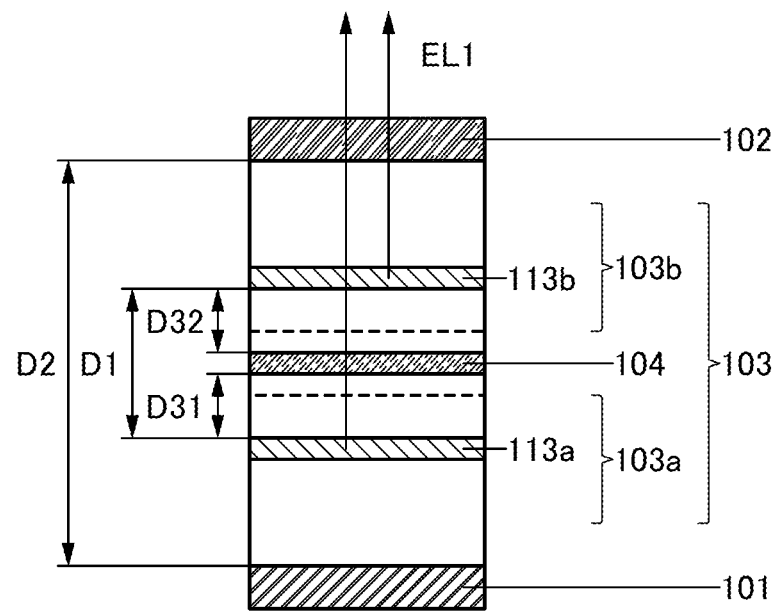
FIG. 1A and FIG. 1B are diagrams illustrating a structure of a light-emitting device according to an embodiment.

A light-emitting device of one embodiment of the present invention includes an intermediate layer, a first light-emitting unit, and a second light-emitting unit. The intermediate layer includes a region interposed between the first light-emitting unit and the second light-emitting unit. The intermediate layer has a function of supplying an electron to one of the first light-emitting unit and the second light-emitting unit and supplying a hole to the other. The first light-emitting unit includes a first light-emitting layer, the first light-emitting layer includes a first light-emitting material, the second light-emitting unit includes a second light-emitting layer, the second light-emitting layer includes a second light-emitting material, the second light-emitting layer has a first distance from the first light-emitting layer, and the first distance is longer than or equal to 5 nm and shorter than or equal to 65 nm.

Accordingly, a plurality of light-emitting regions can be close to each other. Optical designing is facilitated. The degree of freedom in optical designing is increased. Optical designing for efficient light extraction is facilitated. Light can be extracted efficiently. A driving voltage increase due to using the intermediate layer 104 can be inhibited. As a result, a novel light-emitting device that is highly convenient or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and a description thereof is not repeated.

Embodiment 1

In this embodiment, structures of a light-emitting device of one embodiment of the present invention are described with reference to FIG. 1.

Figure 1B:
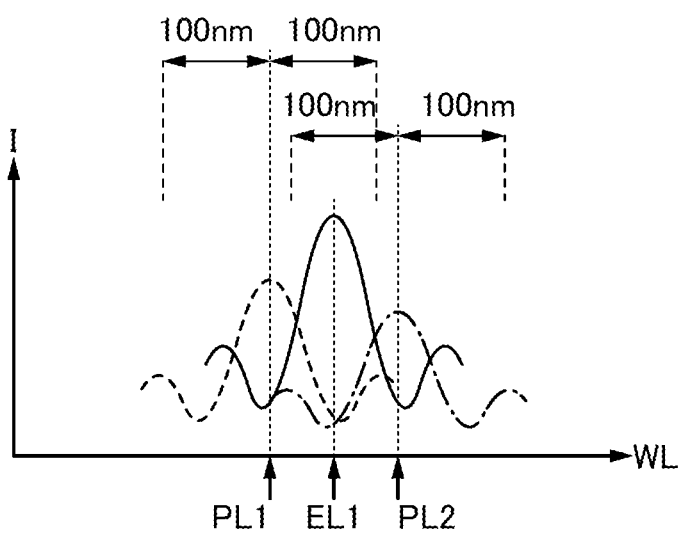

FIG. 1 illustrates a structure of the light-emitting device of one embodiment of the present invention. FIG. 1A is a cross-sectional view of the light-emitting device of one embodiment of the present invention, and FIG. 1B is a schematic diagram illustrating an emission spectrum of the light-emitting device of one embodiment of the present invention.

Note that in this specification, an integer variable of 1 or more is sometimes used in reference numerals. For example, (p) where p is an integer variable of 1 or more is sometimes used in part of a reference numeral that specifies any of p components at a maximum. As another example, (m,n) where m and n are each an integer variable of 1 or more is sometimes used in part of a reference numeral that specifies any of m×n components at a maximum.

<Structure Example 1 of Light-Emitting Device>

The light-emitting device described in this embodiment includes an intermediate layer 104, a light-emitting unit 103a, and a light-emitting unit 103b (see FIG. 1A).

<<Structure Example 1 of Intermediate Layer>>

The intermediate layer 104 includes a region between the light-emitting unit 103a and the light-emitting unit 103b. The intermediate layer 104 has a function of supplying an electron to one of the light-emitting unit 103a and the light-emitting unit 103b and supplying a hole to the other. For example, electrons are supplied to the light-emitting unit 103a placed on the anode side, and holes are supplied to the light-emitting unit 103b placed on the cathode side. Note that the intermediate layer 104 can be rephrased as a charge-generation layer, for example.

<Structure Example 1 of Light-Emitting Unit>

The light-emitting unit 103a includes a light-emitting layer 113a, and the light-emitting layer 113a includes a first light-emitting material. Note that the light-emitting unit 103a includes a region where electrons injected from one side recombine with holes injected from the other side. In some cases, a structure including a plurality of light-emitting units and an intermediate layer is referred to as a tandem light-emitting device. The first light-emitting material releases energy generated by the recombination of electrons and holes as light.

The light-emitting unit 103b includes a light-emitting layer 113b, and the light-emitting layer 113b includes a second light-emitting material.

<<Structure Example 1 of Light-Emitting Layer>>

The light-emitting layer 113b has a distance D1 from the light-emitting layer 113a. The distance D1 is longer than or equal to 5 nm and shorter than or equal to 65 nm. Note that the distance D1 is preferably longer than or equal to 5 nm and shorter than or equal to 50 nm, more preferably longer than or equal to 5 nm and shorter than or equal to 40 nm. The distance D1 is preferably longer than or equal to 10 nm.

Accordingly, a plurality of light-emitting regions (e.g., the light-emitting layer 113a and the light-emitting layer 113b) can be close to each other. Optical designing is facilitated. The degree of freedom in optical designing is increased. Optical designing for efficient light extraction is facilitated. Light can be extracted efficiently. A driving voltage increase due to using the intermediate layer 104 can be inhibited. As a result, a novel light-emitting device that is highly convenient or reliable can be provided.

<Structure Example 2 of Light-Emitting Device>

The light-emitting device described in this embodiment includes an electrode 101 and an electrode 102 and has a function of emitting light (see FIG. 1A).

<<Emission Spectrum>>

Light emitted by the light-emitting device of one embodiment of the present invention has a spectrum with a local maximum at a first wavelength ELL for example (see FIG. 1B). Note that when the spectrum has a plurality of local maximums, the wavelength of the local maximum with the highest intensity is the wavelength EL1.

<<Structure Example 1 of Electrode 101 and Electrode 102>>

The electrode 101 has higher reflectance than the electrode 102 at the wavelength EL1.

The electrode 102 has higher transmittance than the electrode 101 at the wavelength EL1, and the electrode 102 transmits part of light and reflects another part of the light at the wavelength EL1.

The electrode 102 has a distance D2 from the electrode 101. The product of the distance D2 multiplied by 1.8 is greater than or equal to 0.3 times and less than or equal to 0.6 times the wavelength EL1.

For example, when the distance D2 is 180 nm, (1.8×180) nm is 324 nm. When the wavelength EL1 is 800 nm, (0.3×800) nm is 240 nm and (0.6×800) nm is 480 nm. This means that 324 nm is within the range of 240 nm to 480 nm, inclusive.

Accordingly, optical designing is facilitated. Optical designing for efficient light extraction is facilitated. Light can be extracted efficiently. The half width of the spectrum of the emitted light can be made narrow. A microcavity structure can be formed. A driving voltage increase due to using the intermediate layer 104 can be inhibited. As a result, a novel light-emitting device that is highly convenient or reliable can be provided.

Note that a conductive film with the property of transmitting light at the wavelength EL1 and a film with the property of reflecting light at the wavelength EL1 can be used for the light-emitting device.

For example, the conductive film with the property of transmitting light at the wavelength EL1 can be used as the electrode 101, and a first film with the property of reflecting light at the wavelength EL1 can be placed in such a manner that the electrode 101 is interposed between the first film and the light-emitting layer 113a. In other words, the light-transmitting conductive film is interposed between the first film having the reflection property and the light-emitting layer 113a. The light-transmitting conductive film has a function of adjusting the distance between the electrode 102 and the first film having the reflection property, in addition to the function of the electrode 101. In such a structure, the electrode 102 has the distance D2 from the first film having the reflection property.

For example, the conductive film with the property of transmitting light at the wavelength EL1 can be used as the electrode 102, and a second film with the property of reflecting light at the wavelength EL1 can be placed in such a manner that the electrode 102 is interposed between the second film and the light-emitting layer 113b. In other words, the light-transmitting conductive film is interposed between the second film having the reflection property and the light-emitting layer 113b. The light-transmitting conductive film has a function of adjusting the distance between the electrode 101 and the second film having the reflection property, in addition to the function of the electrode 102. In such a structure, the second film having the reflection property has the distance D2 from the electrode 101.

<Structure Example 3 of Light-Emitting Device>

For the light-emitting device described in this embodiment, the distance D1 and the wavelength EL1 have the relationship shown in Formula (i) (see FIG. 1A).

[Formula 2]

$$(6.3\times10^{-3})\times EL1 \leq D1 \leq (81.3\times10^{-3})\times EL1 \quad \text{(i)}$$

For example, when the wavelength EL1 is 800 nm, $(6.3\times10^{-3})\times 800$ nm is 5.04 nm and $(81.3\times10^{-3})\times 800$ nm is 65.04 nm. Therefore, when the wavelength EL1 is 800 nm, the preferred distance D1 is longer than or equal to 5.04 nm and shorter than or equal to 65.04 nm.

Accordingly, a plurality of light-emitting regions can be close to each other. Optical designing is facilitated. The degree of freedom in optical designing is increased. Optical designing for efficient light extraction is facilitated. Light can be extracted efficiently. A driving voltage increase due to using the intermediate layer 104 can be inhibited. As a result, a novel light-emitting device that is highly convenient or reliable can be provided.

<<Light-Emitting Material>>

The first light-emitting material in a solution has a first emission spectrum with a local maximum at the wavelength PL1 (see FIG. 1B). Note that when the spectrum has a plurality of local maximums, the wavelength of the local maximum with the highest intensity is the wavelength PL1. The first light-emitting spectrum can be measured with, for example, a solution using dichloromethane as a solvent and the first light-emitting material as a solute. Note that as the solvent, a solvent of ketones such as methyl ethyl ketone and cyclohexanone, fatty acid esters such as ethyl acetate, halogenated hydrocarbons such as dichlorobenzene, aromatic hydrocarbons such as toluene, xylene, mesitylene, and cyclohexylbenzene, aliphatic hydrocarbons such as cyclohexane, decalin, and dodecane, dimethylformamide (DMF), dimethyl sulfoxide (DMSO), or the like can be used.

The second light-emitting material in a solution has a second emission spectrum with a local maximum at the wavelength PL2. Note that when the spectrum has a plurality of local maximums, the wavelength of the local maximum with the highest intensity is the wavelength PL2.

<<Emission Spectrum>>

A difference between the wavelength EL1 and the wavelength PL1 is less than or equal to 100 nm. A difference between the wavelength EL1 and the wavelength PL2 is less than or equal to 100 nm. For example, there is a 20-nm difference between the wavelength EL1 and the wavelength PL1 when the wavelength EL1 is 800 nm and the wavelength PL2 is 780 nm.

Thus, the emission efficiency of the light-emitting device can be increased. Light can be extracted efficiently. As a result, a novel light-emitting device that is highly convenient or reliable can be provided.

<<Structure Example 2 of Light-Emitting Layer>>

The light-emitting layer 113b includes the first light-emitting material. The same material as the first light-emitting material can be used as the second light-emitting material.

Thus, the emission efficiency of the light-emitting device can be increased. High luminance can be obtained. As a result, a novel light-emitting device that is highly convenient or reliable can be provided.

<<Structure Example 1 of Intermediate Layer>>

The intermediate layer 104 has a distance D31 from the light-emitting layer 113a, and the intermediate layer 104 has a distance D32 from the light-emitting layer 113b (see FIG. 1A). The distance D31 is longer than or equal to 5 nm and the distance D32 is longer than or equal to 5 nm.

Thus, for example, the light-emitting layer 113a can be apart from the intermediate layer 104. For example, a reduction in emission efficiency due to the approach of the light-emitting layer 113a to the intermediate layer 104 can be inhibited. The emission efficiency of the light-emitting device can be increased. As a result, a novel light-emitting device that is highly convenient or reliable can be provided.

<<Structure Example 2 of Intermediate Layer 104>>

The intermediate layer 104 can include a hole-transport material and an acceptor material (an electron-accepting material). The intermediate layer 104 can include an electron-transport material and a donor material.

Specifically, a material that can be used for the light-emitting unit (a hole-transport material, an acceptor material, an electron-transport material, and a donor material) can be used for the intermediate layer 104. Note that the description of structure examples of the light-emitting unit described later can be referred to for the material that can be used for the light-emitting unit.

The structure where the intermediate layer 104 is interposed between a plurality of light-emitting units can inhibit an increase in driving voltage as compared to the structure where the intermediate layer 104 is not used. Power consumption can be reduced.

<<Structure Example 2 of Electrode 101 and Electrode 102>>

Figure 2:
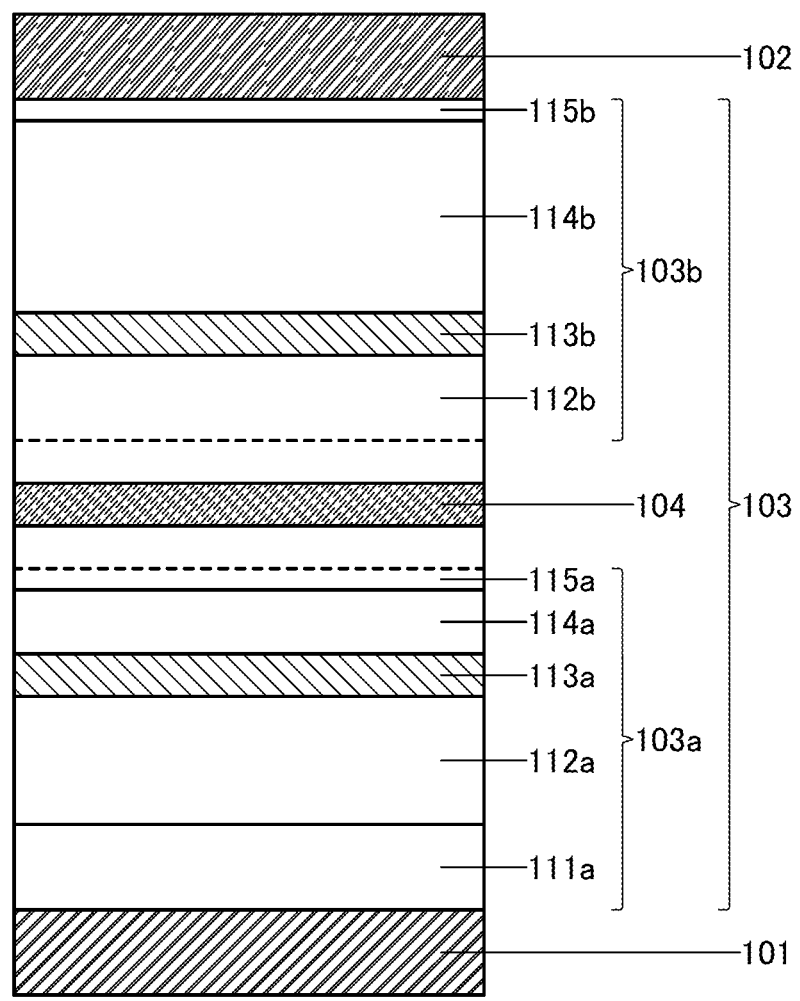
FIG. 2 is a diagram illustrating a structure of a light-emitting device according to an embodiment.

The electrode 101 and the electrode 102 preferably have a resistivity of $1\times10^{-2}$ Ωcm or lower. Note that in the light-emitting device illustrated in FIG. 2, the electrode 101 is formed over the substrate by a sputtering method. The electrode 102 is formed over the light-emitting unit by a sputtering method or a vacuum evaporation method.

At least one of the electrode 101 and the electrode 102 has the property of transmitting light emitted by the light-emitting device. At least one of them has a transmittance higher than or equal to 5% for light emitted by the light-emitting device, for example.

At least one of them has a reflectance higher than or equal to 20% and lower than or equal to 95%, preferably higher than or equal to 40% and lower than or equal to 70% for light emitted by the light-emitting device, for example.

A single layer or a stacked layer of one or more conductive materials can be used for each of the electrode 101 and the electrode 102. The materials given below can be used in appropriate combination as materials forming the electrode 101 and the electrode 102. For example, a metal, an alloy, an electrically conductive compound, a mixture of these, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

<<Structure Example 2 of Light-Emitting Unit>>

The light-emitting device described in this embodiment includes the light-emitting unit 103a and the light-emitting unit 103b.

The light-emitting unit 103a can include a hole-injection layer 111a, a hole-transport layer 112a, the light-emitting layer 113a, an electron-transport layer 114a, and an electron-injection layer 115a.

The light-emitting unit 103b can include a hole-transport layer 112b, the light-emitting layer 113b, an electron-transport layer 114b, and an electron-injection layer 115b. Note that a material that can be used for the light-emitting unit 103a can be used for the light-emitting unit 103b.

For fabrication of the light-emitting device in this embodiment, a vacuum process such as an evaporation method or a solution process such as a spin coating method or an ink-jet method can be used. In the case of using an evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer and the charge-generation layer can be formed by an evaporation method (a vacuum evaporation method or the like), a coating method (a dip coating method, a die coating method, a bar coating method, a spin coating method, a spray coating method, or the like), a printing method (an ink-jet method, a screen printing (stencil) method, an offset printing (planography) method, a flexography (relief printing) method, a gravure printing method, a micro-contact printing method, or the like), or the like.

Materials of the functional layers and the charge-generation layer are not limited to the above-described corresponding materials. For example, as the materials of the functional layers, a high molecular compound (an oligomer, a dendrimer, a polymer, or the like), a middle molecular compound (a compound between a low molecular compound and a high molecular compound with a molecular weight of 400 to 4000), or an inorganic compound (a quantum dot material or the like) may be used. As the quantum dot material, a colloidal quantum dot material, an alloyed quantum dot material, a core-shell quantum dot material, a core quantum dot material, or the like can be used.

[Hole-Injection Layer and Hole-Transport Layer]

The hole-injection layer 111a is a layer that injects holes from the anode to the light-emitting unit 103a and includes a material having a high hole-injection property, for example. Note that the electrode 101 can be used as the anode. For example, the hole-injection layer 111a and the hole-transport layer 112a are sequentially stacked over the electrode 101 by a vacuum evaporation method in the light-emitting device illustrated in FIG. 2.

As the material having a high hole-injection property, a transition metal oxide such as molybdenum oxide, vanadium oxide, ruthenium oxide, tungsten oxide, or manganese oxide or a phthalocyanine-based compound such as phthalocyanine (abbreviation: $H_2Pc$) or copper phthalocyanine (abbreviation: CuPc) can be used, for example.

As the material having a high hole-injection property, it is possible to use, for example, an aromatic amine compound such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1).

As the material having a high hole-injection property, it is possible to use, for example, poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl)methacryl amide] (abbreviation: PTPDMA), or poly[N,N-bis(4-butylphenyl)-N,N-bis(phenyl)benzidine] (abbreviation: Poly-TPD). Alternatively, it is also possible to use, for example, a high molecular compound to which acid is added, such as poly(3,4-ethylenedioxythiophene)/poly(styrenesulfonic acid) (abbreviation: PEDOT/PSS) or polyaniline/poly(styrenesulfonic acid) (PAni/PSS).

As the material having a high hole-injection property, a composite material containing a hole-transport material and an acceptor material (an electron-accepting material) can also be used. In this case, the acceptor material extracts electrons from the hole-transport material, so that holes are generated in the hole-injection layer 111a and the holes are injected into the light-emitting layer 113a through the hole-transport layer 112a. Note that the hole-injection layer 111a may be formed using a single layer of a composite material containing a hole-transport material and an acceptor material, or may be formed using a stack including a layer of a hole-transport material and a layer of an acceptor material.

The hole-transport layer 112a is a layer transporting holes, which are injected from the electrode 101 by the hole-injection layer 111a, to the light-emitting layer 113a. A hole-transport layer 112 is a layer containing a hole-transport material. It is particularly preferable that the HOMO level of the hole-transport material used in the hole-transport layer 112a be the same as or close to the HOMO level of the hole-injection layer 111a.

As the acceptor material used for the hole-injection layer 111a, an oxide of a metal belonging to any of Group 4 to Group 8 of the periodic table can be used. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. Alternatively, organic acceptors such as a quinodimethane derivative, a chloranil derivative, and a hexaazatriphenylene derivative can be used. Examples of materials having an electron-withdrawing group (halogen group or cyano group) include 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), and 1,3,4,5,7,8-hexafluorotetracyano-naphthoquinodimethane (abbreviation: $F_6$-TCNNQ). A compound in which electron-withdrawing groups are bonded to a condensed aromatic ring having a plurality of hetero atoms, such as HAT-CN, is particularly preferable because it is thermally stable. A [3]radialene derivative including an electron-withdrawing group (in particular, a cyano group or a halogen group such as a fluoro group) has a very high electron-accepting property and thus is preferred; specific examples include α,α',α"-1,2,3-cyclopropanetriylidenetris [4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The hole-transport materials used for the hole-injection layer 111a and the hole-transport layer 112a are preferably substances with a hole mobility greater than or equal to $10^{-6}$ cm$^2$/Vs. Note that other substances can also be used as long as they have a property of transporting more holes than electrons.

As the hole-transport material, materials having a high hole-transport property, such as a π-electron rich heteroaromatic compound (e.g., a carbazole derivative, a thiophene derivative, and a furan derivative) and an aromatic amine compound (a compound having an aromatic amine skeleton), are preferable.

Examples of the carbazole derivative (a compound having a carbazole skeleton) include a bicarbazole derivative (e.g., a 3,3'-bicarbazole derivative) and an aromatic amine compound having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: βNCCP).

Specific examples of the aromatic amine compound having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N'-diphenylbenzene-1,3-diamine (abbreviation: PCA2B), N,N,N'-triphenyl-N,N',N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), PCzPCA1, PCzPCA2, PCzPCN1,3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N-diphenyl-(abbreviation: YGA2F), and 4,4',4"-tris(carbazol-9-yl)triphenylamine (abbreviation: TCTA).

In addition to the above, other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the thiophene derivative (a compound having a thiophene skeleton) and the furan derivative (a compound having a furan skeleton) include compounds having a thiophene skeleton, such as 4,4',4"-(benzene-1,3,5-triyl)tri(dibenzothiophene) (abbreviation: DB T3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), 4,4',4"-(benzene-1,3,5-triyl)tri(dibenzofuran) (abbreviation: DBF3P-II), and 4-{3-[3-(9-phenyl-9H-fluoren-9-yl)phenyl]phenyl}dibenzofuran (abbreviation: mmDBFFLBi-II).

Specific examples of the aromatic amine compound include 4,4'-bis[N-(1-naphthyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]spiro-9,9'-bifluorene (abbreviation: DPA2SF), 4,4',4"-tris[N-(1-naphthyl)-N-phenylamino]triphenylamine (abbreviation: 1'-TNATA), TDATA, m-MTDATA, N,N-di(p-tolyl)-N,N-diphenyl-p-phenylenediamine (abbreviation: DTDPPA), DPAB, DNTPD, and DPA3B.

As the hole-transport material, a high molecular compound such as PVK, PVTPA, PTPDMA, or Poly-TPD can also be used.

The hole-transport material is not limited to the above examples, and one of or a combination of various known materials can be used as the hole-transport material in the hole-injection layer 111a and the hole-transport layer 112a.

[Light-Emitting Layer]

The light-emitting layer 113a is a layer including a light-emitting material. For example, in the light-emitting device illustrated in FIG. 2, the light-emitting layer 113a is formed over the hole-transport layer 112a by a vacuum evaporation method.

The light-emitting device of one embodiment of the present invention includes a light-emitting organic compound as the light-emitting material. The light-emitting organic compound emits near-infrared light. Specifically, the maximum peak wavelength of light emitted from the light-emitting organic compound is greater than 780 nm and less than or equal to 900 nm.

As the light-emitting organic compound, an organometallic complex described in Embodiment 1 can be used, for example. As the light-emitting organic compound, an organometallic complex described later in examples can be used.

The light-emitting layer 113a can contain one or more kinds of light-emitting materials.

The light-emitting layer 113a may contain one or more kinds of organic compounds (a host material, an assist material, and the like) in addition to the light-emitting material (guest material). As the one or more kinds of organic compounds, one or both of the hole-transport material and the electron-transport material described in this embodiment can be used. As the one or more kinds of organic compounds, a bipolar material may be used.

There is no particular limitation on the light-emitting material that can be used for the light-emitting layer 113a, and it is possible to use a light-emitting material that converts singlet excitation energy into light in the near-infrared light range or a light-emitting material that converts triplet excitation energy into light in the near-infrared light range.

As an example of the light-emitting material that converts singlet excitation energy into light, a substance that exhibits fluorescence (a fluorescent material) can be given; examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the light-emitting material that converts triplet excitation energy into light include a substance that exhibits phosphorescence (a phosphorescent material) and a thermally activated delayed fluorescence (TADF) material that exhibits thermally activated delayed fluorescence.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting device of one embodiment of the present invention may contain a light-emitting material other than the light-emitting material that emits near-infrared light. For example, the light-emitting device of one embodiment of the present invention may contain a light-emitting material that emits visible light (of red, blue, green, or the like) in addition to the light-emitting material that emits near-infrared light.

As the organic compounds (the host material, the assist material, and the like) used in the light-emitting layer 113a, one or more kinds of substances having a larger energy gap than the light-emitting material can be used.

In the case where the light-emitting material used in the light-emitting layer 113a is a fluorescent material, an organic compound used in combination with the light-emitting material is preferably an organic compound that has a high energy level in a singlet excited state and has a low energy level in a triplet excited state.

In terms of a preferable combination with the light-emitting material (the fluorescent material or the phosphorescent material), specific examples of the organic compounds are shown below though some of them overlap the specific examples shown above.

In the case where the light-emitting material is a fluorescent material, examples of the organic compound that can be used in combination with the light-emitting material include condensed polycyclic aromatic compounds, such as an anthracene derivative, a tetracene derivative, a phenanthrene derivative, a pyrene derivative, a chrysene derivative, and a dibenzo[g,p]chrysene derivative.

Specific examples of the organic compound (host material) used in combination with the fluorescent material include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carb azole (abbreviation: DPCzPA), PCPN, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)tri phenyl amine (abbreviation: YGAPA), N, 9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), CzPA, 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

In the case where the light-emitting material is a phosphorescent material, as the organic compound used in combination with the light-emitting material, an organic compound that has higher triplet excitation energy (energy difference between a ground state and a triplet excited state) than the light-emitting material is selected.

In the case where a plurality of organic compounds (e.g., a first host material and a second host material (or an assist material)) are used in combination with the light-emitting material in order to form an exciplex, the plurality of organic compounds are preferably mixed with a phosphorescent material (particularly an organometallic complex).

Such a structure makes it possible to efficiently obtain light emission utilizing ExTET (Exciplex-Triplet Energy Transfer), which is energy transfer from an exciplex to a light-emitting material. Note that a combination of a plurality of organic compounds that easily forms an exciplex is preferable, and it is particularly preferable to combine a compound that easily accepts holes (a hole-transport material) and a compound that easily accepts electrons (an electron-transport material). As the hole-transport material and the electron-transport material, specifically, any of the materials described in this embodiment can be used. With this structure, high efficiency, low voltage, and a long lifetime of the light-emitting device can be achieved at the same time.

In the case where the light-emitting material is a phosphorescent material, examples of the organic compounds that can be used in combination with the light-emitting material include an aromatic amine compound, a carbazole derivative, a dibenzothiophene derivative, a dibenzofuran derivative, a zinc- or aluminum-based metal complex, an oxadiazole derivative, a triazole derivative, a benzimidazole derivative, a quinoxaline derivative, a dibenzoquinoxaline derivative, a pyrimidine derivative, a triazine derivative, a pyridine derivative, a bipyridine derivative, and a phenanthroline derivative.

Among the above-described compounds, specific examples of the aromatic amine, (a compound having an aromatic amine skeleton), the carbazole derivative, the dibenzothiophene derivative (thiophene derivative), and the dibenzofuran derivative (furan derivative), which are organic compounds having a high hole-transport property, are the same as the compounds given above as specific examples of the hole-transport material.

Specific examples of the zinc- and aluminum-based metal complexes, which are organic compounds having a high electron-transport property, include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq).

Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used.

Specific examples of the oxadiazole derivative, the triazole derivative, the benzimidazole derivative, the benzimidazole derivative, the quinoxaline derivative, the dibenzoquinoxaline derivative, and the phenanthroline derivative, which are organic compounds having a high electron-transport property, include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBT-BIm-II), 4,4'-bis(5-methylbenzoxazol-2-yl)stilbene (abbreviation: BzOs), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Specific examples of a heterocyclic compound having a diazine skeleton, a heterocyclic compound having a triazine skeleton, and a heterocyclic compound having a pyridine skeleton, which are organic compounds having a high electron-transport property, include 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), and 1,3,5-tri[3-(3-pyridyl)phenyl]benzene (abbreviation: TmPyPB).

As the organic compound having a high electron-transport property, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can also be used.

The TADF material is a material that can up-convert a triplet excited state into a singlet excited state (reverse intersystem crossing) using a little thermal energy and efficiently exhibits light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: SnF$_2$(Proto IX)), a mesoporphyrin-tin fluoride complex (abbreviation: SnF$_2$(Meso IX)), a hematoporphyrin-tin fluoride complex (abbreviation: SnF$_2$(Hemato IX)), a coproporphyrin tetramethyl ester-tin fluoride complex (abbreviation: SnF$_2$(Copro III-4Me)), an octaethylporphyrin-tin fluoride complex (abbreviation: SnF$_2$(OEP)), an etioporphyrin-tin fluoride complex (abbreviation: SnF$_2$(Etio I)), and an octaethylporphyrin-platinum chloride complex (abbreviation: PtCl$_2$OEP).

Alternatively, it is possible to use a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), PCCzPTzn, 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA). Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

Note that the TADF material can also be used in combination with another organic compound. In particular, the TADF material can be used in combination with the host material, the hole-transport material, and the electron-transport material described above.

Furthermore, when used in combination with a low molecular material or a high molecular material, the above materials can be used to form the light-emitting layer 113a. For the deposition, a known method (an evaporation method, a coating method, a printing method, or the like) can be used as appropriate.

[Electron-Transport Layer]

The electron-transport layer 114a is a layer that transports electrons, which are injected from the electrode 102 by the electron-injection layer 115a, to the light-emitting layer 113a. Note that the electron-transport layer 114a is a layer containing an electron-transport material. As the electron-transport material used in the electron-transport layer 114a, a substance having an electron mobility greater than or equal to $1\times10^{-6}$ cm$^2$/Vs is preferable. Note that other substances can also be used as long as they have a property of transporting more electrons than holes. For example, in the light-emitting device illustrated in FIG. 2, the electron-transport layer 114a is formed over the light-emitting layer 113a.

As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

As specific examples of the electron-transport material, the above-described materials can be used.

[Electron-Injection Layer]

The electron-injection layer 115a is a layer containing a substance having a high electron-injection property. For example, in the light-emitting device illustrated in FIG. 2, the electron-injection layer 115a is formed over the electron-transport layer 114a by a vacuum evaporation method.

For the electron-injection layer 115a, an alkali metal, an alkaline earth metal, or a compound thereof such as lithium fluoride (LiF), cesium fluoride (CsF), calcium fluoride (CaF$_2$), or lithium oxide (LiO$_x$) can be used. A rare earth metal compound like erbium fluoride (ErF$_3$) can also be used. In addition, an electride may be used for the electron-injection layer 115a. An example of the electride is a substance in which electrons are added at high concentration to calcium oxide-aluminum oxide. Any of the above-described substances for forming the electron-transport layer 114a can also be used.

Alternatively, for the electron-injection layer 115a, a composite material containing an electron-transport material and a donor material (an electron-donating material) may be used. Such a composite material is excellent in an electron-injection property and an electron-transport property because electrons are generated in the organic compound by the electron donor. The organic compound here is preferably a material excellent in transporting the generated electrons; specifically, for example, the above-described electron-transport materials used in the electron-transport layer 114a (a metal complex, a heteroaromatic compound, or the like) can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

Note that this embodiment can be combined with any of the other embodiments in this specification as appropriate.

Embodiment 2

In this embodiment, structures of the light-emitting apparatus of one embodiment of the present invention are described with reference to FIG. 3 and FIG. 4.

Figure 3A:
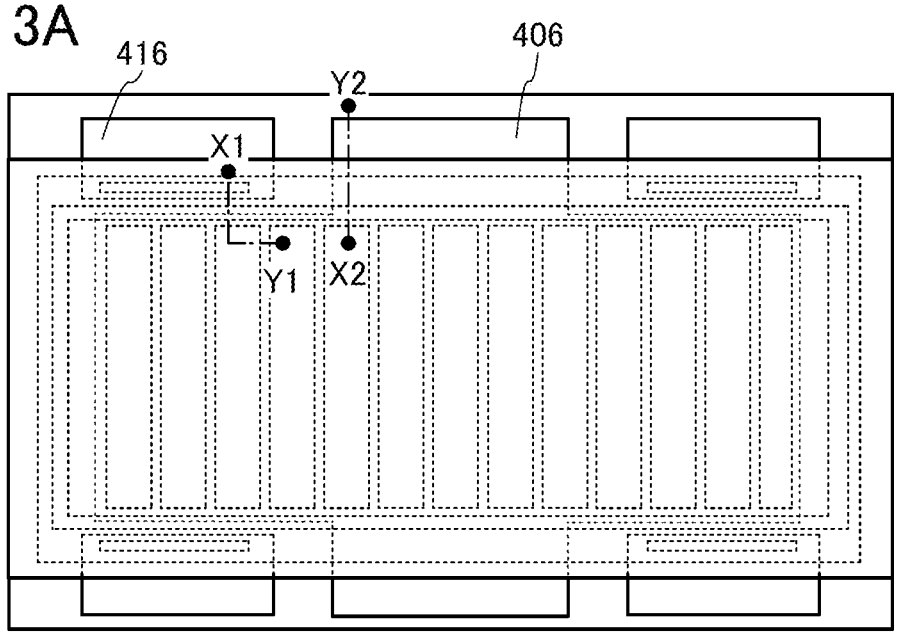
FIG. 3A to FIG. 3C are diagrams illustrating structures of a light-emitting device according to an embodiment.
Figure 3B:
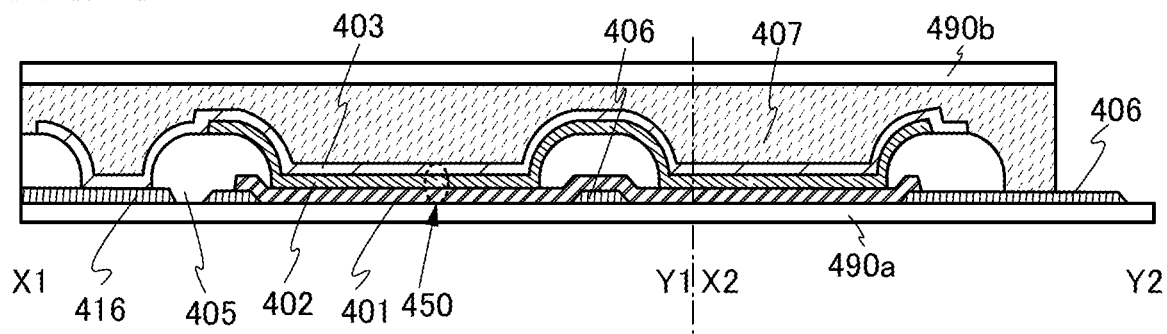

FIG. 3 illustrates structures of the light-emitting apparatus of one embodiment of the present invention. FIG. 3A is a top view of the light-emitting apparatus of one embodiment of the present invention, and FIG. 3B is a cross-sectional view of the light-emitting apparatus taken along the cutting line X1-Y1 and the cutting line X2-Y2 in FIG. 3A.

Figure 4A:
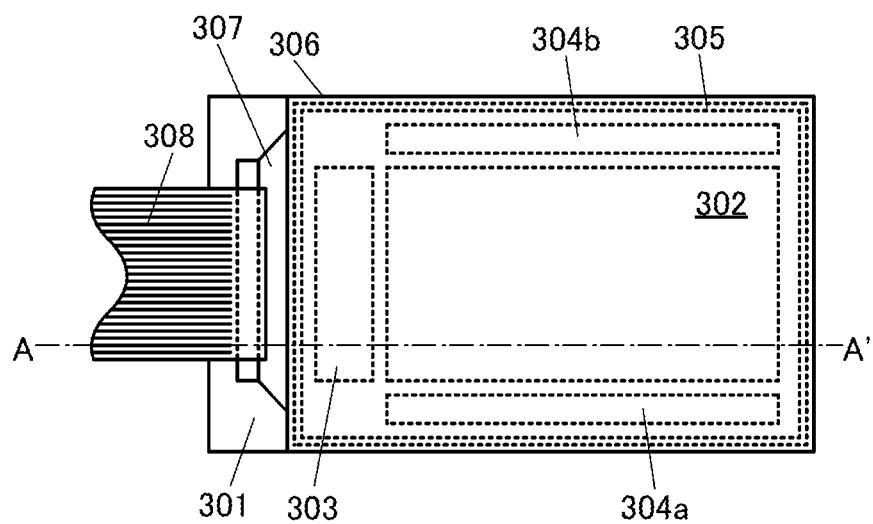
FIG. 4A and FIG. 4B are diagrams illustrating a structure of a light-emitting device according to an embodiment.
Figure 4B:
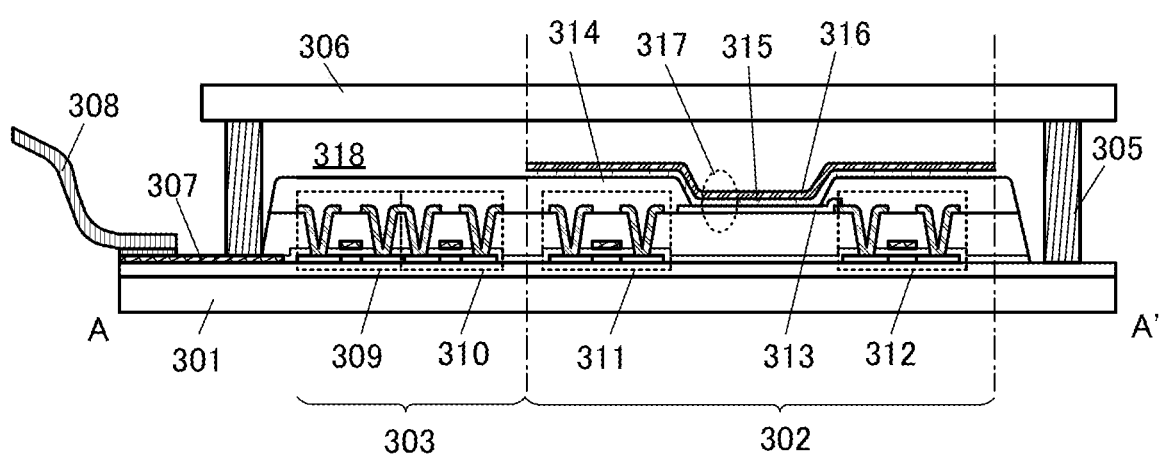

FIG. 4 illustrates structures of the light-emitting apparatus of one embodiment of the present invention. FIG. 4A is a top view of the light-emitting apparatus of one embodiment of the present invention, and FIG. 4B is a cross-sectional view of the light-emitting apparatus taken along the cutting line A-A' in FIG. 4A.

<Structure Example 1 of Light-Emitting Apparatus>

Figure 3C:
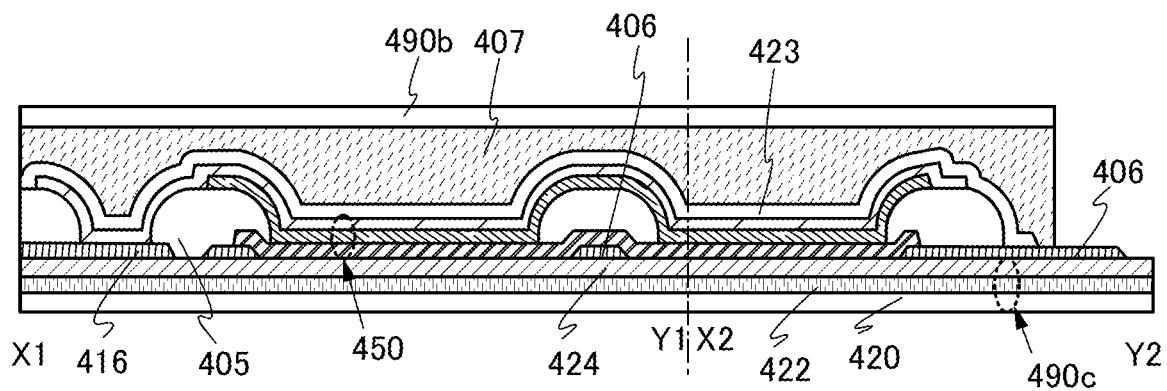

The light-emitting apparatus illustrated in FIG. 3A to FIG. 3C can be used as a lighting apparatus, for example. The light-emitting apparatus can have a bottom-emission, top-emission, or dual-emission structure.

The light-emitting apparatus illustrated in FIG. 3B includes a substrate 490a, a substrate 490b, a conductive layer 406, a conductive layer 416, an insulating layer 405, an organic EL device 450 (a first electrode 401, an EL layer 402, and a second electrode 403), and an adhesive layer 407. The organic EL device 450 can also be referred to as a light-emitting element, an organic EL element, a light-emitting device, or the like. In the EL layer 402, a light-emitting layer preferably contains any of the organometallic complexes described in Embodiment 1 as a light-emitting organic compound.

The organic EL device 450 includes the first electrode 401 over the substrate 490a, the EL layer 402 over the first electrode 401, and the second electrode 403 over the EL layer 402. The organic EL device 450 is sealed by the substrate 490a, the adhesive layer 407, and the substrate 490b.

End portions of the first electrode 401, the conductive layer 406, and the conductive layer 416 are covered with the insulating layer 405. The conductive layer 406 is electrically connected to the first electrode 401, and the conductive layer 416 is electrically connected to the second electrode 403. The conductive layer 406 covered with the insulating layer 405 with the first electrode 401 positioned therebetween functions as an auxiliary wiring and is electrically connected to the first electrode 401. It is preferable that the auxiliary wiring electrically connected to the electrode of the organic EL device 450 be provided, in which case a voltage drop due to the resistance of the electrode can be inhibited. The conductive layer 406 may be provided over the first electrode 401. An auxiliary wiring that is electrically connected to the second electrode 403 may be provided, for example, over the insulating layer 405.

For each of the substrate 490a and the substrate 490b, glass, quartz, ceramic, sapphire, an organic resin, or the like can be used. When a flexible material is used for the substrate 490*a* and the substrate 490*b*, the flexibility of the display apparatus can be increased.

A light-emitting surface of the light-emitting apparatus may be provided with a light extraction structure for increasing the light extraction efficiency, an antistatic film preventing the attachment of a foreign substance, a water repellent film suppressing the attachment of stain, a hard coat film suppressing generation of a scratch in use, an impact absorption layer, or the like.

Examples of an insulating material that can be used for the insulating layer 405 include a resin such as an acrylic resin and an epoxy resin, and an inorganic insulating material such as silicon oxide, silicon oxynitride, silicon nitride oxide, silicon nitride, and aluminum oxide.

For the adhesive layer 407, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. Alternatively, an adhesive sheet or the like may be used.

The light-emitting apparatus illustrated in FIG. 3C includes a barrier layer 490*c*, the conductive layer 406, the conductive layer 416, the insulating layer 405, the organic EL device 450, the adhesive layer 407, a barrier layer 423, and the substrate 490*b*.

The barrier layer 490*c* illustrated in FIG. 3C includes a substrate 420, an adhesive layer 422, and an insulating layer 424 having a high barrier property.

In the light-emitting apparatus illustrated in FIG. 3C, the organic EL device 450 is provided between the insulating layer 424 having a high barrier property and the barrier layer 423. Thus, even when resin films with relatively low water resistance or the like are used as the substrate 420 and the substrate 490*b*, a reduction in lifetime due to entry of impurities such as water into the organic EL device can be suppressed.

For each of the substrate 420 and the substrate 490*b*, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (nylon, aramid, or the like), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used. Glass that is thin enough to have flexibility may be used for the substrate 420 and the substrate 490*b*.

An inorganic insulating film is preferably used as the insulating layer 424 having a high barrier property. As the inorganic insulating film, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

The barrier layer 423 preferably includes at least a single-layer inorganic film. For example, the barrier layer 423 can have a single-layer structure of an inorganic film or a stacked-layer structure of an inorganic film and an organic film. As the inorganic film, the above-described inorganic insulating film is preferable. An example of the stacked-layer structure is a structure in which a silicon oxynitride film, a silicon oxide film, an organic film, a silicon oxide film, and a silicon nitride film are formed in this order. When the protective layer has a stacked-layer structure of an inorganic film and an organic film, entry of impurities that can enter the organic EL device 450 (typically, hydrogen, water, and the like) can be suitably suppressed.

The insulating layer 424 having a high barrier property and the organic EL device 450 can be directly formed on the substrate 420 having flexibility. In that case, the adhesive layer 422 is not necessary. Alternatively, the insulating layer 424 and the organic EL device 450 can be formed over a rigid substrate with a separation layer provided therebetween and then transferred to the substrate 420. For example, the insulating layer 424 and the organic EL device 450 may be transferred to the substrate 420 in the following manner: the insulating layer 424 and the organic EL device 450 are separated from the rigid substrate by applying heat, force, laser light, or the like to the separation layer, and then the insulating layer 424 and the organic EL device 450 are bonded to the substrate 420 with the use of the adhesive layer 422. For the separation layer, a stacked-layer structure of inorganic films including a tungsten film and a silicon oxide film, or an organic resin film of polyimide or the like can be used, for example. In the case where a rigid substrate is used, the insulating layer 424 can be formed at high temperature as compared to the case where a resin substrate or the like is used; thus, the insulating layer 424 can have high density and an excellent barrier property.

<Structure Example 2 of Light-Emitting Apparatus>

The light-emitting apparatus of one embodiment of the present invention can be of passive matrix type or active matrix type. An active-matrix light-emitting apparatus will be described with reference to FIG. 4.

The active-matrix light-emitting apparatus illustrated in FIG. 4A and FIG. 4B includes a pixel portion 302, a circuit portion 303, a circuit portion 304*a*, and a circuit portion 304*b*.

Each of the circuit portion 303, the circuit portion 304*a*, and the circuit portion 304*b* can function as a scan line driver circuit (a gate driver) or a signal line driver circuit (a source driver), or may be a circuit that electrically connects the pixel portion 302 to an external gate driver or source driver.

A lead wiring 307 is provided over a first substrate 301. The lead wiring 307 is electrically connected to an FPC 308 that is an external input terminal. The FPC 308 transmits signals (e.g., a video signal, a clock signal, a start signal, and a reset signal) and a potential from the outside to the circuit portion 303, the circuit portion 304*a*, and the circuit portion 304*b*. The FPC 308 may be provided with a printed wiring board (PWB). The structure illustrated in FIG. 4A and FIG. 4B can also be referred to as a light-emitting module including a light-emitting device (or a light-emitting apparatus) and an FPC.

The pixel portion 302 includes a plurality of pixels each including an organic EL device 317, a transistor 311, and a transistor 312. The transistor 312 is electrically connected to a first electrode 313 included in the organic EL device 317. The transistor 311 functions as a switching transistor. The transistor 312 functions as a current control transistor. Note that the number of transistors included in each pixel is not particularly limited and can be set appropriately as needed.

The circuit portion 303 includes a plurality of transistors, such as a transistor 309 and a transistor 310. The circuit portion 303 may be configured with a circuit including transistors having the same conductivity type (either n-channel transistors or p-channel transistors), or may be configured with a CMOS circuit including an n-channel transistor and a p-channel transistor. Furthermore, a driver circuit may be provided outside.

There is no particular limitation on the structure of the transistor included in the light-emitting apparatus of this embodiment. For example, a planar transistor, a staggered transistor, or an inverted staggered transistor can be used. A top-gate or a bottom-gate transistor structure may be used. Alternatively, gates may be provided above and below a semiconductor layer where a channel is formed.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration of the transistor characteristics can be suppressed.

It is preferable that the semiconductor layer of the transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon and single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

The transistors included in the circuit portion 303, the circuit portion 304a, and the circuit portion 304b and the transistors included in the pixel portion 302 may have the same structure or different structures. A plurality of transistors included in the circuit portion 303, the circuit portion 304a, and the circuit portion 304b may have the same structure or two or more kinds of structures. Similarly, a plurality of transistors included in the pixel portion 302 may have the same structure or two or more kinds of structures.

An end portion of the first electrode 313 is covered with an insulating layer 314. For the insulating layer 314, an organic compound such as a negative photosensitive resin or a positive photosensitive resin (acrylic resin), or an inorganic compound such as silicon oxide, silicon oxynitride, or silicon nitride can be used. An upper end portion or a lower end portion of the insulating layer 314 preferably has a curved surface with curvature. In that case, favorable coverage with a film formed over the insulating layer 314 can be obtained.

An EL layer 315 is provided over the first electrode 313, and a second electrode 316 is provided over the EL layer 315. The EL layer 315 includes a light-emitting layer, a hole-injection layer, a hole-transport layer, an electron-transport layer, an electron-injection layer, a charge-generation layer, and the like.

The plurality of transistors and the plurality of organic EL devices 317 are sealed by the first substrate 301, a second substrate 306, and a sealant 305. A space 318 surrounded by the first substrate 301, the second substrate 306, and the sealant 305 may be filled with an inert gas (e.g., nitrogen or argon) or an organic substance (including the sealant 305).

An epoxy resin or glass frit can be used for the sealant 305. A material that transmits moisture and oxygen as little as possible is preferably used for the sealant 305. In the case where glass frit is used for the sealant, the first substrate 301 and the second substrate 306 are preferably glass substrates in terms of adhesion.

This embodiment can be combined with the other embodiments as appropriate.

Embodiment 3

In this embodiment, electronic devices in which the light-emitting device of one embodiment of the present invention can be used will be described with reference to FIG. 5.

Figure 5A:
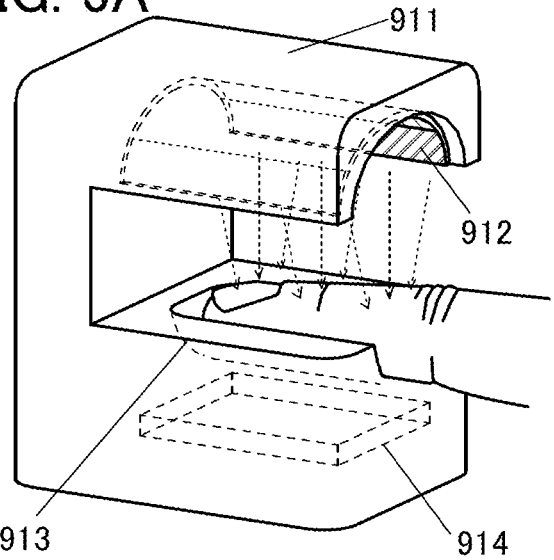
FIG. 5A to FIG. 5E are diagrams each illustrating a structure of an electronic device according to an embodiment.

FIG. 5A illustrates a biometric authentication apparatus for sensing a finger vein which includes a housing 911, a light source 912, a sensing stage 913, and the like. By putting a finger on the sensing stage 913, an image of a vein pattern can be captured. The light source 912 that emits near-infrared light is provided above the sensing stage 913, and an imaging device 914 is provided under the sensing stage 913. The sensing stage 913 is formed of a material that transmits near-infrared light, and near-infrared light that is emitted from the light source 912 and passes through the finger can be captured by the imaging device 914. Note that an optical system may be provided between the sensing stage 913 and the imaging device 914. The structure of the apparatus described above can also be applied to a biometric authentication apparatus for sensing a palm vein.

The light-emitting device of one embodiment of the present invention can be used for the light source 912. The light-emitting device of one embodiment of the present invention can be provided to be curved and can emit light uniformly toward a target. In particular, the light-emitting device preferably emits near-infrared light with the maximum peak intensity at a wavelength from 760 nm to 900 nm, inclusive. An image is formed from received light that has passed through the finger, palm, or the like, whereby the position of the vein can be detected. This action can be utilized for biometric authentication. A combination with a global shutter system enables highly accurate sensing even for a moving target.

Figure 5B:
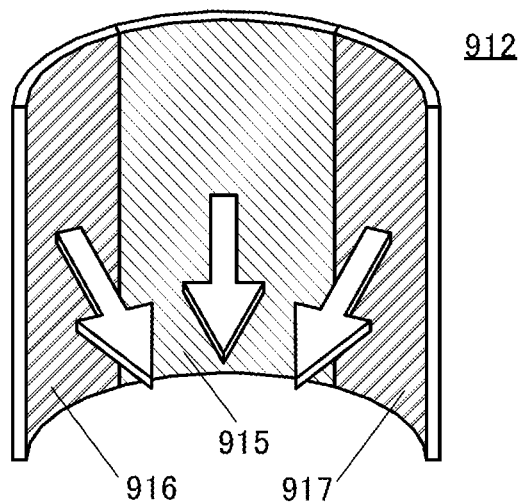

The light source 912 can include a plurality of light-emitting portions, such as light-emitting portions 915, 916, and 917 illustrated in FIG. 5B. The light-emitting portions 915, 916, and 917 may emit light having different wavelengths, or can emit light at different timings. Thus, by changing wavelengths and angles of light to be delivered, different images can be taken successively; hence, high level of security can be achieved using a plurality of images for the authentication.

Figure 5C:
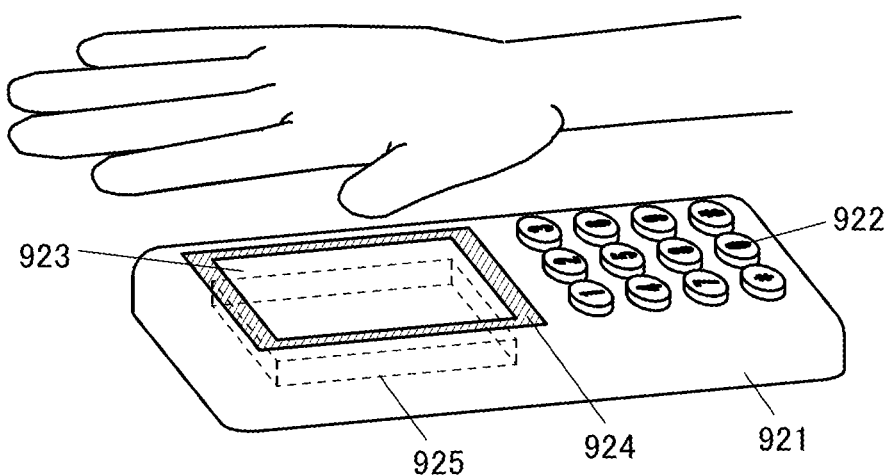

FIG. 5C illustrates a biometric authentication apparatus for sensing a palm vein which includes a housing 921, operation buttons 922, a sensing portion 923, a light source 924 that emits near-infrared light, and the like. By holding a hand over the sensing portion 923, a palm vein pattern can be recognized. Furthermore, a security code or the like can be input with the operation buttons. The light source 924 is provided around the sensing portion 923 and irradiates a target (a hand) with light. Then, light reflected by the target enters the sensing portion 923. The light-emitting device of one embodiment of the present invention can be used for the light source 924. An imaging device 925 is provided directly under the sensing portion 923 and can capture an image of the target (an image of the whole hand). Note that an optical system may be provided between the sensing portion 923 and the imaging device 925. The structure of the apparatus described above can also be applied to a biometric authentication apparatus for sensing a finger vein.

Figure 5D:
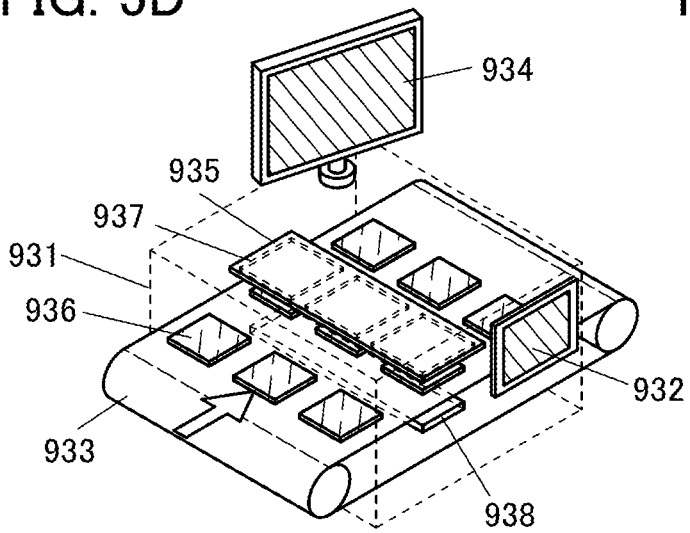

FIG. 5D illustrates a non-destructive testing apparatus that includes a housing 931, an operation panel 932, a transport mechanism 933, a monitor 934, a sensing unit 935, a light source 938 that emits near-infrared light, and the like. The light-emitting device of one embodiment of the present invention can be used for the light source 938. Test specimens 936 are transported by the transport mechanism 933 to be located directly beneath the sensing unit 935. The test specimen 936 is irradiated with near-infrared light from the light source 938, and the light passing therethrough is captured by an imaging device 937 provided in the sensing unit 935. The captured image is displayed on the monitor 934. After that, the test specimens 936 are transported to the exit of the housing 931, and defective pieces are sorted and collected. Imaging with the use of near-infrared light enables non-destructive and high-speed sensing of defective elements inside the test specimen, such as defects and foreign substances.

Figure 5E:
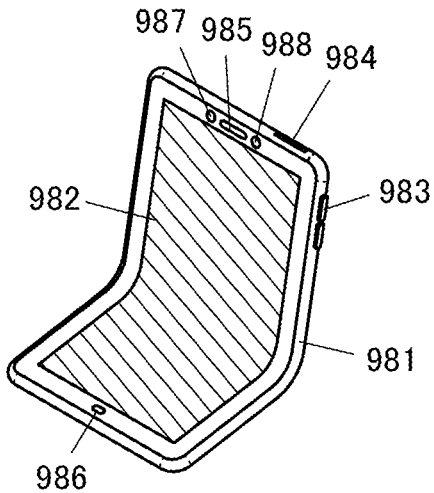

FIG. 5E illustrates a mobile phone that includes a housing 981, a display portion 982, an operation button 983, an external connection port 984, a speaker 985, a microphone 986, a first camera 987, a second camera 988, and the like. The display portion 982 of the mobile phone includes a touch sensor. The housing 981 and the display portion 982 have flexibility. All operations including making a call and inputting text can be performed by touch on the display portion 982 with a finger, a stylus, or the like. The first camera 987 can take a visible light image, and the second camera 988 can take an infrared light image (a near-infrared light image). The mobile phone or the display portion 982 illustrated in FIG. 5E may include the light-emitting device of one embodiment of the present invention.

This embodiment can be combined with the other embodiments as appropriate.

Example 1

In this example, a structure, a fabrication method, and characteristics of a light-emitting device 1 of one embodiment of the present invention are described with reference to FIG. 6 and FIG. 8 to FIG. 13.

Figure 6:
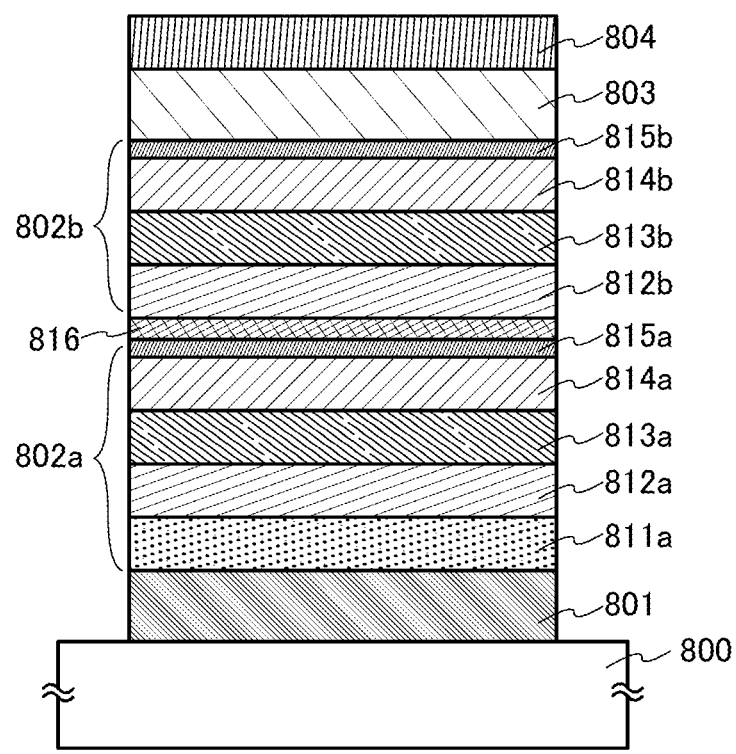
FIG. 6 is a diagram illustrating a structure of a light-emitting device according to examples.

The light-emitting device 1 fabricated in this example includes an intermediate layer 816, a light-emitting unit 802a, a light-emitting unit 802b, an electrode 801, and an electrode 803 and has a function of emitting light (see FIG. 6).

The intermediate layer 816 includes a region interposed between the light-emitting unit 802a and the light-emitting unit 802b, and the intermediate layer 816 has a function of supplying an electron to one of the light-emitting unit 802a and the light-emitting unit 802b and supplying a hole to the other.

The light-emitting unit 802a includes a region interposed between the electrode 801 and the intermediate layer 816, and the light-emitting unit 802a includes a light-emitting layer 813a. The light-emitting layer 813a includes the first light-emitting material. Note that bis{4,6-dimethyl-2-[3-(3,5-dimethylphenyl)-2-benzo[g]quinoxalinyl-κN]phenyl-κC}(2,2,6,6-tetramethyl-3,5-heptanedionato-$κ^2$O,O')iridium (III) (abbreviation: [Ir(dmdpbq)$_2$(dpm)]) (Structural Formula (100)) was used as the first light-emitting material. Note that a synthesis example of [Ir(dmdpbq)$_2$(dpm)] will be described later in a reference example.

The light-emitting unit 802b includes a region interposed between the intermediate layer 816 and the electrode 803, and the light-emitting unit 802b includes a light-emitting layer 813b. The light-emitting layer 813b also includes the first light-emitting material. The light-emitting layer 813b has the distance D1 from the light-emitting layer 813a. The distance D1 is longer than or equal to 5 nm and shorter than or equal to 65 nm. Note that in the light-emitting device 1, the distance D1 was (15+0.1+5+10) nm=30.1 nm (see Table 1).

Figure 13:
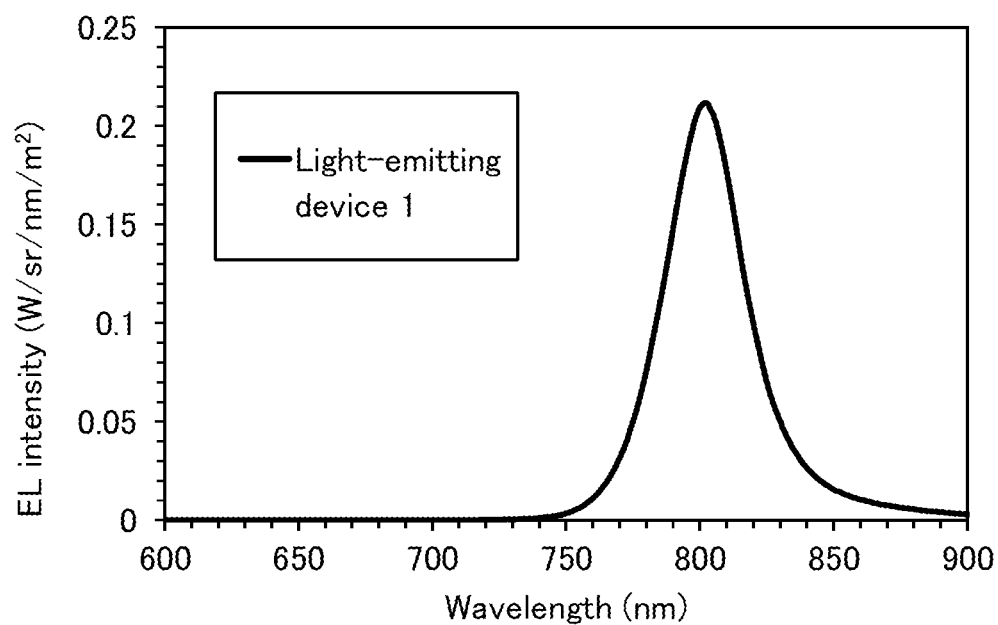
FIG. 13 is a diagram showing an emission spectrum of the light-emitting device 1.

The spectrum of light emitted by the fabricated light-emitting device 1 has a local maximum at a wavelength of 802 nm (see FIG. 13). Note that $(6.3 \times 10^{-3}) \times 802$ nm was 5.05 nm and $(81.3 \times 10^{-3}) \times 802$ nm was 65.2 nm. Therefore, the distance D1 (=30.1 nm) is within the range of 5.05 nm to 65.2 nm, inclusive.

The electrode 801 has higher reflectance than the electrode 803 at a wavelength of 802 nm. At a wavelength of 802 nm, the electrode 803 has higher transmittance than the electrode 801 and transmits part of light and reflects another part of the light.

The electrode 803 has the distance D2 from the electrode 801. The product of the distance D2 multiplied by 1.8 is greater than or equal to 0.3 times and less than or equal to 0.6 times the 802 nm wavelength. Note that the light-emitting device 1 includes the first film having the reflection property, and the light-transmitting conductive film is interposed between the first film having the reflection property and the light-emitting layer 813a. Specifically, a film of an alloy of silver (Ag), palladium (Pd), and copper (Cu) (Ag—Pd—Cu (APC)) is used and 10-nm-ITSO is interposed between the APC film and the light-emitting layer 813a. In this structure, the distance D2 was as follows: (10+20+20+15+15+0.1+5+10+15+20+45+1) nm=176.1 nm. Therefore, the value obtained by multiplying the distance D2 (=176.1 nm) by 1.8 was (1.8×176.1=) 316.98 nm. This value is within the range of (0.3×802=) 240.6 nm to (0.6×802=) 481.2 nm, inclusive.

The first light-emitting material in a solution has an emission spectrum with a local maximum at the wavelength PL1. A difference between the wavelength EL1 and the second wavelength PL1 is less than or equal to 100 nm.

Figure 28:
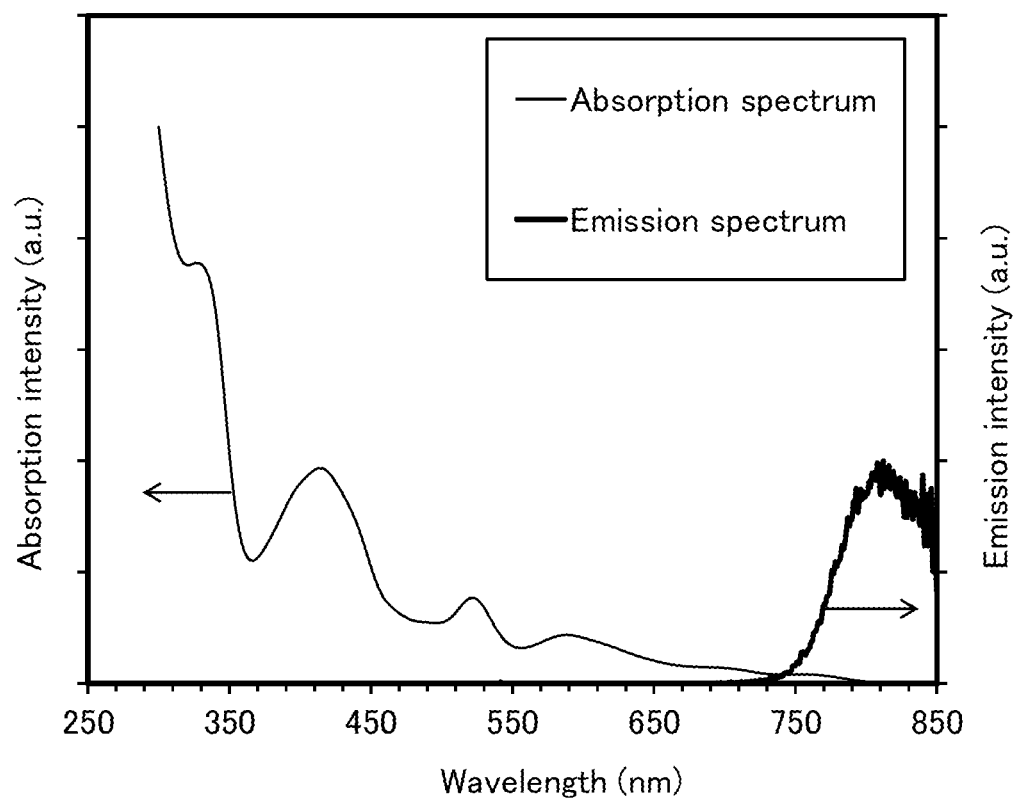
FIG. 28 shows an ultraviolet-visible absorption spectrum and an emission spectrum of an organometallic complex represented by Structural Formula (100).

[Ir(dmdpbq)$_2$(dpm)], which was used as the first light-emitting material, in a dichloromethane solution has an emission spectrum with a local maximum at a wavelength of 807 nm (see FIG. 28). This reveals that there is a difference of 5 nm between the 802-nm local maximum wavelength of the spectrum of light emitted by the light-emitting device 1 and the 807-nm local maximum wavelength of the emission spectrum, which can be observed from the solution of the first light-emitting material.

Table 1 shows a specific structure of the light-emitting device 1. The chemical formulae of the materials used in this example are shown below.

TABLE 1

|  | First electrode 801 | Hole-injection layer 811a | Hole-transport layer 812a | Light-emitting layer 813a | Electron-transport layer 814a | Electron-injection layer 815a | Intermediate layer 816 |
|---|---|---|---|---|---|---|---|
| Light-emitting device 1 | APC (100 nm) | ITSO (10 nm) | DBT3P-II:MoOx (2:1 20 nm) | PCBBiF (20 nm) | * | NBphen (15 nm) | Li$_2$O (0.1 nm) | DBT3P-II:MoOx (2:1 5 nm) |

|  | Hole-transport layer 812b | Light-emitting layer 813b | Electron-transport layer 814b | Electron-injection layer 815b | Second electrode 803 | Buffer layer 804 |
|---|---|---|---|---|---|---|
| Light-emitting device 1 | PCBBiF (10 nm) | * | 2mDBTBPDBq-II (20 nm) | NBphen (45 nm) | LiF (1 nm) | Ag:Mg (10:1 30 nm) | DBT3P-II (100 nm) |

* 2mDBTBPDBq-II:PCBBiF:[Ir(dmdpbq)$_2$(dpm)] (0.7:0.3:0.1 15 nm)

[Chemical formula 1]

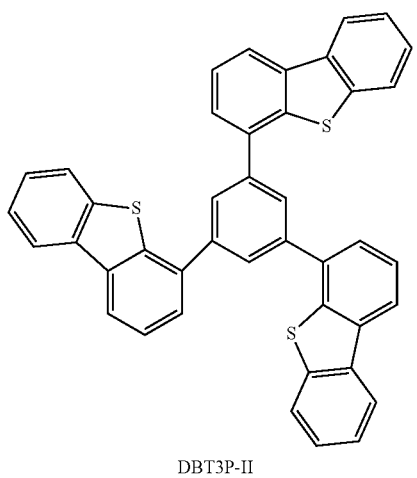

DBT3P-II

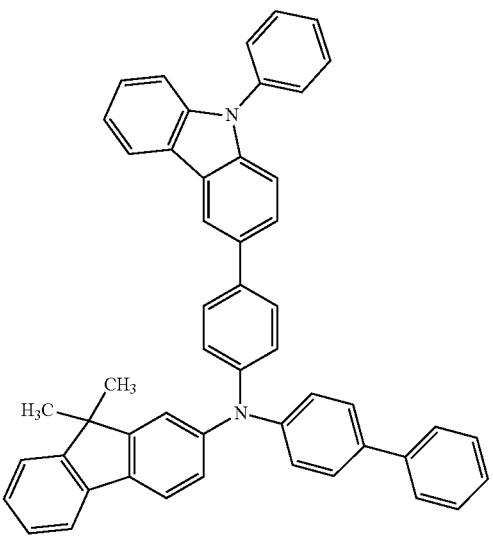

PCBBiF

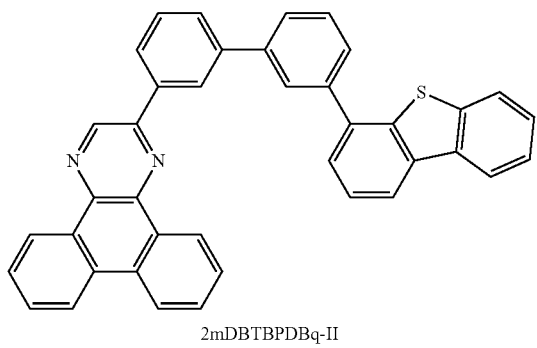

2mDBTBPDBq-II

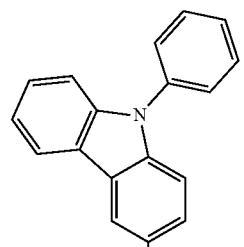

(100)
[Ir(dmdpbq)$_2$(dpm)]

-continued

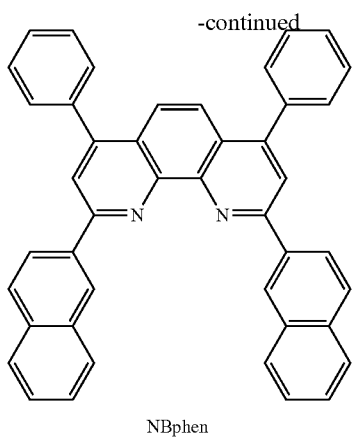

NBphen

<<Fabrication of Light-Emitting Device 1>>

The light-emitting device 1 described in this example has a structure in which the first electrode 801 is formed over the substrate 800; the light-emitting unit 802a (a hole-injection layer 811a, a hole-transport layer 812a, a light-emitting layer 813a, an electron-transport layer 814a, and an electron-injection layer 815a), the intermediate layer 816, and the light-emitting unit 802b (a hole-transport layer 812b, a light-emitting layer 813b, an electron-transport layer 814b, and an electron-injection layer 815b) are stacked in this order over the first electrode 801; and the second electrode 803 is stacked over the light-emitting unit 802b, as illustrated in FIG. 6.

First, the first electrode 801 was formed over the substrate 800. The electrode area was set to 4 mm$^2$ (2 mm×2 mm). A glass substrate was used as the substrate 800. The first electrode 801 was formed in such a manner that an alloy film of silver (Ag), palladium (Pd), and copper (Cu) (Ag—Pd—Cu (APC)) was formed to a thickness of 100 nm by a sputtering method, and an ITSO film was formed to a thickness of 10 nm by a sputtering method. In this example, the first electrode 801 functions as an anode.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to approximately 10$^{-4}$ Pa, vacuum baking at 170° C. for 30 minutes was performed in a heating chamber in the vacuum evaporation apparatus, and then the substrate was cooled down for approximately 30 minutes.

Next, the hole-injection layer 811a was formed over the first electrode 801. For the formation of the hole-injection layer 811a, the pressure in the vacuum evaporation apparatus was reduced to 10$^{-4}$ Pa, and then 1,3,5-tri(dibenzothiophen-4-yl)benzene (abbreviation: DBT3P-II) and molybdenum oxide were co-evaporated such that DBT3P-II:molybdenum oxide=2:1 (weight ratio) and the thickness was 20 nm.

Then, the hole-transport layer 812a was formed over the hole-injection layer 811a. The hole-transport layer 812a was formed to a thickness of 20 nm by evaporation of N-(1,1'-biphenyl-4-yl)-N-[4-(9-phenyl-9H-carbazol-3-yl)phenyl]-9,9-dimethyl-9H-fluoren-2-amine (abbreviation: PCBBiF).

Next, the light-emitting layer 813a was formed over the hole-transport layer 812a. Using 2-[3'-(dibenzothiophen-4-yl)biphenyl-3-yl]dibenzo[f,h]quinoxaline (abbreviation: 2mDBTBPDBq-II) as a host material, PCBBiF as an assist material, and bis{4,6-dimethyl-2-[3-(3,5-dimethylphenyl)-2-benzo[g]quinoxalinyl-κN]phenyl-κC}(2,2,6,6-tetramethyl-3,5-heptanedionato-κ$^2$O,O')iridium(III) (abbreviation: [Ir(dmdpbq)$_2$(dpm)]) (structural formula (100)) as a guest material (a phosphorescent material), co-evaporation was performed so that the weight ratio was 2mDBTBPDBq-II:PCBBiF:[Ir(dmdpbq)$_2$(dpm)]=0.7:0.3:0.1. The thickness was set to 15 nm.

Next, the electron-transport layer 814a was formed over the light-emitting layer 813a. The electron-transport layer 814a was formed by sequential deposition by evaporation such that the thickness of 2,9-bis(naphthalen-2-yl)-4,7-diphenyl-1,10-phenanthroline (abbreviation: NBphen) was 15 nm.

Then, the electron-injection layer 815a was formed over the electron-transport layer 814a. The electron-injection layer 815a was formed to a thickness of 0.1 nm by evaporation of lithium oxide (Li$_2$O).

Next, the intermediate layer 816 was formed over the electron-injection layer 815a. The intermediate layer 816 was formed by co-evaporation of DBT3P-II and molybdenum oxide such that DBT3P-II:molybdenum oxide=2:1 (weight ratio) and the thickness was 5 nm.

Then, the hole-transport layer 812b was formed over the intermediate layer 816. The hole-transport layer 812b was formed to a thickness of 10 nm by evaporation of PCBBiF.

Next, the light-emitting layer 813b was formed over the hole-transport layer 812b. Using 2mDBTBPDBq-II as a host material, PCBBiF as an assist material, and [Ir(dmdpbq)$_2$(dpm)] as a guest material (a phosphorescent material), co-evaporation was performed so that the weight ratio was 2mDBTBPDBq-II:PCBBiF:[Ir(dmdpbq)$_2$(dpm)]=0.7:0.3:0.1. The thickness was set to 15 nm.

Next, the electron-transport layer 814b was formed over the light-emitting layer 813b. The electron-transport layer 814b was formed by sequential deposition by evaporation such that the thickness of 2mDBTBPDBq-II was 20 nm and the thickness of NBphen was 45 nm.

Then, the electron-injection layer 815b was formed over the electron-transport layer 814b. The electron-injection layer 815b was formed to a thickness of 1 nm by evaporation of lithium fluoride (LiF).

After that, the second electrode 803 was formed over the electron-injection layer 815b. The second electrode 803 was formed by co-evaporation of silver (Ag) and magnesium (Mg) such that Ag:Mg=10:1 (volume ratio) and the thickness was 30 nm. In this example, the second electrode 803 functions as a cathode.

Next, a buffer layer 804 was formed over the second electrode 803. The buffer layer 804 was formed to a thickness of 100 nm by evaporation of DBT3P-II.

Through the above steps, the light-emitting device 1 was formed over the substrate 800. In all the evaporation steps in the above fabrication method, an evaporation method by a resistance-heating method was used.

The light-emitting device fabricated as described above was sealed using a different substrate (not illustrated). At the time of the sealing using the different substrate (not illustrated), the different substrate (not illustrated) on which an adhesive that is solidified by ultraviolet light was applied was fixed onto the substrate 800 in a glove box containing a nitrogen atmosphere, and the substrates were bonded to each other such that the adhesive was attached to the periphery of the light-emitting device formed over the substrate 800. At the time of the sealing, the adhesive was irradiated with 365-nm ultraviolet light at 6 J/cm$^2$ to be solidified, and the adhesive was subjected to heat treatment at 80° C. for one hour to be stabilized.

Note that a microcavity structure is applied to the light-emitting device 1. The light-emitting device 1 was fabricated so that the optical path length between the pair of reflective electrodes (the APC film and the Ag:Mg film) was approximately half-wave of the maximum peak wavelength of light emitted from the guest material.

<<Operating Characteristics of Light-Emitting Device 1>>

The operating characteristics of the light-emitting device 1 were measured. Note that the measurement was carried out at room temperature (an atmosphere maintained at 25° C.).

Figure 8:
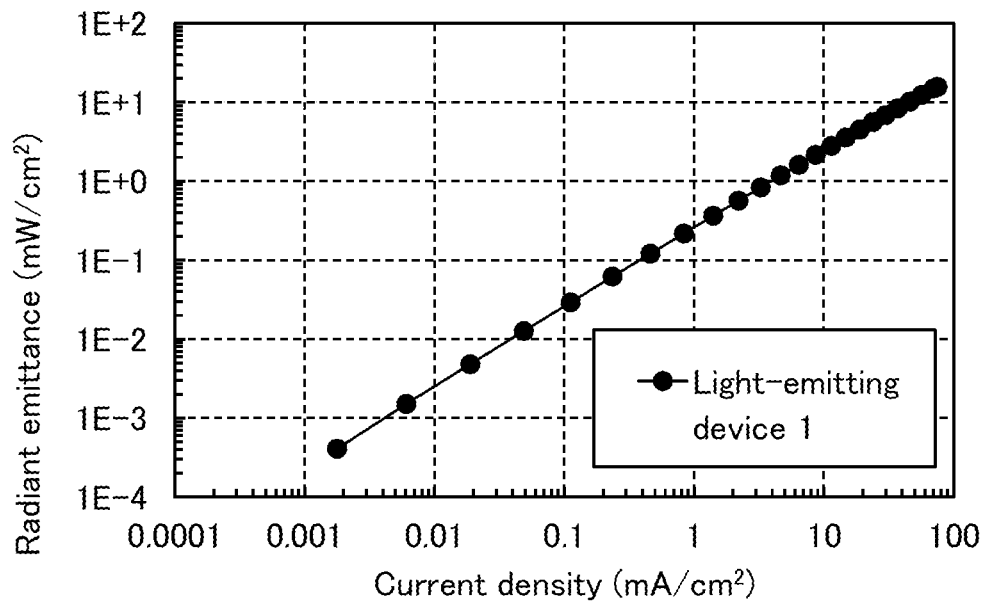
FIG. 8 is a diagram showing the current density-radiant emittance characteristics of a light-emitting device 1.
Figure 9:
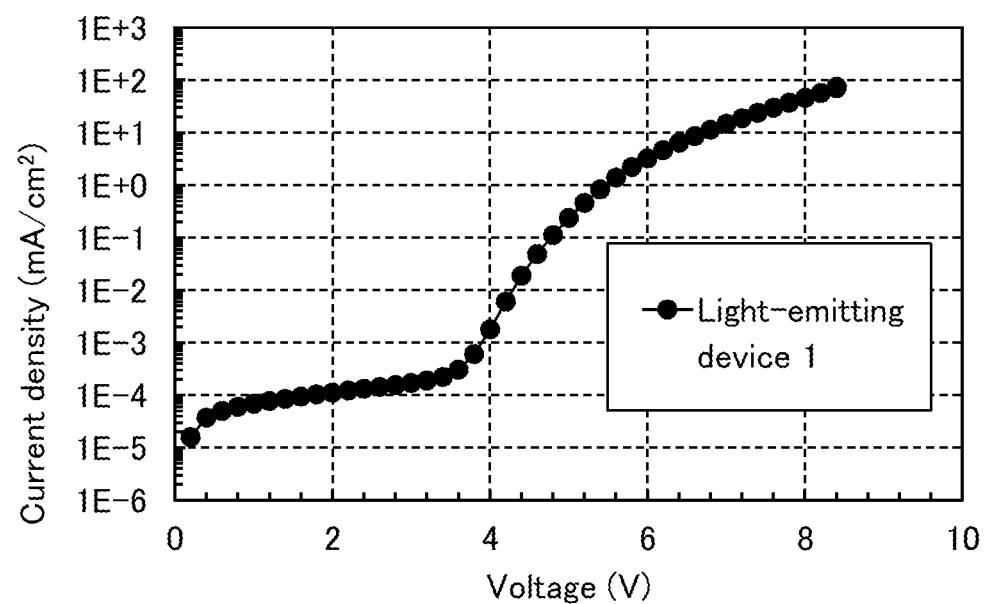
FIG. 9 is a diagram showing the voltage-current density characteristics of the light-emitting device 1.
Figure 10:
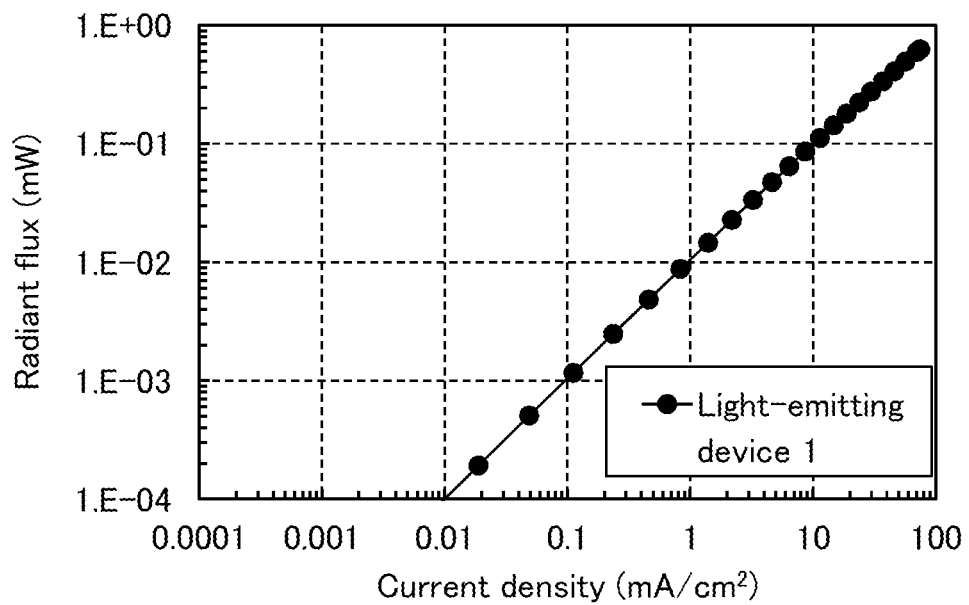
FIG. 10 is a diagram showing the current density-radiant flux characteristics of the light-emitting device 1.
Figure 11:
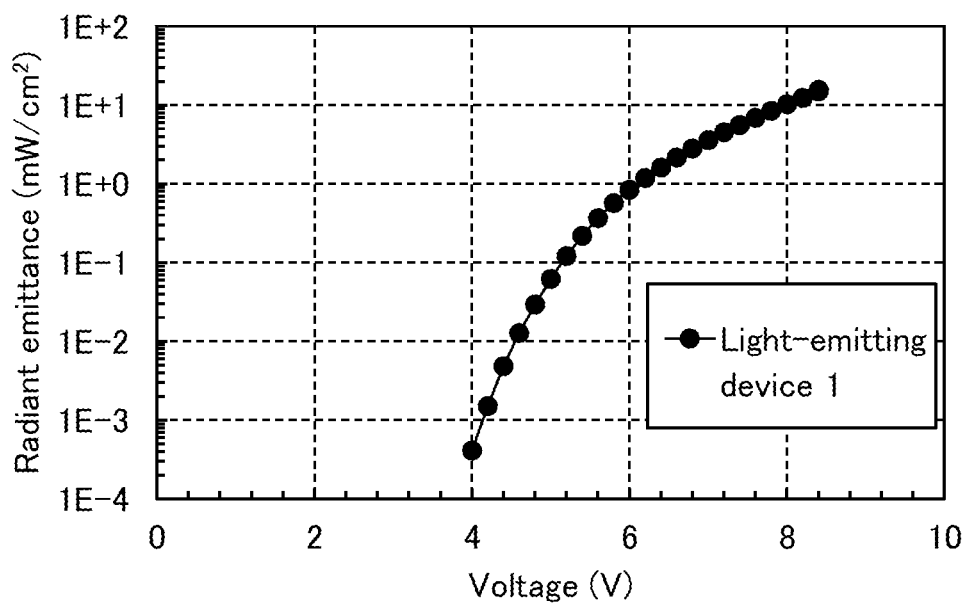
FIG. 11 is a diagram showing the voltage-radiant emittance characteristics of the light-emitting device 1.
Figure 12:
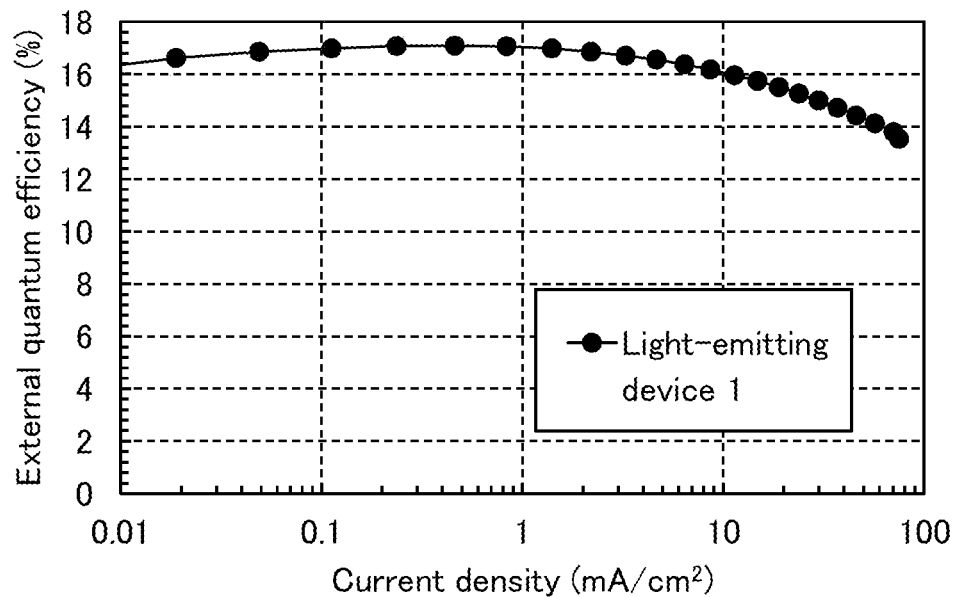
FIG. 12 is a diagram showing the current density-external quantum efficiency characteristics of the light-emitting device 1.

FIG. 8 shows the current density-radiant emittance characteristics of the light-emitting device 1. FIG. 9 shows the voltage-current density characteristics of the light-emitting device 1. FIG. 10 shows the current density-radiant flux characteristics of the light-emitting device 1. FIG. 11 shows the voltage-radiant emittance characteristics of the light-emitting device 1. FIG. 12 shows the current density-external quantum efficiency characteristics of the light-emitting device 1. Note that radiant emittance, radiant flux, and external quantum efficiency were calculated using radiance, assuming that the light-emitting device had Lambertian light-distribution characteristics.

Table 2 lists the initial values of main characteristics of the light-emitting device 1 at around 8.9 W/sr/m$^2$.

TABLE 2

| | Voltage (V) | Current (mA) | Current density (mA/cm$^2$) | Radiance (W/sr/m$^2$) | Radiant flux (mW) | External quantum efficiency (%) |
|---|---|---|---|---|---|---|
| Light-emitting device 1 | 6.8 | 0.45 | 11 | 8.9 | 0.11 | 16 |

The light-emitting device 1 was found to exhibit favorable characteristics, as shown in FIG. 8 to FIG. 12 and Table 2. For example, at the same current density, the radiance of light emitted by the light-emitting device 1 was higher than those of light emitted by a light-emitting device 2 and a light-emitting device 3 described later. For example, at the same current density, the light-emitting device 1 has higher external quantum efficiency than the light-emitting device 2 and the light-emitting device 3. For example, at the same current density, the light-emitting device 1 has lower driving voltage than the light-emitting device 3.

FIG. 13 shows an emission spectrum when current at a current density of 10 mA/cm$^2$ was supplied to the light-emitting device 1. The emission spectrum was measured with a near-infrared spectroradiometer (SR-NIR, manufactured by TOPCON TECHNOHOUSE CORPORATION). As shown in FIG. 13, the light-emitting device 3 exhibited an emission spectrum having a maximum peak at around 802 nm, which was derived from light emitted from [Ir(dmdpbq)$_2$(dpm)] included in the light-emitting layer 813a and the light-emitting layer 831b.

Employing the microcavity structure narrowed the emission spectrum, and the half width was 35 nm. The light-emitting device 1 efficiently emits light longer than or equal to 760 nm and shorter than or equal to 900 nm and is said to be highly effective as a light source for a sensor application and the like.

Reference Example 1

In this reference example, a structure, a fabrication method, and characteristics of the fabricated light-emitting device 2 are described with reference to FIG. 7A and FIG. 14 to FIG. 19.

The light-emitting device 2 fabricated in this reference example includes a light-emitting unit 802, the electrode 801, and the electrode 803 and has a function of emitting light (see FIG. 7). Note that the light-emitting device 2 is different from the light-emitting device 1 in including one light-emitting unit.

The light-emitting unit 802 includes a region interposed between the electrode 801 and the electrode 803, and the light-emitting unit 802 includes a light-emitting layer 813. The light-emitting layer 813 includes the first light-emitting material. Note that [Ir(dmdpbq)$_2$(dpm)] was used as the first light-emitting material.

Figure 19:
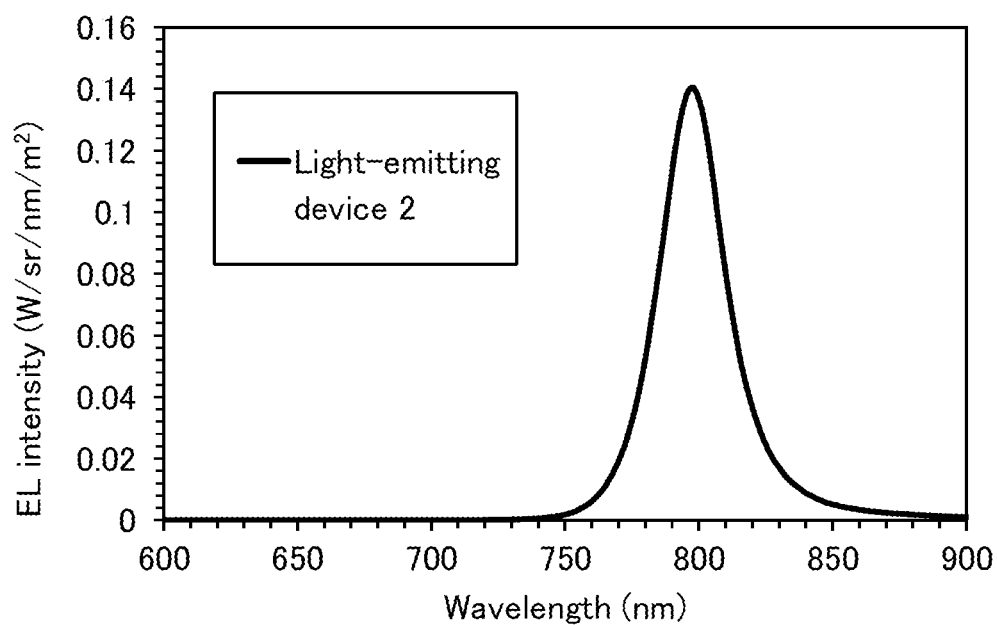
FIG. 19 is a diagram showing an emission spectrum of the light-emitting device 2.

The spectrum of light emitted by the fabricated light-emitting device 2 has a local maximum at a wavelength of 798 nm (see FIG. 19).

Table 3 shows a specific structure of the light-emitting device 2.

TABLE 3

| Light-emitting | First electrode | | |
|---|---|---|---|
| device 2 | APC (100 nm) | ITSO (10 nm) | → |

| | Hole-injection layer | Hole-transport layer | Light-emitting layer | Electron-transport layer | | Electron-injection layer | |
|---|---|---|---|---|---|---|---|
| → | DBT3P-II:MoOx (2:1 25 nm) | PCBBiF (20 nm) | * | 2mDBTBPDBq-II (20 nm) | NBphen (75 nm) | LiF (1 nm) | → |

| → | Second electrode | Buffer layer |
|---|---|---|
| | Ag:Mg (10:1 30 nm) | DBT3P-II (100 nm) |

*2mDBTBPDBq-II:PCBBiF:[Ir(dmdpbq)$_2$(dpm)] (0.7:0.3:0.1 40 nm)

<<Fabrication of Light-Emitting Device 2>>

Figure 7A:
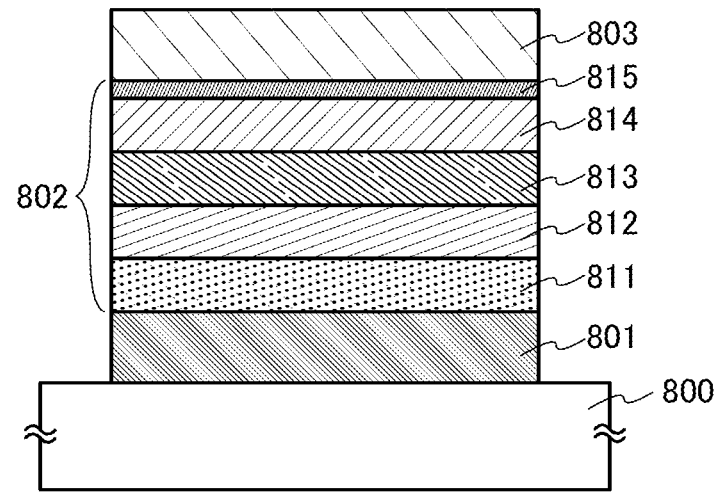
FIG. 7A and FIG. 7B are diagrams each illustrating a structure of a light-emitting device according to examples.

The light-emitting device 2 described in this example has a structure in which a first electrode 801 is formed over the substrate 800; the hole-injection layer 811, the hole-transport layer 812, the light-emitting layer 813, the electron-transport layer 814, and the electron-injection layer 815 are stacked in this order over the first electrode 801; and a second electrode 803 is stacked over the electron-injection layer 815, as illustrated in FIG. 7A.

First, the first electrode 801 was formed over the substrate 800. The electrode area was set to 4 mm² (2 mm×2 mm). A glass substrate was used as the substrate 800. The first electrode 801 was formed in such a manner that an alloy film of silver (Ag), palladium (Pd), and copper (Cu) (Ag—Pd—Cu (APC)) was formed to a thickness of 100 nm by a sputtering method, and an ITSO film was formed to a thickness of 10 nm by a sputtering method. In this example, the first electrode 801 functions as an anode.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to approximately $10^{-4}$ Pa, vacuum baking at 170° C. for 30 minutes was performed in a heating chamber in the vacuum evaporation apparatus, and then the substrate was cooled down for approximately 30 minutes.

Next, the hole-injection layer 811 was formed over the first electrode 801. For the formation of the hole-injection layer 811, the pressure in the vacuum evaporation apparatus was reduced to $10^{-4}$ Pa, and then DBT3P-II and molybdenum oxide were co-evaporated such that DBT3P-II:molybdenum oxide=2:1 (weight ratio) and the thickness was 25 nm.

Then, the hole-transport layer 812 was formed over the hole-injection layer 811. The hole-transport layer 812 was formed to a thickness of 20 nm by evaporation of PCBBiF.

Next, the light-emitting layer 813 was formed over the hole-transport layer 812. Using 2mDBTBPDBq-II as a host material, PCBBiF as an assist material, and [Ir(dmdpbq)$_2$(dpm)] as a guest material (a phosphorescent material), co-evaporation was performed so that the weight ratio was 2mDBTBPDBq-II:PCBBiF:[Ir(dmdpbq)$_2$(dpm)]=0.7:0.3:0.1. The thickness was set to 40 nm.

Next, the electron-transport layer 814 was formed over the light-emitting layer 813. The electron-transport layer 814 was formed by sequential deposition by evaporation such that the thickness of 2mDBTBPDBq-II was 20 nm and the thickness of NBphen was 75 nm.

Then, the electron-injection layer 815 was formed over the electron-transport layer 814. The electron-injection layer 815 was formed to a thickness of 1 nm by evaporation of lithium fluoride (LiF).

After that, the second electrode 803 was formed over the electron-injection layer 815. The second electrode 803 was formed by co-evaporation of silver (Ag) and magnesium (Mg) such that Ag:Mg=10:1 (volume ratio) and the thickness was 30 nm. In this example, the second electrode 803 functions as a cathode.

Next, a buffer layer 804 was formed over the second electrode 803. The buffer layer 804 was formed to a thickness of 100 nm by evaporation of DBT3P-II.

Through the above steps, the light-emitting device 2 was formed over the substrate 800. In all the evaporation steps in the above fabrication method, an evaporation method by a resistance-heating method was used.

The light-emitting device 2 was sealed using a different substrate (not illustrated). The sealing method is the same as that for the light-emitting device 1; hence, Example 1 can be referred to for the sealing method.

<<Operating Characteristics of Light-Emitting Device 2>>

The operating characteristics of the light-emitting device 2 were measured. Note that the measurement was carried out at room temperature (an atmosphere maintained at 25° C.).

Figure 14:
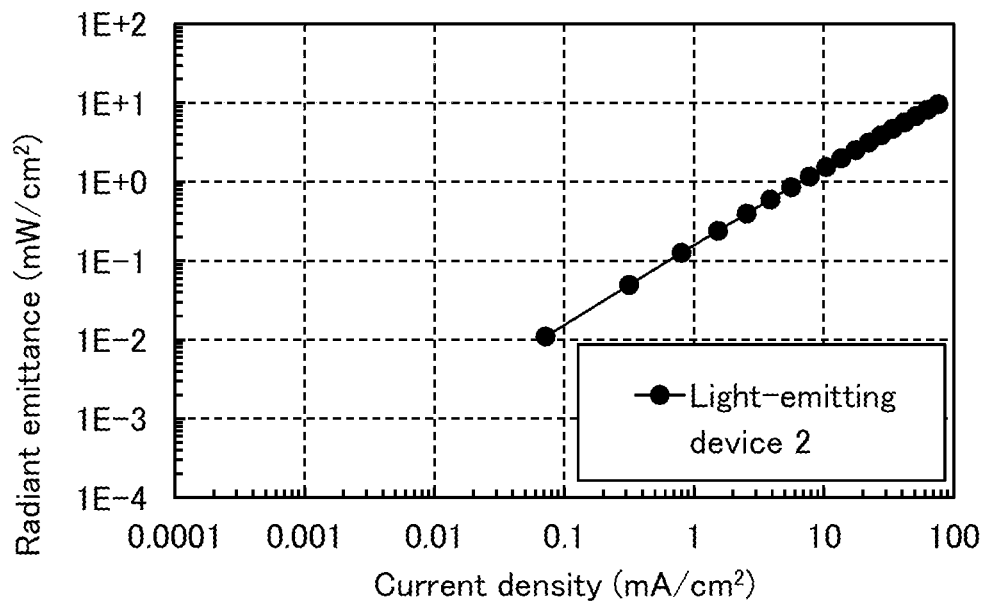
FIG. 14 is a diagram showing the current density-radiant emittance characteristics of a light-emitting device 2.
Figure 15:
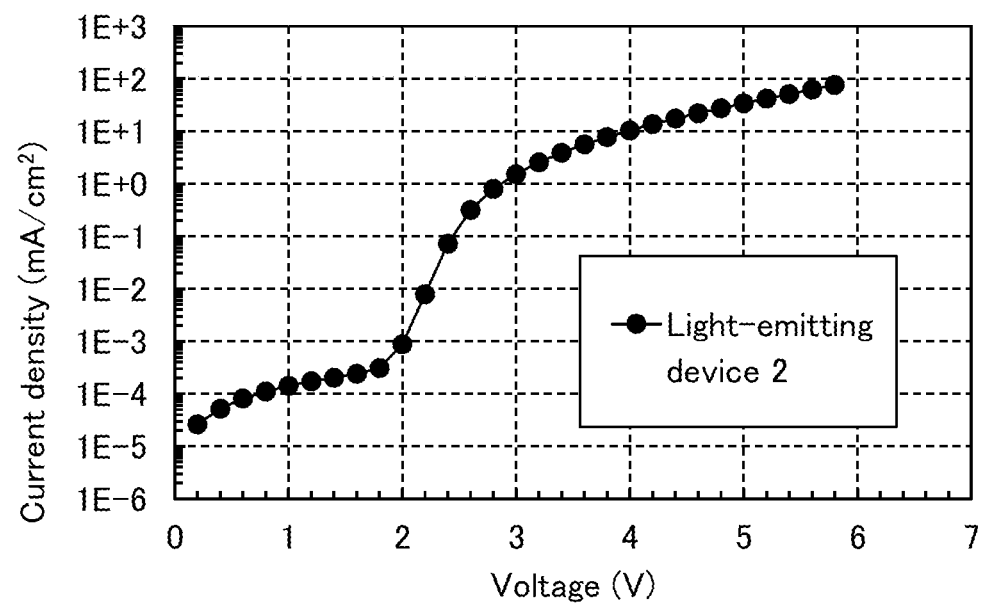
FIG. 15 is a diagram showing the voltage-current density characteristics of the light-emitting device 2.
Figure 16:
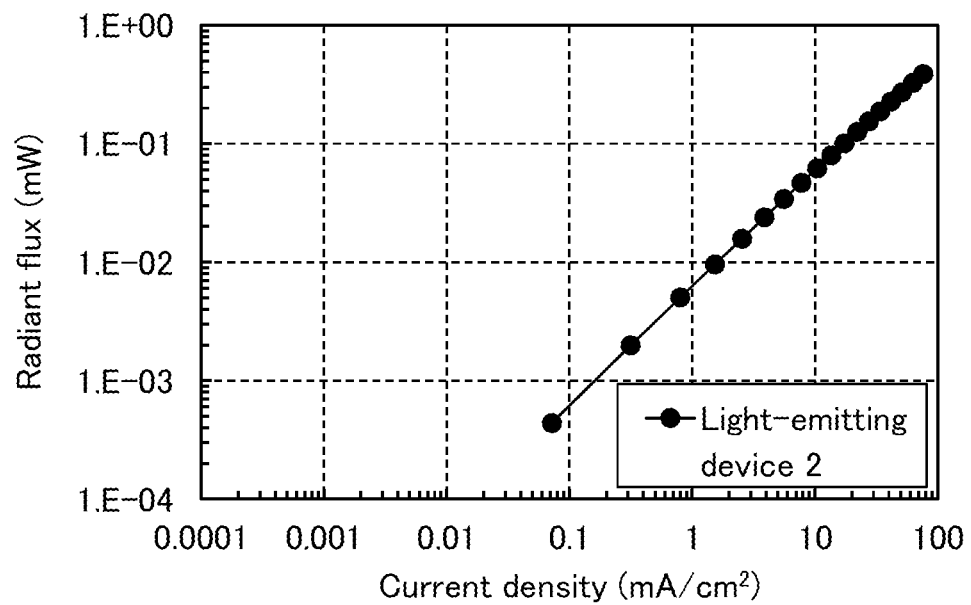
FIG. 16 is a diagram showing the current density-radiant flux characteristics of the light-emitting device 2.
Figure 17:
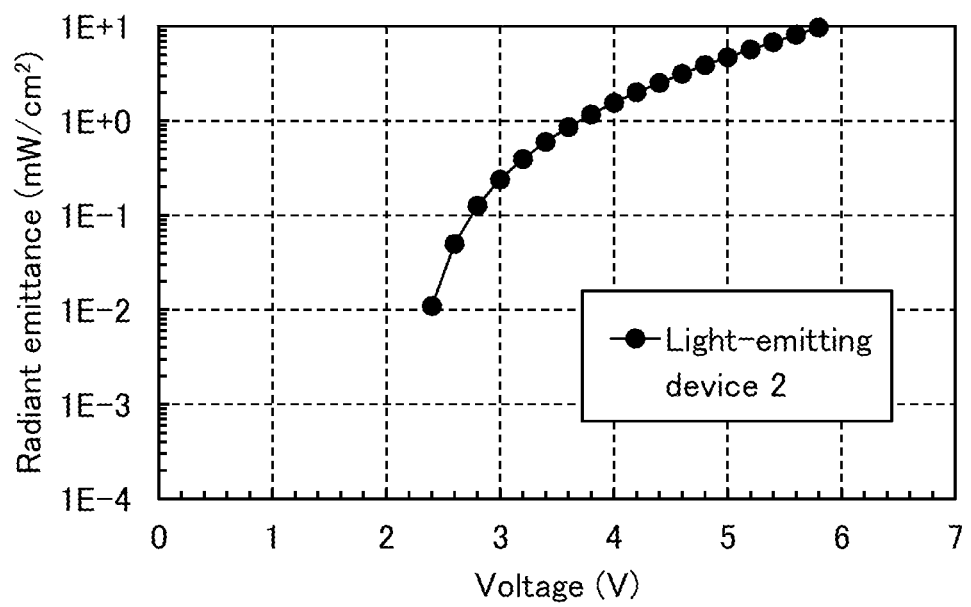
FIG. 17 is a diagram showing the voltage-radiant emittance characteristics of the light-emitting device 2.
Figure 18:
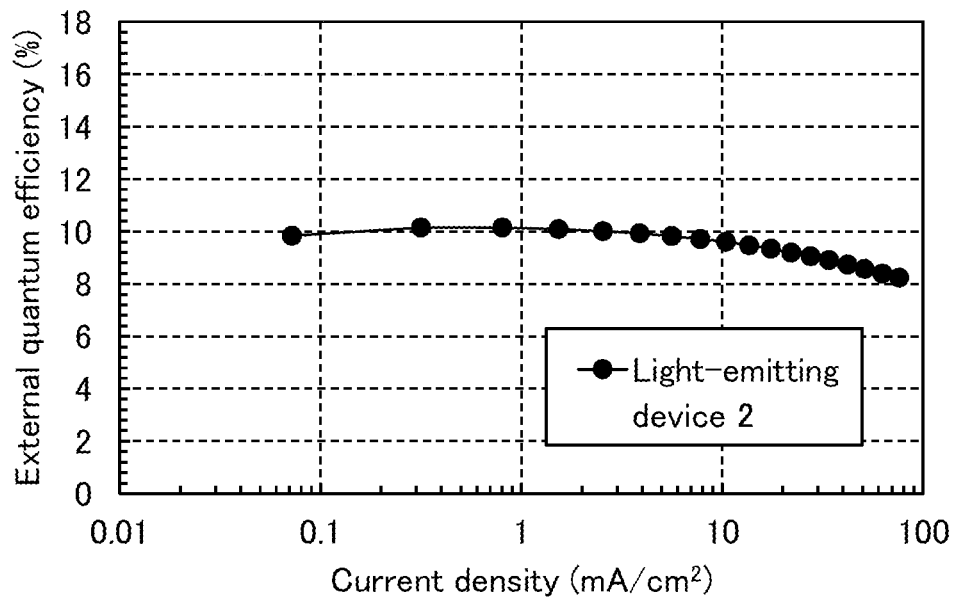
FIG. 18 is a diagram showing the current density-external quantum efficiency characteristics of the light-emitting device 2.

FIG. 14 shows the current density-radiant emittance characteristics of the light-emitting device 2. FIG. 15 shows the voltage-current density characteristics of the light-emitting device 2. FIG. 16 shows the current density-radiant flux characteristics of the light-emitting device 2. FIG. 17 shows the voltage-radiant emittance characteristics of the light-emitting device 2. FIG. 18 shows the current density-external quantum efficiency characteristics of the light-emitting device 2. Note that radiant emittance, radiant flux, and external quantum efficiency were calculated using radiance, assuming that the light-emitting device had Lambertian light-distribution characteristics.

Table 4 lists the initial values of main characteristics of the light-emitting device 2 at around 4.9 W/sr/m².

TABLE 4

| | Voltage (V) | Current (mA) | Current density (mA/cm²) | Radiance (W/sr/m²) | Radiant flux (mW) | External quantum efficiency (%) |
|---|---|---|---|---|---|---|
| Light-emitting device 2 | 4.0 | 0.42 | 10 | 4.9 | 0.062 | 9.6 |

FIG. 19 shows an emission spectrum when current at a current density of 10 mA/cm² was supplied to the light-emitting device 2. The emission spectrum was measured with a near-infrared spectroradiometer (SR-NIR, manufactured by TOPCON TECHNOHOUSE CORPORATION).

Reference Example 2

In this reference example, a structure, a fabrication method, and characteristics of the fabricated light-emitting device 3 are described with reference to FIG. 7B and FIG. 20 to FIG. 25.

Figure 7B:
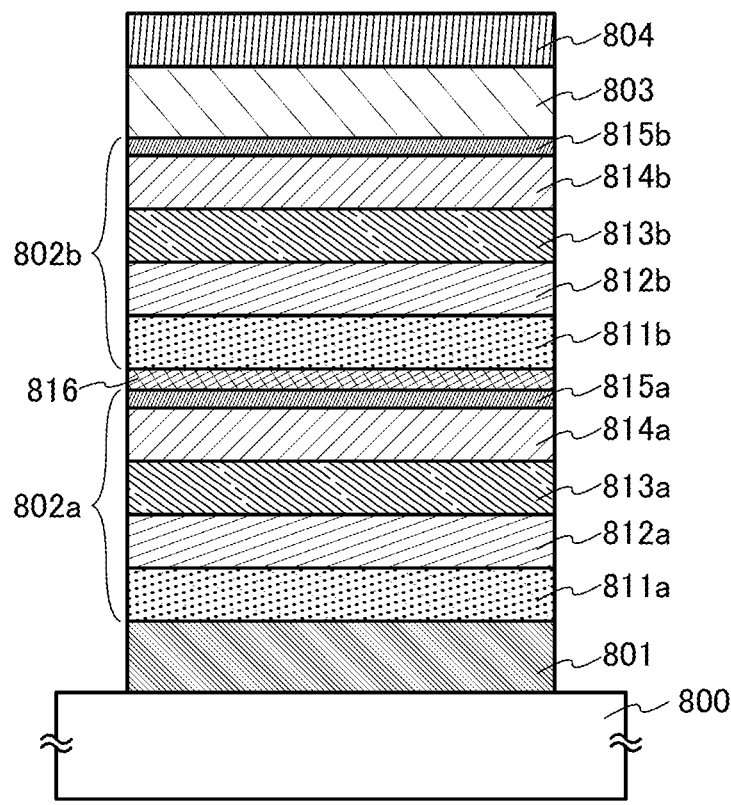

The light-emitting device 3 fabricated in this example includes the intermediate layer 816, the light-emitting unit 802a, the light-emitting unit 802b, the electrode 801, and the electrode 803 and has a function of emitting light (see FIG. 7B). Note that the light-emitting device 3 is different from the light-emitting device 1 in that the distance between the light-emitting layer 813b and the light-emitting layer 813a is longer than that in the light-emitting device 1. The light-emitting device 3 is different from the light-emitting device 1 in that the distance between the electrode 801 and the electrode 803 is longer than that in the light-emitting device 1.

The intermediate layer 816 includes a region interposed between the light-emitting unit 802a and the light-emitting unit 802b, and the intermediate layer 816 has a function of supplying an electron to one of the light-emitting unit 802a and the light-emitting unit 802b and supplying a hole to the other.

The light-emitting unit 802a includes a region interposed between the electrode 801 and the intermediate layer 816, and the light-emitting unit 802a includes a light-emitting layer 813a. The light-emitting layer 813a includes the first light-emitting material.

The light-emitting unit 802b includes a region interposed between the intermediate layer 816 and the electrode 803, and the light-emitting unit 802b includes a light-emitting layer 813b. The light-emitting layer 813b also includes the first light-emitting material. The light-emitting layer 813b has the distance D1 from the light-emitting layer 813a. Note that in the light-emitting device 3, the distance D1 was (20+90+0.1+2+10+60)=182.1 nm (see Table 5).

Figure 25:
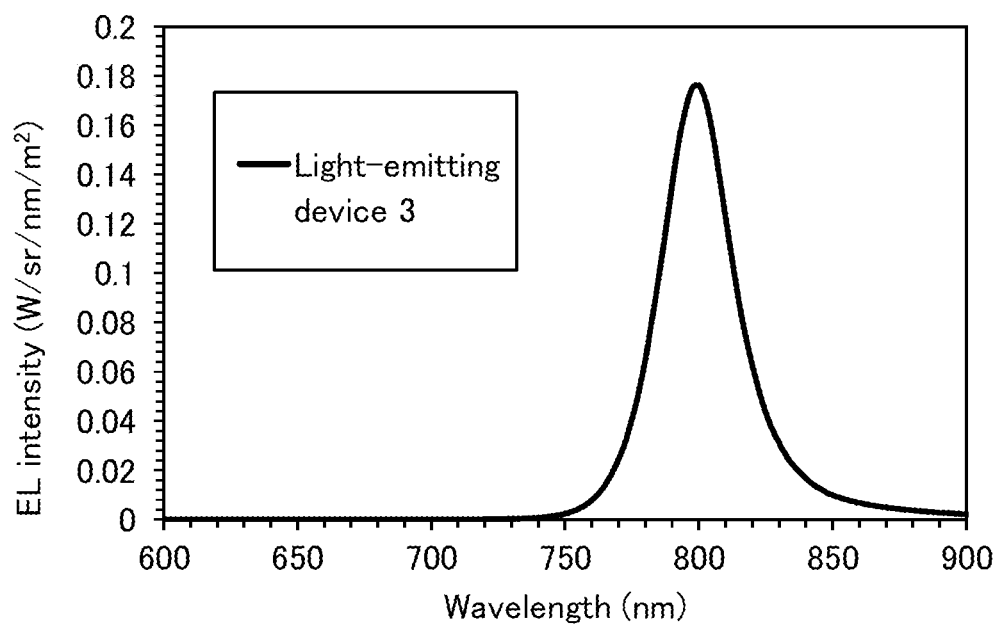
FIG. 25 is a diagram showing an emission spectrum of the light-emitting device 3.

The spectrum of light emitted by the fabricated light-emitting device 2 has a local maximum at a wavelength of 799 nm (see FIG. 25).

The electrode 801 has higher reflectance than the electrode 803 at the wavelength EL1. At the wavelength ELL the electrode 803 has higher transmittance than the electrode 801 and transmits part of light and reflects another part of the light.

Table 5 shows a specific structure of the light-emitting device 3 used in this reference example. The chemical formula of the material used in this reference example is shown below.

TABLE 5

| | First electrode | → | | | | | |
|---|---|---|---|---|---|---|---|
| Light-emitting device 3 | APC (100 nm) | ITSO (10 nm) | | | | | |
| → | Hole-injection layer | | Hole-transport layer | Light-emitting layer | Electron-injection layer | Electron-injection layer | → |
| | DBT3P-II:MoOx (2:1 10 nm) | | PCBBiF (30 nm) | * | 2mDBTBPDBq-II (20 nm) | NBphen (90 nm) | Li$_2$O (0.1 nm) |
| → | Intermediate layer | | Hole-transport layer | Light-emitting layer | Electron-transport layer | Electron-injection layer | → |
| | CuPc (2 nm) | DBT3P-II:MoOx (2:1 10 nm) | PCBBiF (60 nm) | * | 2mDBTBPDBq-II (20 nm) | NBphen (65 nm) | LiF (1 nm) |
| → | Second electrode | Buffer layer | | | | | |
| | Ag:Mg (10:1 20 nm) | DBT3P-II (110 nm) | | | | | |

*2mDBTBPDBq-II:PCBBiF:[Ir(dmdpbq)$_2$(dpm)] (0.7:0.3:0.1 40 nm)

[Chemical formula 2]

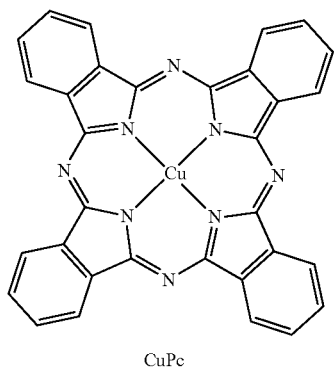

CuPc

<<Fabrication of Light-Emitting Device 3>>

The light-emitting device 3 described in this example has a structure in which the first electrode 801 is formed over the substrate 800; the light-emitting unit 802a (the hole-injection layer 811a, the hole-transport layer 812a, the light-emitting layer 813a, the electron-transport layer 814a, and the electron-injection layer 815a), the intermediate layer 816, and the light-emitting unit 802b (a hole-injection layer 811b, the hole-transport layer 812b, the light-emitting layer 813b, the electron-transport layer 814b, and the electron-injection layer 815b) are stacked in this order over the first electrode 801; and the second electrode 803 is stacked over the light-emitting unit 802b, as illustrated in FIG. 7B.

First, the first electrode 801 was formed over the substrate 800. The electrode area was set to 4 mm$^2$ (2 mm×2 mm). A glass substrate was used as the substrate 800. The first electrode 801 was formed in such a manner that an alloy film of silver (Ag), palladium (Pd), and copper (Cu) (Ag—Pd—Cu (APC)) was formed to a thickness of 100 nm by a sputtering method, and an ITSO film was formed to a thickness of 10 nm by a sputtering method. In this example, the first electrode 801 functions as an anode.

As pretreatment, a surface of the substrate was washed with water, baking was performed at 200° C. for one hour, and then UV ozone treatment was performed for 370 seconds. After that, the substrate was transferred into a vacuum evaporation apparatus in which the pressure was reduced to approximately 10$^{-4}$ Pa, vacuum baking at 170° C. for 30 minutes was performed in a heating chamber in the vacuum evaporation apparatus, and then the substrate was cooled down for approximately 30 minutes.

Next, the hole-injection layer 811a was formed over the first electrode 801. For the formation of the hole-injection layer 811a, the pressure in the vacuum evaporation apparatus was reduced to 10$^{-4}$ Pa, and then DBT3P-II and molybdenum oxide were co-evaporated such that DBT3P-II:molybdenum oxide=2:1 (weight ratio) and the thickness was 10 nm.

Then, the hole-transport layer 812a was formed over the hole-injection layer 811a. The hole-transport layer 812a was formed to a thickness of 30 nm by evaporation of PCBBiF.

Next, the light-emitting layer 813a was formed over the hole-transport layer 812a. Using 2mDBTBPDBq-II as a host material, PCBBiF as an assist material, and [Ir(dmdpbq)$_2$(dpm)], which is an organometallic complex, as a guest material (a phosphorescent material), co-evaporation was performed so that the weight ratio was 2mDBTBPDBq-II:PCBBiF:[Ir(dmdpbq)$_2$(dpm)]=0.7:0.3:0.1. The thickness was set to 40 nm.

Next, the electron-transport layer 814a was formed over the light-emitting layer 813a. The electron-transport layer 814a was formed by sequential deposition by evaporation such that the thickness of 2mDBTBPDBq-II was 20 nm and the thickness of NBphen was 90 nm.

Then, the electron-injection layer 815a was formed over the electron-transport layer 814a. The electron-injection layer 815a was formed to a thickness of 0.1 nm by evaporation of lithium oxide (Li$_2$O).

Next, the intermediate layer 816 was formed over the electron-injection layer 815a. The intermediate layer 816 was formed to a thickness of 2 nm by evaporation of copper phthalocyanine (CuPc).

Next, the hole-injection layer 811b was formed over the intermediate layer 816. The hole-injection layer 811b was formed by co-evaporation of DBT3P-II and molybdenum oxide such that DBT3P-II:molybdenum oxide=2:1 (weight ratio) and the thickness was 10 nm.

Then, the hole-transport layer 812b was formed over the hole-injection layer 811b. The hole-transport layer 812b was formed to a thickness of 60 nm by evaporation of PCBBiF.

Next, the light-emitting layer 813b was formed over the hole-transport layer 812b. Using 2mDBTBPDBq-II as a host material, PCBBiF as an assist material, and [Ir(dmdpbq)$_2$(dpm)], which is the organometallic complex of one embodiment of the present invention, as a guest material (a phosphorescent material), co-evaporation was performed so that the weight ratio was 2mDBTBPDBq-II:PCBBiF:[Ir(dmdpbq)$_2$(dpm)]=0.7:0.3:0.1. The thickness was set to 40 nm.

Next, the electron-transport layer 814b was formed over the light-emitting layer 813b. The electron-transport layer 814b was formed by sequential deposition by evaporation so that the thickness of 2mDBTBPDBq-II was 20 nm and the thickness of NBphen was 65 nm.

Then, the electron-injection layer 815b was formed over the electron-transport layer 814b. The electron-injection layer 815b was formed to a thickness of 1 nm by evaporation of lithium fluoride (LiF).

After that, the second electrode 803 was formed over the electron-injection layer 815b. The second electrode 803 was formed by co-evaporation of silver (Ag) and magnesium (Mg) such that Ag:Mg=10:1 (volume ratio) and the thickness was 20 nm. In this example, the second electrode 803 functions as a cathode.

Next, a buffer layer 804 was formed over the second electrode 803. The buffer layer 804 was formed to a thickness of 110 nm by evaporation of DBT3P-II.

Through the above steps, the light-emitting device 3 was formed over the substrate 800. In all the evaporation steps in the above fabrication method, an evaporation method by a resistance-heating method was used.

The light-emitting device 3 was sealed using a different substrate (not illustrated). The sealing method is the same as that for the light-emitting device 1; hence, Example 1 can be referred to for the sealing method.

Note that a microcavity structure is applied to the light-emitting device 3. The light-emitting device 3 was fabricated so that the optical path length between the pair of reflective electrodes (the APC film and the Ag:Mg film) was approximately half-wave of the maximum peak wavelength of light emitted from the guest material.

<<Operating Characteristics of Light-Emitting Device 3>>

The operating characteristics of the light-emitting device 3 were measured. Note that the measurement was carried out at room temperature (an atmosphere maintained at 25° C.).

Figure 20:
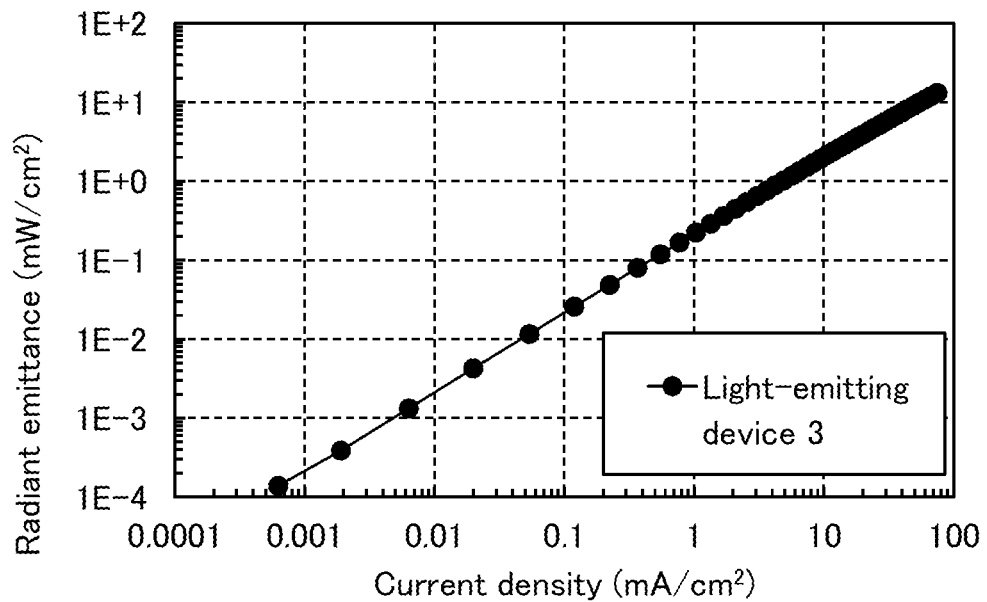
FIG. 20 is a diagram showing the current density-radiant emittance characteristics of a light-emitting device 3.
Figure 21:
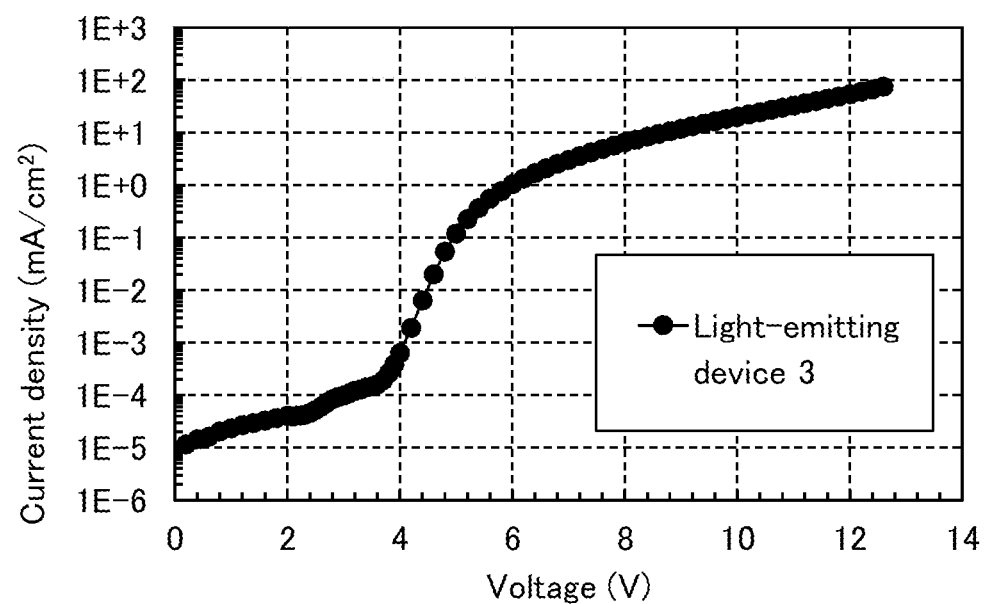
FIG. 21 is a diagram showing the voltage-current density characteristics of the light-emitting device 3.
Figure 22:
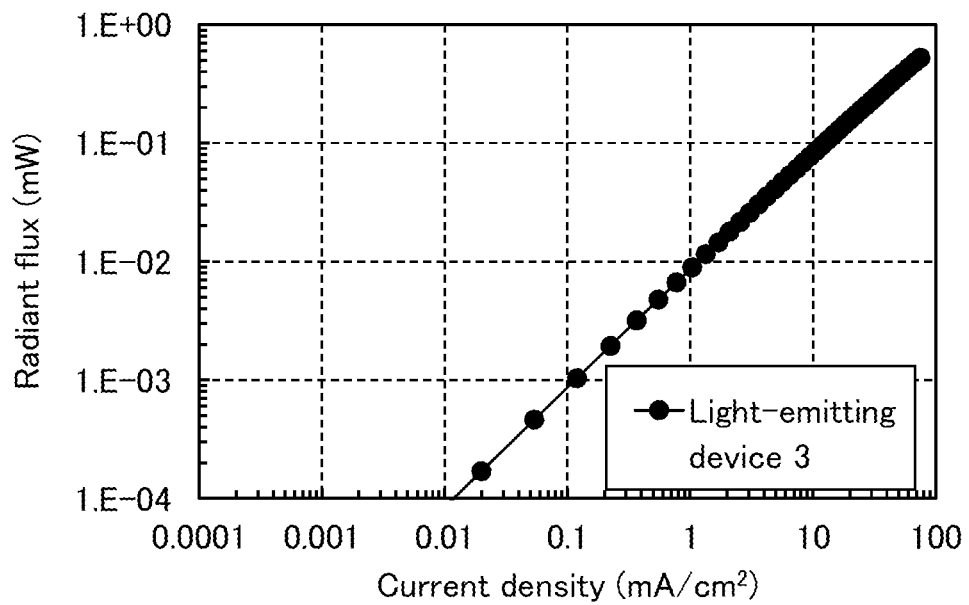
FIG. 22 is a diagram showing the current density-radiant flux characteristics of the light-emitting device 3.
Figure 23:
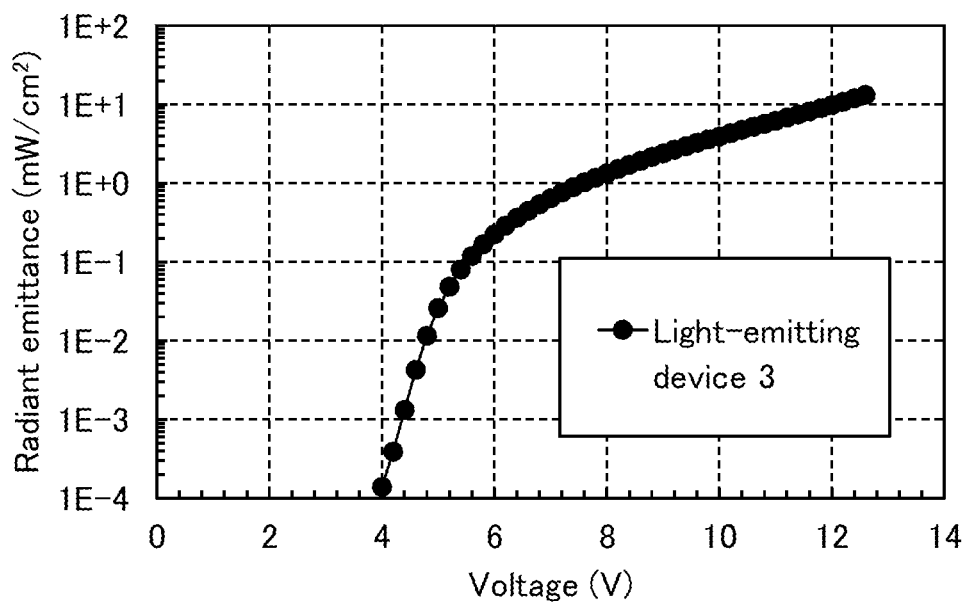
FIG. 23 is a diagram showing the voltage-radiant emittance characteristics of the light-emitting device 3.
Figure 24:
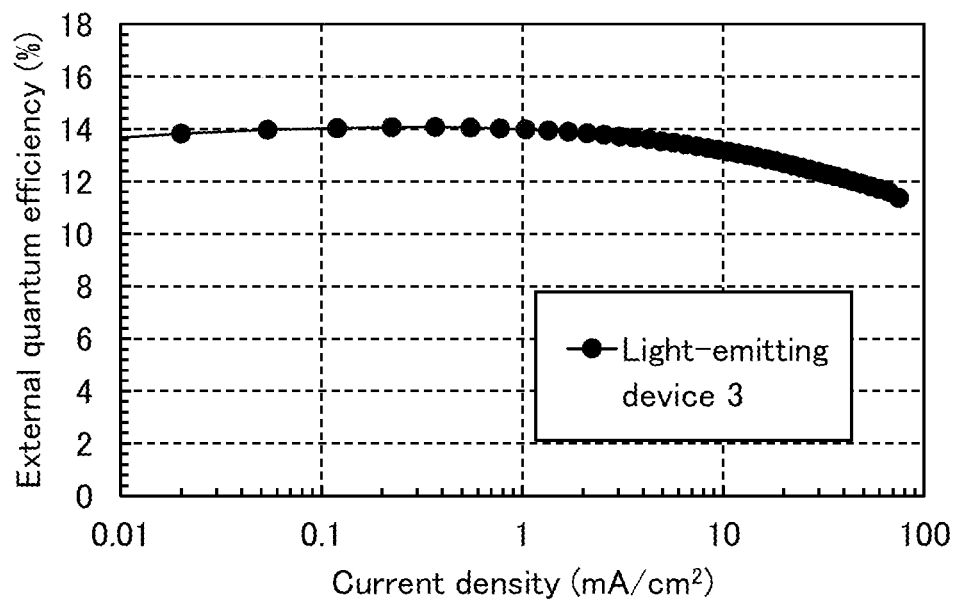
FIG. 24 is a diagram showing the current density-external quantum efficiency characteristics of the light-emitting device 3.

FIG. 20 shows the current density-radiant emittance characteristics of the light-emitting device 3. FIG. 21 shows the voltage-current density characteristics of the light-emitting device 3. FIG. 22 shows the current density-radiant flux characteristics of the light-emitting device 3. FIG. 23 shows the voltage-radiant emittance characteristics of the light-emitting device 3. FIG. 24 shows the current density-external quantum efficiency characteristics of the light-emitting device 3. Note that radiant emittance, radiant flux, and external quantum efficiency were calculated using radiance, assuming that the light-emitting device had Lambertian light-distribution characteristics.

Table 6 lists the initial values of main characteristics of the light-emitting device 3 at around 6.8 W/sr/m$^2$.

TABLE 6

| | Voltage (V) | Current (mA) | Current density (mA/cm$^2$) | Radiance (W/sr/m$^2$) | Radiant flux (mW) | External quantum efficiency (%) |
|---|---|---|---|---|---|---|
| Light-emitting device 3 | 8.8 | 0.42 | 11 | 6.8 | 0.09 | 13 |

FIG. 25 shows an emission spectrum when current at a current density of 10 mA/cm$^2$ was supplied to the light-emitting device 3. The emission spectrum was measured with a near-infrared spectroradiometer (SR-NIR, manufactured by TOPCON TECHNOHOUSE CORPORATION).

Example 2

In this example, the structure of a light-emitting device 11 to a light-emitting device 20 of one embodiment of the present invention, calculation using calculation values, and the calculation results thereof are described with reference to FIG. 26 and FIG. 27

Figure 26:
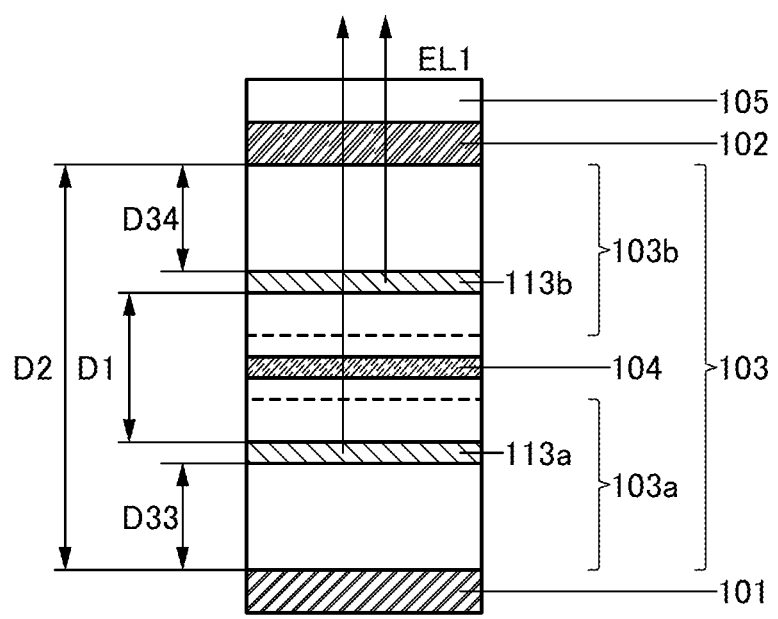
FIG. 26 is a diagram illustrating a structure of light-emitting devices according to examples.

FIG. 26 is a diagram illustrating the structure of the light-emitting devices of one embodiment of the present invention and a device of a reference example.

Figure 27:
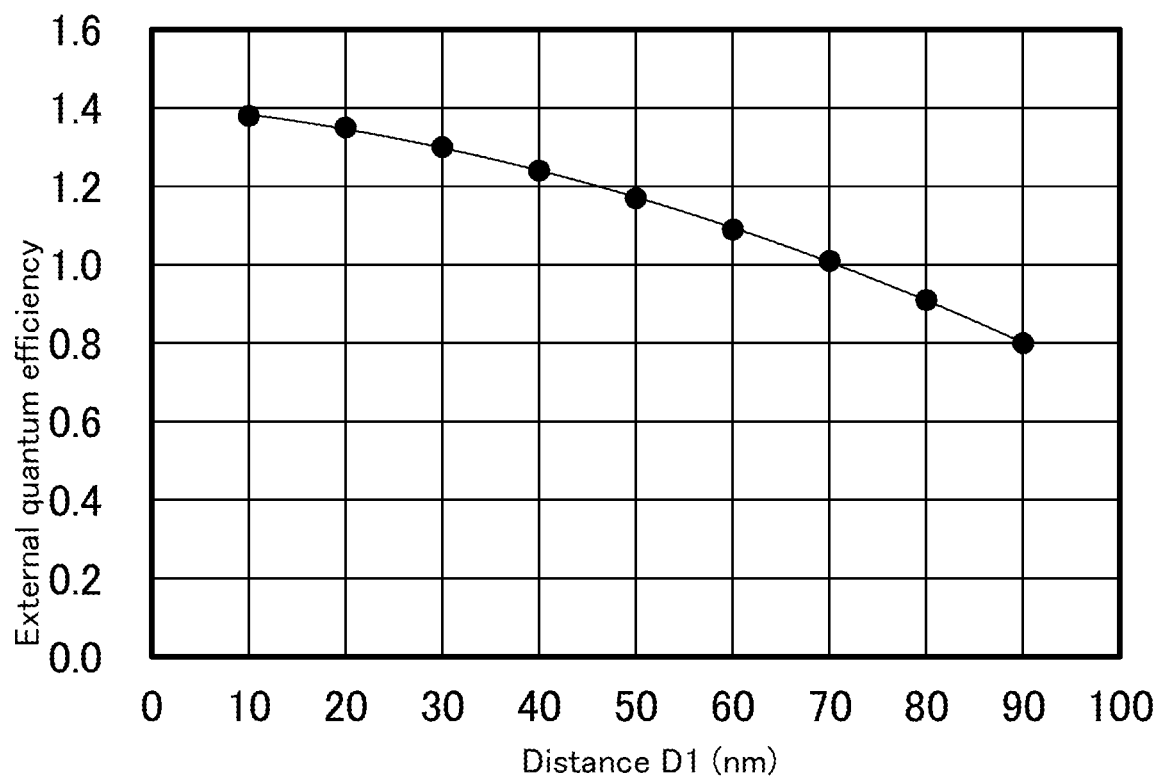
FIG. 27 is a diagram showing the calculation results of the light-emitting devices according to examples.

FIG. 27 is a diagram showing the calculation results of the light-emitting devices of one embodiment of the present invention and the device of the reference example. Specifically, the diagram shows the state where external quantum efficiency changes depending on the distance D1 between two light-emitting layers.

<Structure Example of Light-Emitting Device>

The light-emitting device of one embodiment of the present invention includes the intermediate layer 104, the light-emitting unit 103a, the light-emitting unit 103b, the electrode 101, and the electrode 102 and has a function of emitting light (see FIG. 26).

The intermediate layer 104 has a function of supplying an electron to one of the light-emitting unit 103a and the light-emitting unit 103b and supplying a hole to the other.

<<Light-Emitting Layer 113a>>

The light-emitting unit 103a includes a region interposed between the electrode 101 and the intermediate layer 104. The light-emitting unit 103a includes the light-emitting layer 113a, and the light-emitting layer 113a includes the first light-emitting material. In this example, the thickness of the light-emitting layer 113a was 10 nm, and [Ir(dmdpbq)$_2$(dpm)] was used as the first light-emitting material.

<<Light-Emitting Layer 113b>>

The light-emitting unit 103b includes a region interposed between the intermediate layer 104 and the electrode 102. The light-emitting unit 103b includes the light-emitting layer 113b, and the light-emitting layer 113b includes the second light-emitting material. In this example, the thickness of the light-emitting layer 113b was 10 nm, and the same material as the first light-emitting material was used as the second light-emitting material.

The light-emitting device of one embodiment of the present invention emits light having a spectrum with a local maximum at the wavelength EL1. In this example, light having a spectrum with a local maximum in the vicinity of 800 nm is emitted.

<<Electrode 101>>

The electrode 101 has higher reflectance than the electrode 102 at the wavelength EL1. In this example, 100-nm-thick silver was used for the electrode 101.

<<Electrode 102>>

The electrode 102 has higher transmittance than the electrode 101 at the wavelength EL1. The electrode 102 transmits part of the light and reflects another part of the light at the wavelength EL1. In this example, approximately 30-nm-thick silver was used for the electrode 102. The light-emitting device of one embodiment of the present invention includes a protective layer 105 having a thickness of approximately 100 nm. Note that the protective layer 105 is in contact with the electrode 102.

The electrode 102 has the distance D2 from the electrode 101. The product of the distance D2 multiplied by 1.8 is greater than or equal to 0.3 times and less than or equal to 0.6 times the wavelength EL1. In this embodiment, a distance in the range of 134 nm to 266 nm, inclusive, was used as the distance D2.

Note that the light-emitting layer 113b has the distance D1 from the light-emitting layer 113a. In this embodiment, a distance in the range of 10 nm to 90 nm, inclusive, was used as the distance D1.

Specifically, 10 nm was employed as the distance D1 in the light-emitting device 12, 20 nm was employed as the distance D1 in the light-emitting device 13, 30 nm was employed as the distance D1 in the light-emitting device 14, 40 nm was employed as the distance D1 in the light-emitting device 15, 50 nm was employed as the distance D1 in the light-emitting device 16, 60 nm was employed as the distance D1 in the light-emitting device 17, 70 nm was employed as the distance D1 in the light-emitting device 18, 80 nm was employed as the distance D1 in the light-emitting device 19, and 90 nm was employed as the distance D1 in the light-emitting device 20.

The light-emitting layer 113a has a distance D33 from the electrode 101. The light-emitting layer 113b has a distance D34 from the electrode 102.

For each of the distances D1, the distance D33, the distance D34, the thickness of the electrode 102, and the thickness of the protective layer 105 were optimized with a calculator. Thus, the efficiencies of extracting light from the light-emitting devices with the respective distances D1 were compared with one another.

<<Calculation Method>>

In this example, the calculation was performed using an organic device simulator (a semiconducting emissive thin film optics simulator: setfos, produced by Cybernet Systems Co., Ltd.).

In the calculation, the thickness, refractive index n, and extinction coefficient k of each layer of the light-emitting device, the measured value of an emission spectrum (a photoluminescence (PL) spectrum) of the light-emitting material, and the light-emitting position were input. Multiplication by the Purcell factor was performed, whereby intensity and a peak waveform of light emitted in the front direction in consideration of modulation of the radiative decay rate of an exciton were calculated.

The refractive index n and the extinction coefficient k of each layer were assumed to be 1.8 and 0, respectively. The values described in pages 355-356 of Handbook of Optical Constants of Solids Volume 1 were applied to the silver (Ag) used for the reflective electrode and the semi-reflective electrode.

The emission spectrum of the light-emitting material was measured with a near-infrared spectroradiometer (SR-NIR, produced by TOPCON TECHNOHOUSE CORPORATION) as a detector, an ultraviolet LED (NSCU033B, produced by NICHIA CORPORATION) as excitation light, UV U360 (produced by Edmund Optics Inc.) as a bandpass filter, and SCF-50S-42L (produced by SIGMAKOKI CO., LTD.) as a longpass filter.

Measurement of an infrared emission spectrum used a film over a quartz substrate, which was formed by co-evaporation of 2mDBTBPDBq-II, PCBBiF, and bis{4,6-dimethyl-2-[3-(3,5-dimethylphenyl)-2-benzo[g]quinoxalinyl-κN]phenyl-κC}(2,2,6,6-tetramethyl-3,5-heptanedionato-κ$^2$O,O')iridium(III) (abbreviation: [Ir(dmdpbq)$_2$(dpm)]) in a weight ratio of 0.7:0.3:0.1 to a thickness of 50 nm, using a vacuum evaporation method.

Figure 29:
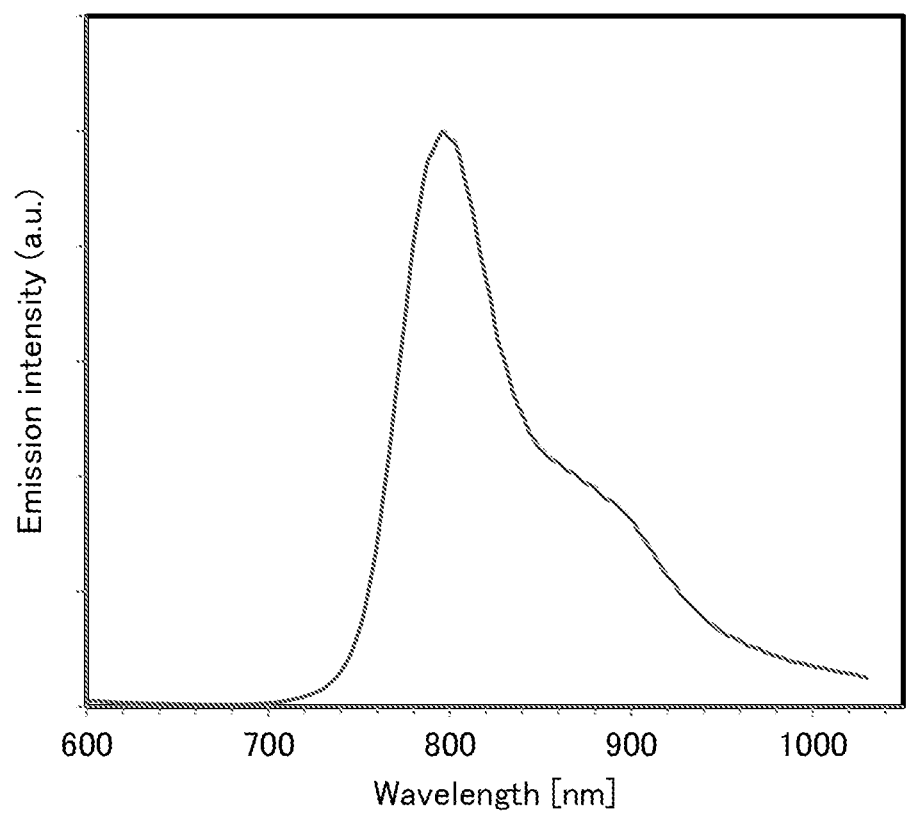
FIG. 29 shows an emission spectrum of the organometallic complex represented by Structural Formula (100).

The emission spectrum used for the calculation is shown in FIG. 29. In FIG. 29, the horizontal axis represents wavelength (unit: nm) and the vertical axis represents energy-based normalized PL intensity (arbitrary unit: a.u.).

The light-emitting position was assumed to be the center of the light-emitting layer.

The emission quantum yield, the exciton generation probability, and the recombination probability were assumed to be 100%. In other words, the external quantum efficiency (Lambertian assumption) obtained by the calculation represents light extraction efficiency calculated from the emission intensity of the front on the assumption of Lambertian distribution.

In the calculation, thickness values close to the objective optical path length were input to find the thicknesses of the hole-transport layer, the electron-transport layer, the semi-reflective electrode, and the protective layer, which maximized the external quantum efficiency (Lambertian assumption).

The thickness of the intermediate layer was also found for the device in which the optical path length between the electrodes was approximately X.

<<Results>>

Table 7, Table 8, and FIG. 27 show the calculation results. The light-emitting devices of one embodiment of the present invention, in each of which the distance D1 is longer than or equal to 5 nm and shorter than or equal to 65 nm, emitted light with higher efficiency than that of a later-described light-emitting device 21 of Reference Example 3.

TABLE 7

|  | Device 12 | Device 13 | Device 14 | Device 15 | Device 16 |
|---|---|---|---|---|---|
| Protective layer 105 | 106 nm | 106 nm | 105 nm | 105 nm | 105 nm |
| Electrode 102 | 31 nm | 31 nm | 31 nm | 31 nm | 31 nm |
| Distance D34 | 84 nm | 79 nm | 74 nm | 69 nm | 64 nm |

TABLE 7-continued

| | Device 12 | Device 13 | Device 14 | Device 15 | Device 16 |
|---|---|---|---|---|---|
| Distance D1 | 10 nm | 20 nm | 30 nm | 40 nm | 50 nm |
| Distance D33 | 79 nm | 74 nm | 69 nm | 64 nm | 60 nm |
| Local maximum EL1 | 793 nm | 794 nm | 794 nm | 795 nm | 795 nm |
| External quantum efficiency | 1.38 | 1.35 | 1.3 | 1.24 | 1.17 |

TABLE 8

| | Device 17 | Device 18 | Device 19 | Device 20 | Device 21 |
|---|---|---|---|---|---|
| Protective layer 105 | 102 nm | 104 nm | 104 nm | 101 nm | 113 nm |
| Electrode 102 | 32 nm | 32 nm | 32 nm | 32 nm | 25 nm |
| Distance D34 | 58 nm | 33 nm | 47 nm | 42 nm | 92 nm |
| Distance D1 | 60 nm | 70 nm | 80 nm | 90 nm | 193 nm |
| Distance D33 | 55 nm | 51 nm | 47 nm | 43 nm | 90 nm |
| Local maximum EL1 | 796 nm | 796 nm | 797 nm | 798 nm | 797 nm |
| External quantum efficiency | 1.09 | 1.01 | 0.91 | 0.80 | 1.03 |

Reference Example 3

The light-emitting device 21 of the reference example is different from the light-emitting device of one embodiment of the present invention in that the product of the distance D2 (395 nm=90+10+193+10+92) multiplied by 1.8 is 0.89 times the local maximum wavelength of the emitted light which is 797 nm, and is not included in the range of 0.3 times to 0.6 times, inclusive, the local maximum wavelength.

Synthesis Example 1

In this example, a method for synthesizing an organometallic complex of one embodiment of the present invention will be described. In this example, the description is made on a method for synthesizing bis {4,6-dimethyl-2-[3-(3,5-dimethylphenyl)-2-benzo[g]quinoxalinyl-κN]phenyl-κC}(2,2,6,6-tetramethyl-3,5-heptanedionato-κ$^2$O,O')iridium(III) (abbreviation: [Ir(dmdpbq)$_2$(dpm)]) that is represented by Structural Formula (100) in Embodiment 1.

[Chemical Formula 3]

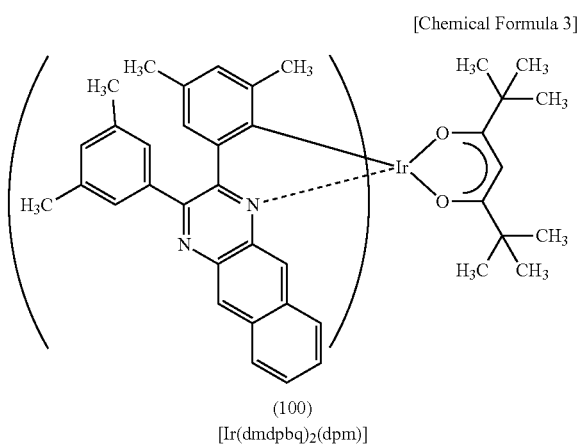

(100)
[Ir(dmdpbq)$_2$(dpm)]

Step 1; Synthesis of 2,3-bis-(3,5-dimethylphenyl)-2-benzo[g]quinoxaline (Abbreviation: Hdmdpbq)

First, in Step 1, Hdmdpbq that is an organic compound of one embodiment of the present invention and is represented by Structural Formula (200) was synthesized. Into a three-necked flask equipped with a reflux pipe, 3.20 g of 3,3',5,5'-tetramethylbenzyl, 1.97 g of 2,3-diaminonaphthalene, and 60 mL of ethanol were put, the air in the flask was replaced with nitrogen, and then the mixture was stirred at 90° C. for 7.5 hours. After a predetermined time elapsed, the solvent was distilled off. Then, purification by silica gel column chromatography using toluene as a developing solvent was performed, whereby the target substance was obtained (a yellow solid, yield: 3.73 g, percent yield: 79%). The synthesis scheme of Step 1 is shown in (a-1).

[Chemical Formula 4]

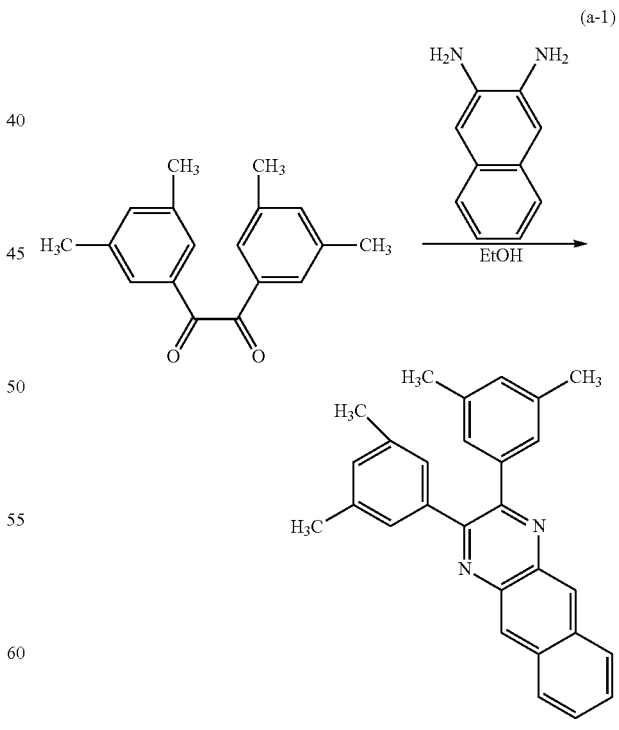

(a-1)

(200) Hdmdpbq

Analysis results by nuclear magnetic resonance spectroscopy ($^1$H-NMR) of the yellow solid obtained in Step 1 are shown below. These revealed that Hdmdpbq, which is represented by Structural Formula (200), was obtained in this example.

Given below is $^1$H NMR data of the obtained substance.
$^1$H-NMR. δ (CD$_2$Cl$_2$): 2.28 (s, 12H), 7.01 (s, 2H), 7.16 (s, 4H), 7.56-7.58 (m, 2H), 8.11-8.13 (m, 2H), 8.74 (s, 2H).

Step 2; Synthesis of di-μ-chloro-tetrakis{4,6-dimethyl-2-[3-(3,5-dimethylphenyl)-2-benzo[g]quinoxalinyl-κN]phenyl-κC}diiridium(III) (Abbreviation: [Ir(dmdpbq)$_2$Cl]$_2$)

Next, in Step 2, [Ir(dmdpbq)$_2$Cl]$_2$ that is a dinuclear complex of one embodiment of the present invention and is represented by Structural Formula (210) was synthesized. Into a recovery flask equipped with a reflux pipe, 15 mL of 2-ethoxyethanol, 5 mL of water, 1.81 g of Hdmdpbq obtained in Step 1, and 0.66 g of iridium chloride hydrate (IrCl$_3$·H$_2$O) (produced by Furuya Metal Co., Ltd.) were put, and the air in the flask was replaced with argon. Then, microwave irradiation (2.45 GHz, 100 W) was performed for 2 hours to cause reaction. After a predetermined time elapsed, the obtained residue was suction-filtered and washed with methanol, whereby the target substance was obtained (a black solid, yield: 1.76 g, percent yield: 81%). The synthesis scheme of Step 2 is shown in (a-2).

Step 3; Synthesis of [Ir(dmdpbq)$_2$(dpm)]

Then, in Step 3, [Ir(dmdpbq)$_2$(dpm)], which is the organometallic complex of one embodiment of the present invention and is represented by Structural Formula (100), was synthesized. Into a recovery flask equipped with a reflux pipe, 20 mL of 2-ethoxyethanol, 1.75 g of [Ir(dmdpbq)$_2$Cl]$_2$ obtained in Step 2, 0.50 g of dipivaloylmethane (abbreviation: Hdpm), and 0.95 g of sodium carbonate were put, and the air in the flask was replaced with argon. Then, microwave irradiation (2.45 GHz, 100 W) was performed for 3 hours. The obtained residue was suction-filtered with methanol and then washed with water and methanol. The obtained solid was purified by silica gel column chromatography using dichloromethane as a developing solvent, and then recrystallization was performed with a mixed solvent of dichloromethane and methanol, whereby the target substance was obtained (a dark green solid, yield: 0.42 g, percent yield: 21%). With a train sublimation method, 0.41 g of the obtained dark green solid was purified by sublimation. The conditions of the sublimation purification were such that the dark green solid was heated under a pressure of 2.7 Pa at 300° C. while the argon gas flowed at a flow rate of 10.5 mL/min. After the sublimation purification, a dark green solid was obtained in a yield of 78%. The synthesis scheme of Step 3 is shown in (a-3).

[Chemical Formula 5]

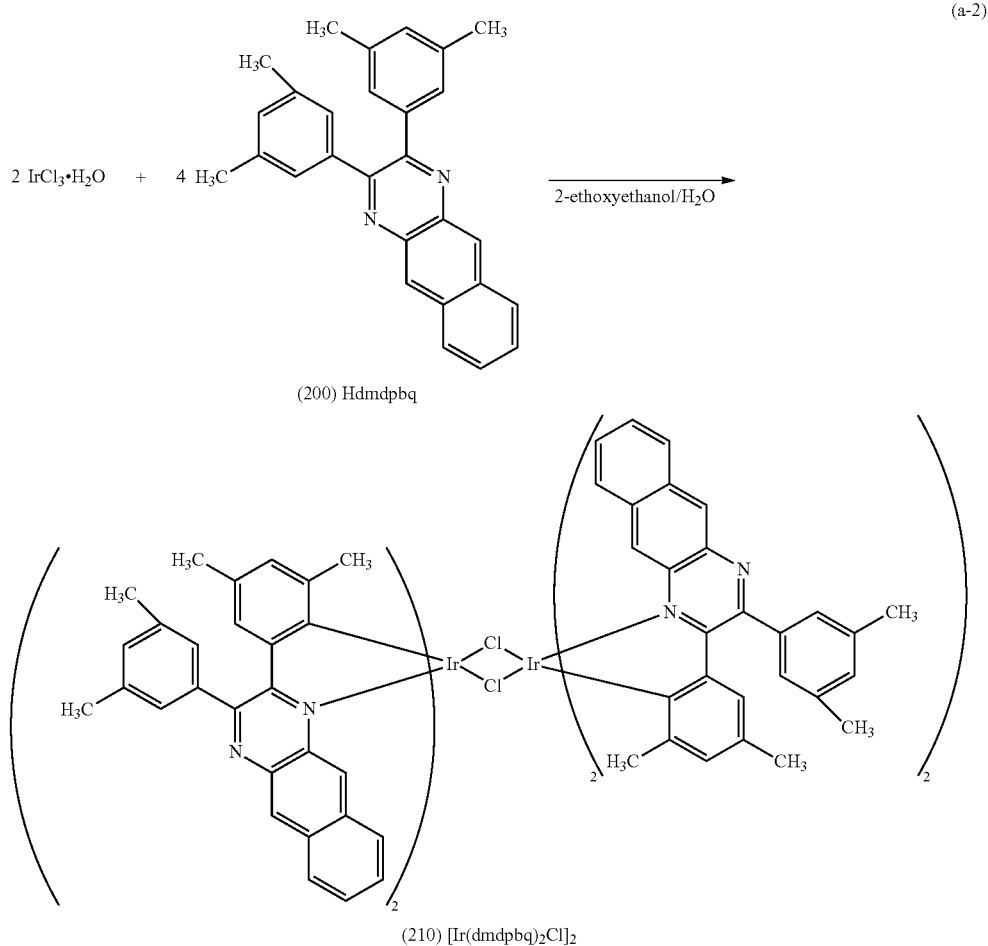

[Chemical Formula 6]

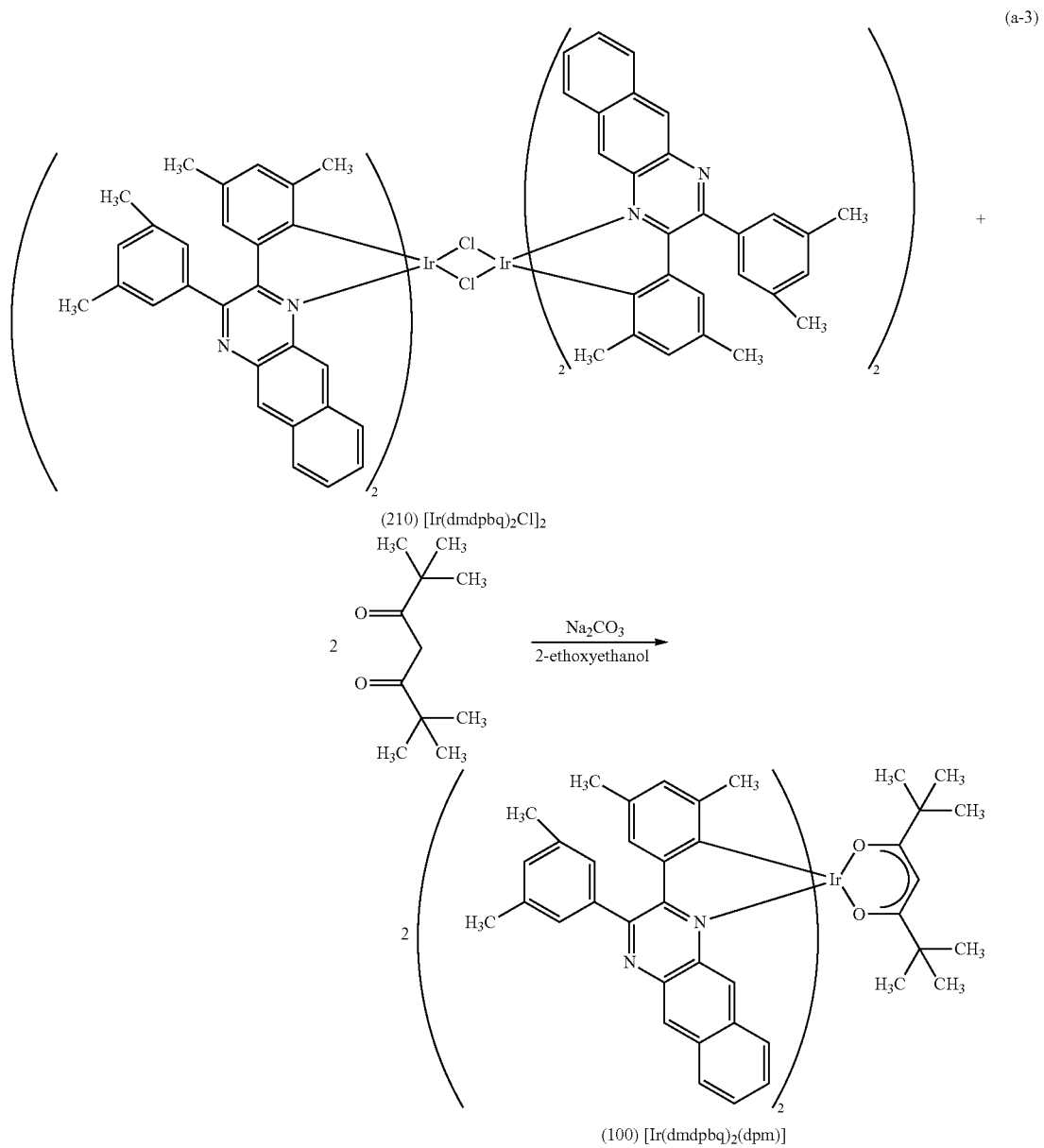

Results of analysis by nuclear magnetic resonance spectroscopy (¹H-NMR) of the dark green solid obtained in Step 3 are shown below. These revealed that [Ir(dmdpbq)$_2$(dpm)] represented by Structural Formula (100) was obtained in this example.

Given below is 41 NMR data of the obtained substance.

¹H-NMR. δ (CD$_2$Cl$_2$): 0.75 (s, 18H), 0.97 (s, 6H), 2.01 (s, 6H), 2.52 (s, 12H), 4.86 (s, 1H), 6.39 (s, 2H), 7.15 (s, 2H), 7.31 (s, 2H), 7.44-7.51 (m, 4H), 7.80 (d, 2H), 7.86 (s, 4H), 8.04 (d, 2H), 8.42 (s, 2H), 8.58 (s, 2H).

Next, an ultraviolet-visible absorption spectrum (hereinafter simply referred to as an "absorption spectrum") and an emission spectrum of the dichloromethane solution of [Ir(dmdpbq)$_2$(dpm)] were measured.

The measurement of the absorption spectrum was conducted at room temperature, for which an ultraviolet-visible spectrophotometer (V550 type, manufactured by JASCO Corporation) was used and the dichloromethane solution (0.010 mmol/L) was put into a quartz cell. The measurement of the emission spectrum was conducted at room temperature, for which a fluorescence spectrophotometer (FS920, manufactured by Hamamatsu Photonics K.K.) was used and the deoxygenated dichloromethane solution (0.010 mmol/L) was put and hermetically sealed into a quartz cell in a nitrogen atmosphere.

FIG. 7 shows measurement results of the obtained absorption spectrum and emission spectrum. The horizontal axis represents the wavelength, and the vertical axes represent the absorption intensity and the emission intensity. The thin solid line in FIG. 28 represents the absorption spectrum, and the thick solid line represents the emission spectrum. The absorption spectrum shown in FIG. 28 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 28, [Ir(dmdpbq)$_2$(dpm)], which is the organometallic complex of one embodiment of the present invention, has an emission peak at 807 nm, and near-infrared light was observed from the dichloromethane solution.

Note that this example can be combined with other embodiments described in this specification as appropriate.

Example 3

In this example, a structure, a fabrication method, and characteristics of a light-emitting device 4 of one embodiment of the present invention are described with reference to FIG. 6 and FIG. 30 to FIG. 35.

Note that the light-emitting device 4 differs from the light-emitting device 1 described using Table 1 in the structures of the hole-injection layer 811a, the hole-transport layer 812a, the intermediate layer 816, the hole-transport layer 812b, and the electron-transport layer 814b. Different portions will be described in detail here, and the above description is referred to for portions that can use similar structures. In the light-emitting device 4, the distance D1 was as follows: (15+0.1+5+5) nm=25.1 nm (see Table 9).

Figure 35:
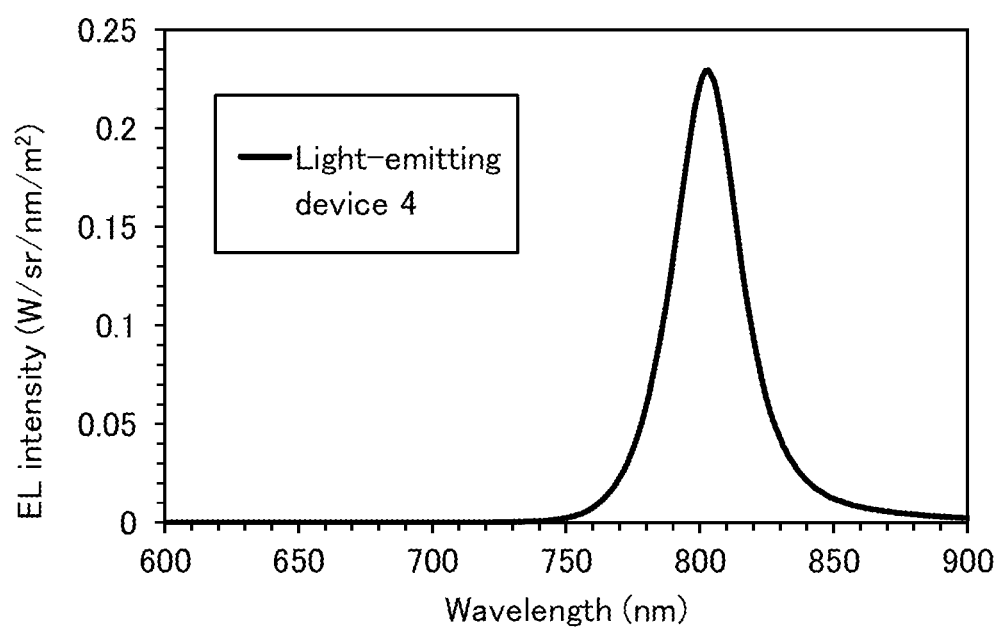
FIG. 35 is a diagram showing an emission spectrum of the light-emitting device 4.

The spectrum of light emitted by the fabricated light-emitting device 4 has a local maximum at 803 nm (see FIG. 35). Note that $(6.3 \times 10^{-3}) \times 803$ nm was 5.06 nm and $(81.3 \times 10^{-3}) \times 803$ nm was 65.6 nm. Therefore, the distance D1 (=25.1 nm) is within the range of 5.06 nm to 65.6 nm, inclusive.

Note that the light-emitting device 4 includes the first film having the reflection property, and the light-transmitting conductive film is interposed between the first film having the reflection property and the light-emitting layer 813a. Specifically, a film of an alloy of silver (Ag), palladium (Pd), and copper (Cu) (Ag—Pd—Cu (APC)) is used and 10-nm-ITSO is interposed between the APC film and the light-emitting layer 813a. In this structure, the distance D2 was as follows: (10+10+20+32.5+15+0.1+5+5+15+20+52.5+1) nm=181.1 nm. Therefore, the value obtained by multiplying the distance D2 (=181.1 nm) by 1.8 was (1.8×181.1=) 325.98 nm. This value is within the range of (0.3×803=) 240.9 nm to (0.6×803=) 481.8 nm, inclusive.

Table 9 shows a specific structure of the light-emitting device 4.

<<Fabrication of Light-Emitting Device 4>>

For the formation of the hole-injection layer 811a, the pressure in the vacuum evaporation apparatus was reduced to $10^{-4}$ Pa, and then PCBBiF and NDP-9 (produced by Analysis Atelier Corporation, material serial No. 1S20170124) were co-evaporated to a thickness of 10 nm such that PCBBiF:NDP-9=1:0.1 (weight ratio).

The hole-transport layer 812a was formed to a thickness of 32.5 nm by evaporation of PCBBiF.

The intermediate layer 816 was formed by co-evaporation of PCBBiF and NDP-9 such that PCBBiF:NDP-9=1:0.1 (weight ratio) and the thickness was 5 nm.

The hole-transport layer 812b was formed to a thickness of 5 nm by evaporation of PCBBiF.

The electron-transport layer 814b was formed by sequential deposition by evaporation such that the thickness of 2mDBTBPDBq-II was 20 nm and the thickness of NBphen was 52.5 nm.

<<Operating Characteristics of Light-Emitting Device 4>>

The operating characteristics of the light-emitting device 4 were measured. Note that the measurement was carried out at room temperature (an atmosphere maintained at 25° C.).

Figure 30:
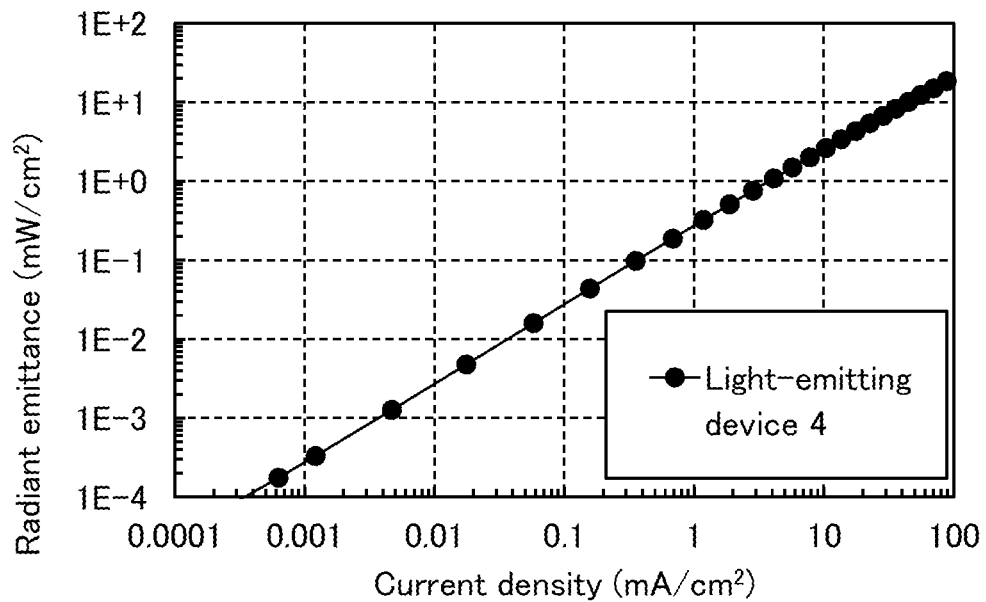
FIG. 30 is a diagram showing the current density-radiant emittance characteristics of a light-emitting device 4.
Figure 31:
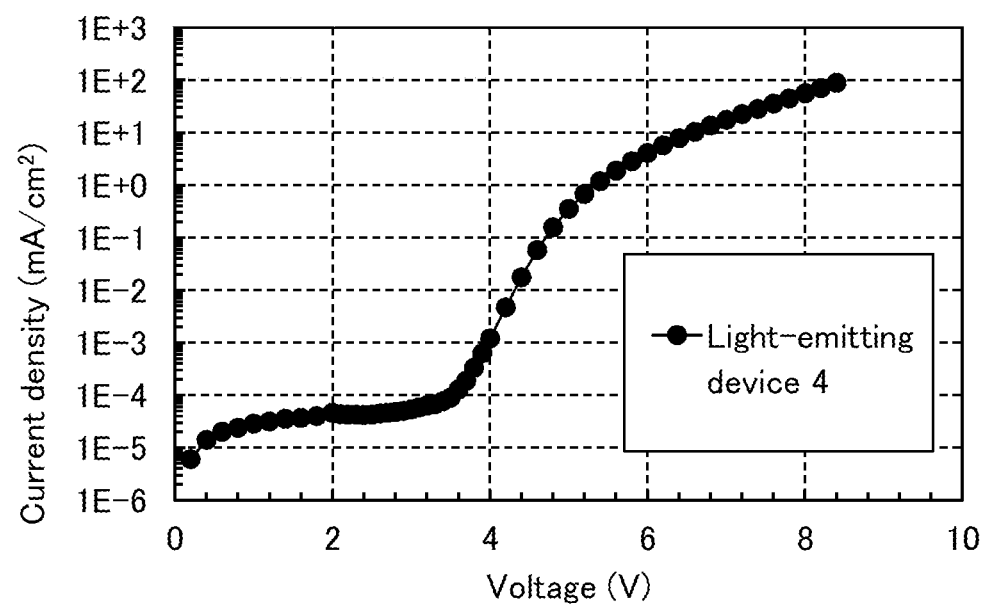
FIG. 31 is a diagram showing the voltage-current density characteristics of the light-emitting device 4.
Figure 32:
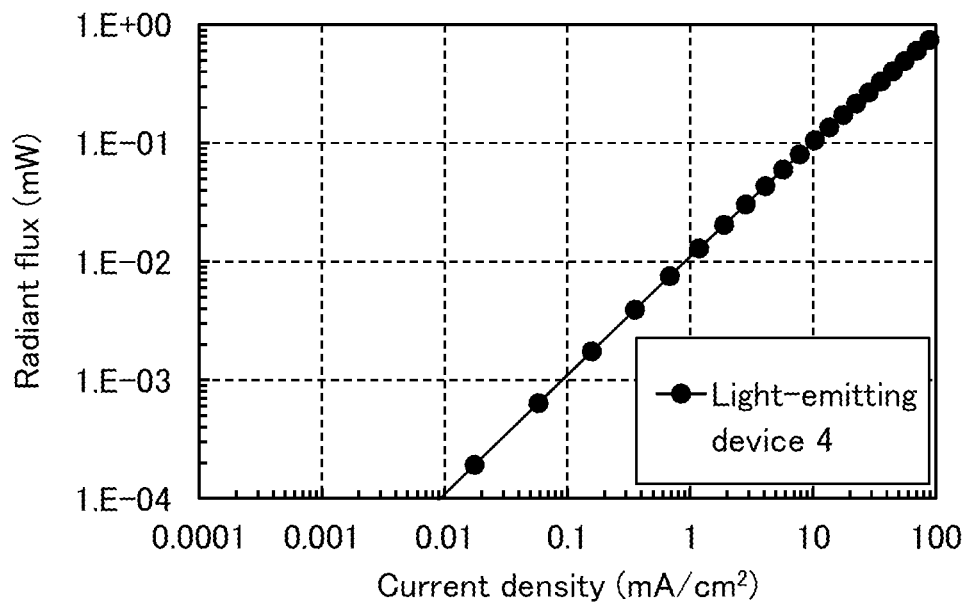
FIG. 32 is a diagram showing the current density-radiant flux characteristics of the light-emitting device 4.
Figure 33:
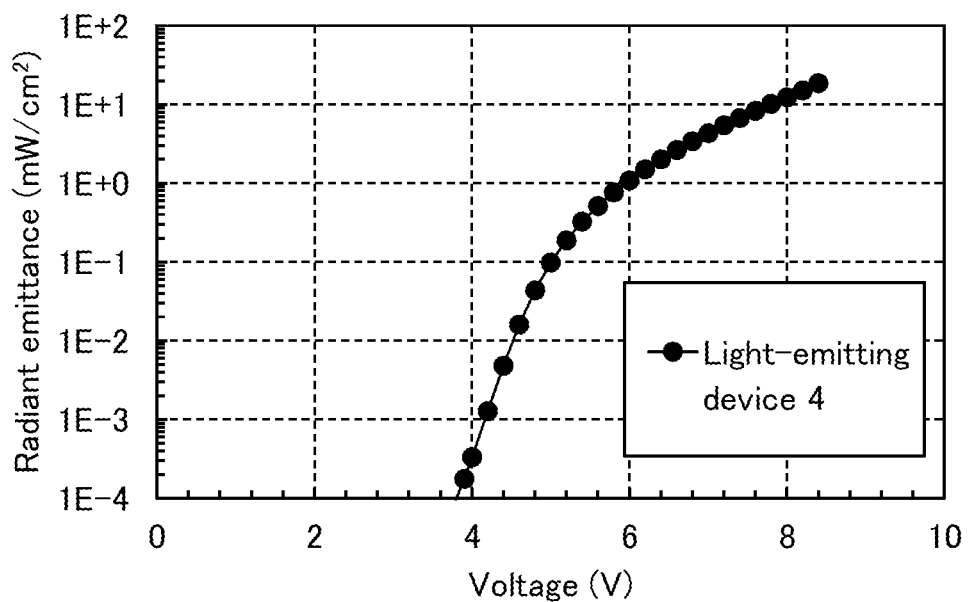
FIG. 33 is a diagram showing the voltage-radiant emittance characteristics of the light-emitting device 4.
Figure 34:
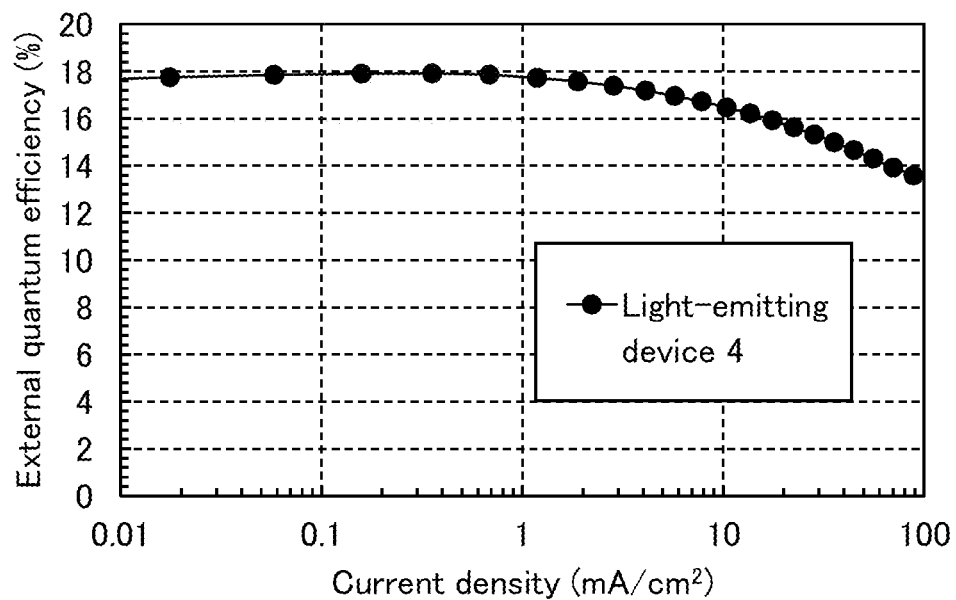
FIG. 34 is a diagram showing the current density-external quantum efficiency characteristics of the light-emitting device 4.

FIG. 30 shows the current density-radiant emittance characteristics of the light-emitting device 4. FIG. 31 shows the voltage-current density characteristics of the light-emitting device 4. FIG. 32 shows the current density-radiant flux characteristics of the light-emitting device 4. FIG. 33 shows the voltage-radiant emittance characteristics of the light-emitting device 4. FIG. 34 shows the current density-external quantum efficiency characteristics of the light-emitting device 4. Note that radiant emittance, radiant flux, and external quantum efficiency were calculated using radiance, assuming that the light-emitting device had Lambertian light-distribution characteristics.

Table 10 lists the initial values of main characteristics of the light-emitting device 4 at around 8.1 W/sr/m$^2$.

TABLE 10

| | Voltage (V) | Current (mA) | Current density (mA/cm$^2$) | Radiance (W/sr/m$^2$) | Radiant flux (mW) | External quantum efficiency (%) |
|---|---|---|---|---|---|---|
| Light-emitting device 4 | 6.6 | 0.42 | 10 | 8.4 | 0.11 | 16 |

TABLE 9

| | First electrode 801 | Hole-injection layer 811a | Hole-transport layer 812a | Light-emitting layer 813a | Electron-transport layer 814a | Electron-injection layer 815a | Intermediate layer 816 |
|---|---|---|---|---|---|---|---|
| Light-emitting device 4 | APC (100 nm) | ITSO (10 nm) | PCBBiF:NDP-9 (1:0.1 10 nm) | PCBBiF (32.5 nm) | * | NBphen (15 nm) | Li$_2$O (0.1 nm) | PCBBiF:NDP-9 (1:0.1 5 nm) |

| | Hole-transport layer 812b | Light-emitting layer 813b | Electron-transport layer 814b | | Electron-injection layer 815b | Second electrode 803 | Buffer layer 804 |
|---|---|---|---|---|---|---|---|
| Light-emitting device 4 | PCBBiF (5 nm) | * | 2mDBTBPDBq-II (20 nm) | NBphen (52.5 nm) | LiF (1 nm) | Ag:Mg (10:1 30 nm) | DBT3P-II (100 nm) |

* 2mDBTBPDBq-II:PCBBiF:[Ir(dmdpbq)$_2$(dpm)] (0.7:0.3:0.1 15 nm)

The light-emitting device 4 was found to exhibit favorable characteristics, as shown in FIG. 30 to FIG. 34 and Table 10. For example, at the same current density, the radiance of light emitted by the light-emitting device 4 was higher than those of light emitted by the light-emitting device 2 and the light-emitting device 3 described above. For example, at the same current density, the light-emitting device 4 has higher external quantum efficiency than the light-emitting device 2 and the light-emitting device 3. For example, at the same current density, the light-emitting device 4 has lower driving voltage than the light-emitting device 3.

FIG. 35 shows an emission spectrum when current at a current density of 10 mA/cm$^2$ was supplied to the light-emitting device 4. The emission spectrum was measured with a near-infrared spectroradiometer (SR-NIR, manufactured by TOPCON TECHNOHOUSE CORPORATION). As shown in FIG. 35, the light-emitting device 4 exhibited an emission spectrum having a maximum peak at around 803 nm, which was derived from light emitted from [Ir(dmdpbq)$_2$(dpm)] contained in the light-emitting layer 813a and the light-emitting layer 831b.

Employing the microcavity structure narrowed the emission spectrum, and the half width was 35 nm. The light-emitting device 4 efficiently emits light longer than or equal to 760 nm and shorter than or equal to 900 nm and is said to be highly effective as a light source for a sensor application and the like.

<<Viewing Angle Characteristics of Light-Emitting Device 3>>

Next, the viewing angle characteristics of the EL spectra of the light-emitting device 4 were examined.

First, the EL spectrum in the front direction and the EL spectrum in oblique directions of the light-emitting device 4 were measured. Specifically, given that the direction perpendicular to a light-emitting surface of the light-emitting device 4 was 0°, emission spectra were measured at a total of 17 points at every 10° from −80° to 80°. For the measurement, a multi-channel spectrometer (PMA-12 produced by Hamamatsu Photonics K.K.) was used. From the measurement results, the EL spectra and the photon intensity ratio of the light-emitting device 4 at each angle were obtained.

Figure 36:
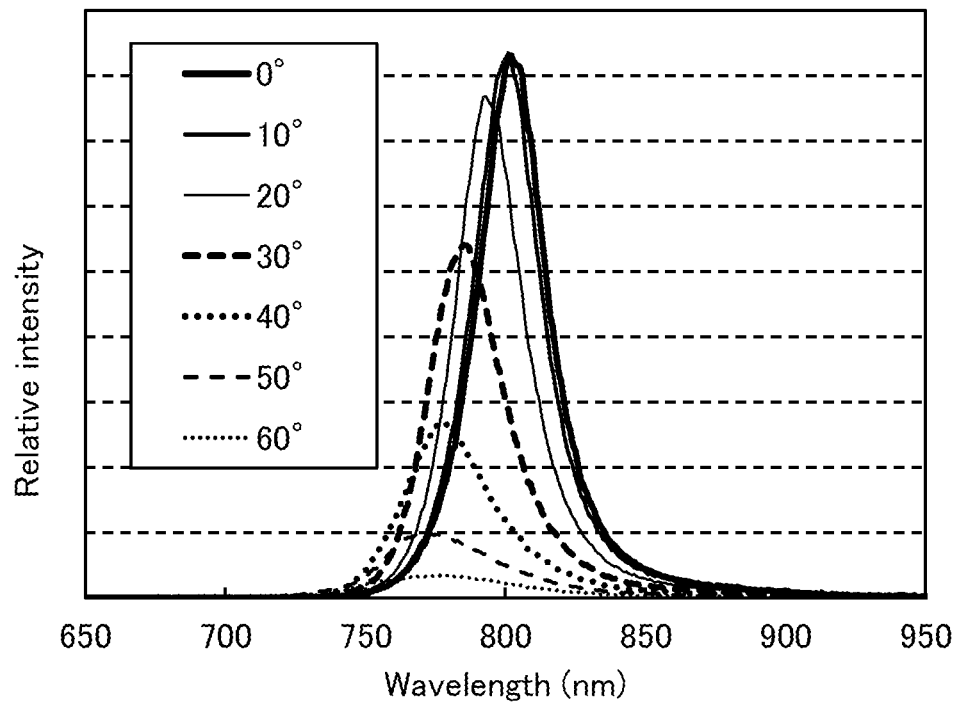
FIG. 36 is a diagram showing angle dependence of the relative intensity of the light-emitting device 4.

FIG. 36 shows the EL spectra of the light-emitting device 4 from 0° to 60°.

Figure 37:
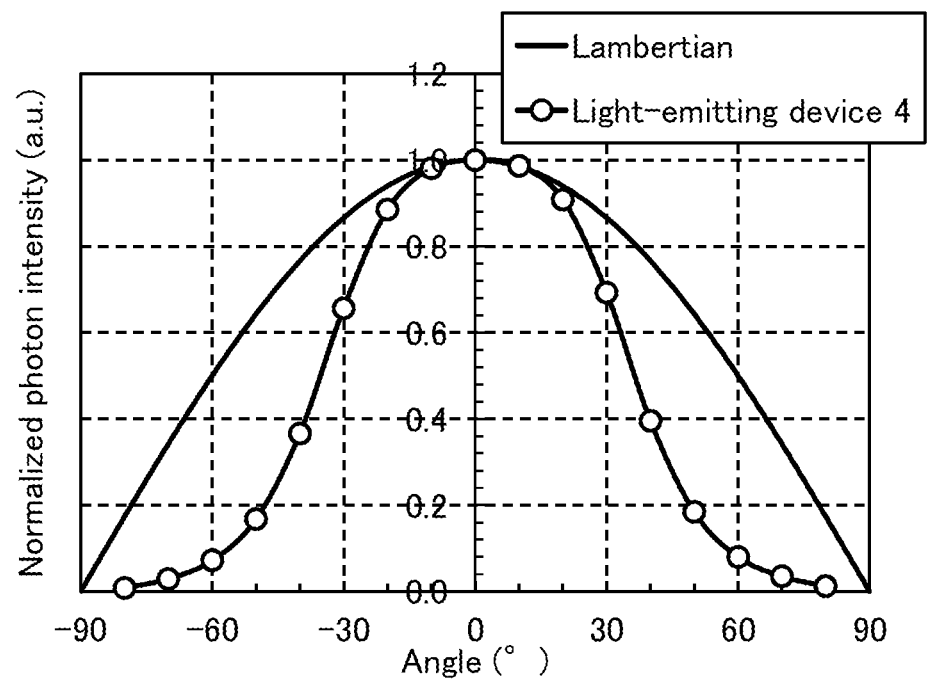
FIG. 37 is a diagram showing angle dependence of the normalized photon intensity of the light-emitting device 4.

FIG. 37 shows the photon intensity of the light-emitting device 4 at each angle relative to the photon intensity at the front.

As shown in FIG. 36 and FIG. 37, the light-emitting device 4 was found to have large viewing angle dependence and emit intense light in the front direction. This is because employing the microcavity structure reduces light emission in the oblique directions while intensifying light emission in the front direction. Such viewing angle characteristics with intense light emission in the front direction are suitable for a light source for a sensor such as a vein sensor.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit structure is defined by an expression similar to the above examples, a source (or a first terminal or the like) and a drain (or a second terminal or the like) of a transistor can be distinguished from each other to specify the technical scope.

Alternatively, as another expression, the expression "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" can be used, for example. Alternatively, the expression "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path" can be used. Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

REFERENCE NUMERALS

11: light-emitting device, 12: light-emitting device, 13: light-emitting device, 14: light-emitting device, 15: light-emitting device, 16: light-emitting device, 17: light-emitting device, 18: light-emitting device, 19: light-emitting device, 20: light-emitting device, 101: electrode, 102: electrode, 103a: light-emitting unit, 103b: light-emitting unit, 104: intermediate layer, 105: protective layer, 111a: hole-injection layer, 112: hole-transport layer, 112a: hole-transport layer, 112b: hole-transport layer, 113a: light-emitting layer, 113b: light-emitting layer, 114a: electron-transport layer, 114b: electron-transport layer, 115a: electron-injection layer, 115b: electron-injection layer, 301: substrate, 302: pixel portion, 303: circuit portion, 304a: circuit portion, 304b: circuit portion, 305: sealant, 306: substrate, 307: wiring, 308: FPC, 309: transistor, 310: transistor, 311: transistor, 312: transistor, 313: electrode, 314: insulating layer, 315: EL layer, 316: electrode, 317: organic EL device, 318: space, 400: molecular weight, 401: electrode, 402: EL layer, 403: electrode, 405: insulating layer, 406: conductive layer, 407: adhesive layer, 416: conductive layer, 420: substrate, 422: adhesive layer, 423: barrier layer, 424: insulating layer, 450: organic EL device, 490a: substrate, 490b: substrate, 490c: barrier layer, 800: substrate, 801: electrode, 802: light-emitting unit, 802a: light-emitting unit, 802b: light-emitting unit, 803: electrode, 804: buffer layer, 811: hole-injection layer, 811a: hole-injection layer, 811b: hole-injection layer, 812: hole-transport layer, 812a: hole-transport layer, 812b: hole-transport layer, 813: light-emitting layer, 813a: light-emitting layer, 813b: light-emitting layer, 814: electron-transport layer, 814a: electron-transport layer, 814b: electron-transport layer, 815: electron-injection layer, 815a: electron-injection layer, 815b: electron-injection layer, 816: intermediate layer, 831b: light-emitting layer, 911: housing, 912: light source, 913: sensing stage, 914: imaging device, 915: light-emitting portion, 916: light-emitting portion, 917: light-emitting portion, 921: housing, 922: operation button, 923: sensing portion, 924: light source, 925: imaging device, 931: housing, 932: operation panel, 933: transport mechanism, 934: monitor, 935: sensing unit, 936: test specimen, 937: imaging device, 938: light source, 981: housing, 982: display portion, 983: operation button, 984: external connection port, 985: speaker, 986: microphone, 987: camera, 988: camera This application is based on Japanese Patent Application Serial No. 2019-041455 filed on Mar. 7, 2019, the entire contents of which are hereby incorporated herein by reference.

The invention claimed is:

1. A light-emitting device comprising:
a first electrode;
a first light-emitting unit over the first electrode, the first light-emitting unit comprising a first light-emitting layer;
an intermediate layer over the first light-emitting unit, the intermediate layer comprising a charge-generation layer;
a second light-emitting unit over the intermediate layer, the second light-emitting unit comprising a second light-emitting layer; and
a second electrode over the second light-emitting unit,
wherein an emission spectrum of the light-emitting device has a maximal wavelength EL1,
wherein each emission spectrum of the first light-emitting layer and the second light-emitting layer includes a light at the maximal wavelength EL1,
wherein a first distance D1 between the first light-emitting layer and the second light-emitting layer satisfies Formula (i):

$$(6.3\times10^{-3})\times EL1 \leq D1 \leq (81.3\times10^{-3})\times EL1 \qquad (i),$$

wherein the first distance further satisfies being longer than or equal to 5 nm and shorter than or equal to 40 nm,
wherein a second distance D2 between the first electrode and the second electrode is greater than or equal to $$\frac{0.3}{1.8}$$

times and less than or equal to $$\frac{0.6}{1.8}$$

times me maximal wavelength EL1, and
wherein the maximal wavelength EL1 is a range from 760 nm to 900 nm.

2. The light-emitting device according to claim 1,
wherein the first light-emitting layer comprises a first light-emitting material,
where in the second light-emitting layer comprises a second light-emitting material, and
wherein each of the first light-emitting material and the second light-emitting material has an emission spectrum having a maximum wavelength from 760 nm to 900 nm.

3. The light-emitting device according to claim 2, wherein a difference between an emission peak of the first light-emitting material in a first solvent and an emission peak of the second light-emitting material in the first solvent is less than or equal to 100 nm.

4. The light-emitting device according to claim 1,
wherein one of the first electrode and the second electrode is a reflective electrode, and
wherein the other of the first electrode and the second electrode is an electrode configured to transmit part of light and reflect another part of the light.

5. An electronic device comprising the light-emitting device according to claim 1.

6. A light-emitting device comprising:
a first electrode;
a first light-emitting unit over the first electrode, the first light-emitting unit comprising a first light-emitting layer;
an intermediate layer over the first light-emitting unit, the intermediate layer comprising a charge-generation layer;
a second light-emitting unit over the intermediate layer, the second light-emitting unit comprising a second light-emitting layer; and
a second electrode over the second light-emitting unit,
wherein each of the first light-emitting layer and the second light-emitting layer comprises a first light-emitting material,
wherein an emission spectrum of the light-emitting device has a maximum wavelength EL1,
wherein an emission spectrum of the first light-emitting material includes a light at the maximal wavelength EL1,
wherein a first distance D1 between the first light-emitting layer and the second light-emitting layer satisfies Formula (i):

$$(6.3\times10^{-3})\times EL1 \leq D1 \leq (81.3\times10^{-3})\times EL1 \qquad (i),$$

wherein the first distance further satisfies being longer than or equal to 5 nm and shorter than or equal to 40 nm, and
wherein a second distance D2 between the first electrode and the second electrode is greater than or equal to $$\frac{0.3}{1.8}$$

times and less than or equal to $$\frac{0.6}{1.8}$$

times the maximal wavelength EL1.

7. The light-emitting device according to claim 6, wherein an emission peak of the first light-emitting material dissolved in a first solvent is within a range from 760 nm to 900 nm.

8. The light-emitting device according to claim 6,
wherein one of the first electrode and the second electrode is a reflective electrode, and
wherein the other of the first electrode and the second electrode is an electrode configured to transmit part of light and reflect another part of the light.

9. An electronic device comprising the light-emitting device according to claim 6.

10. A light-emitting device comprising:
a first electrode;
a first light-emitting unit over the first electrode, the first light-emitting unit comprising a first light-emitting layer;
an intermediate layer over the first light-emitting unit, the intermediate layer comprising a charge-generation layer;
a second light-emitting unit over the intermediate layer, the second light-emitting unit comprising a second light-emitting layer; and a second electrode over the second light-emitting unit, wherein an emission spectrum of the light-emitting device has a maximal wavelength EL1, wherein each emission spectrum of the first light-emitting layer and the second light-emitting layer includes a light at the maximal wavelength EL1, wherein a first distance D1 between the first light-emitting layer and the second light-emitting layer is greater than or equal to 5 nm and less than or equal to 40 nm, wherein a second distance D2 between the first electrode and the second electrode is greater than or equal to $$\frac{0.3}{1.8}$$

times and less than or equal to $$\frac{0.6}{1.8}$$

times the maximal wavelength EL1, and wherein the maximal wavelength EL1 is a range from 760 nm to 900 nm.

11. The light-emitting device according to claim 10, wherein the first light-emitting layer comprises a first light-emitting material, where in the second light-emitting layer comprises a second light-emitting material, and wherein each of the first light-emitting material and the second light-emitting material has an emission spectrum having a maximum wavelength from 760 nm to 900 nm.

12. The light-emitting device according to claim 11, wherein a difference between an emission peak of the first light-emitting material in a first solvent and an emission peak of the second light-emitting material in the first solvent is less than or equal to 100 nm.

13. The light-emitting device according to claim 10, wherein one of the first electrode and the second electrode is a reflective electrode, and wherein the other of the first electrode and the second electrode is an electrode configured to transmit part of light and reflect another part of the light.

14. An electronic device comprising the light-emitting device according to claim 10.

* * * * *